United States Patent [19]

Swoboda et al.

[11] Patent Number: 5,684,721
[45] Date of Patent: Nov. 4, 1997

[54] ELECTRONIC SYSTEMS AND EMULATION AND TESTING DEVICES, CABLES, SYSTEMS AND METHODS

[75] Inventors: Gary L. Swoboda, Sugar Land; Henry R. Hoar, Houston; Joseph A. Coomes, Missouri City, all of Tex.

[73] Assignee: Texas Instruments Incorporated, Dallas, Tex.

[21] Appl. No.: 851,232

[22] Filed: Mar. 13, 1992

Related U.S. Application Data

[63] Continuation of Ser. No. 401,198, Aug. 28, 1989, abandoned, which is a continuation-in-part of Ser. No. 948,337, Dec. 3, 1986, abandoned, which is a continuation-in-part of Ser. No. 93,463, Sep. 4, 1987, abandoned.

[51] Int. Cl.$^6$ .................. G06F 17/00; G06G 7/06
[52] U.S. Cl. .................. 364/578; 364/488; 364/489; 395/500
[58] Field of Search .................. 364/578, 488, 364/489; 371/23, 22.2, 22.3; 395/500

[56] References Cited

U.S. PATENT DOCUMENTS

| | | | |
|---|---|---|---|
| 4,023,142 | 5/1977 | Woessner | 340/172.5 |
| 4,192,451 | 3/1980 | Swerling et al. | 371/16.2 |
| 4,268,902 | 5/1981 | Berglund et al. | 364/200 |
| 4,314,333 | 2/1982 | Shibayama et al. | 364/200 |
| 4,441,154 | 4/1984 | McDonough et al. | 364/200 |
| 4,513,418 | 4/1985 | Bardell, Jr. et al. | 371/25 |
| 4,594,711 | 6/1986 | Thatte | 371/25 |
| 4,597,080 | 6/1986 | Thatte et al. | 371/25 |
| 4,601,034 | 7/1986 | Sridhar | 371/25 |
| 4,615,029 | 9/1986 | Hu et al. | 370/89 |
| 4,621,363 | 11/1986 | Blum | 371/25 |
| 4,633,417 | 12/1986 | Wilburn et al. | 364/550 |
| 4,674,089 | 6/1987 | Poret et al. | 364/200 |
| 4,680,733 | 7/1987 | Duforestel et al. | 364/900 |
| 4,691,316 | 9/1987 | Phillips | 371/16.2 |
| 4,698,588 | 10/1987 | Hwang et al. | 324/73 |
| 4,701,921 | 10/1987 | Powell et al. | 371/25 |
| 4,710,931 | 12/1987 | Bellay et al. | 371/25 |
| 4,710,933 | 12/1987 | Powell et al. | 371/25 |
| 4,857,835 | 8/1989 | Whetsel | 324/73 |
| 4,872,169 | 10/1989 | Whetsel | 371/22.3 |
| 4,888,680 | 12/1989 | Sander et al. | 364/200 |
| 4,901,259 | 2/1990 | Watkins | 364/578 |
| 5,003,507 | 3/1991 | Johnson | 364/578 |
| 5,062,067 | 10/1991 | Schaefer et al. | 364/578 |
| 5,068,812 | 11/1991 | Schaefer et al. | 364/578 |
| 5,329,471 | 7/1994 | Swoboda et al. | 364/578 |
| 5,335,338 | 8/1994 | Proesel | 395/500 |

FOREIGN PATENT DOCUMENTS 2 195 185  3/1988  United Kingdom .

OTHER PUBLICATIONS

"Emulators Keep Pace with Chip Speeds and Complexity", Computer Design, May 15, 1987, pp. 31–38.

Y. Mochida et al., "A High Performance LSI Digital Signal Processor for Communication", *IEEE Journal of Selected Areas in Communications*, vol. SAC-3, No. 2, pp. 347–356, Mar. 1985.

WE DSP16 Digital Signal Processor Information Manual, pp. 1–5, 1987.

(List continued on next page.)

*Primary Examiner*—Vincent N. Trans
*Attorney, Agent, or Firm*—James F. Hollander; Scott B. Stahl; Richard L. Donaldson

[57] ABSTRACT

An electronic system for use with a host computer. The system includes electronic circuitry including a first semiconductor chip generally operable for a first function and also adapted for input and output of emulation signals. This is combined with emulation circuitry including a second semiconductor chip adapted for connection to the host computer. The emulation circuitry is connected to the electronic circuitry to generate emulation signals to input to the electronic circuitry and to accept emulation signals from the electronic circuitry. A physical assembly supports the emulation circuitry and the electronic circuitry as a unit. Other electronic systems and emulation and testing devices, cables, systems and methods are also disclosed.

27 Claims, 21 Drawing Sheets

OTHER PUBLICATIONS

Second-Generation TMS320 User's Guide, Texas Instruments, pp. E-1-E-8, Dec. 1987.

P. Gifford, "Sequent's Symmetry Series: Software Breadboarding Caught 95% of the Design Errors", *VLSI Systems Design*, p. 2-6, Jun. 1988.

"Application Development Environment", AT&T Technologies, Inc., 1988, single page.

"DSP56001: 56-Bit General Purpose Digital Signal Processor", Motorola, pp. 1-20, 1988.

G. Sohie, et al., "A Digital Signal Processor with IEEE Floating-Point Arithmetic", *IEEE Micro*, pp. 49-67, Dec. 1988.

J. R. Boddie, et al., "A Floating Point DSP with Optimizing C Compiler" IEEE 1988, pp. 2009-2012.

"DSP96001: 96-Bit General-Purpose Floating-Point Digital-Signal Processor (DSP)", Motorola, pp. 1-22, 1988.

TMS370 Family Data Manual Texas Instruments, pp. 14-6, and 14-11 through 14-16, Mar. 1988.

First-Generation TMS320 User's Guide, Texas Instruments, pp. E-1-E-8, Apr. 1988.

"Test-Bus Interface Unit", Honeywell HTTU214PG, undated, received Jul. 1989.

N. Berglund, "Level-Sensitive Scan Design Tests Chips, Boards, System", *Electronics*, Mar. 15, 1979, pp. 108-110.

```
                A A A A A
                D D D D D V I R       T
                R R R R R N D R W     R
       101      S S S S S T Y D R     S
                4 3 2 1 0 3 N N N     T 6 5 4 3 2 1 4 4 4 4 4
                            4 3 2 1 0
DATA0   7                              39  TMS5/EVENT3
DATA1   8                              38  TMS4/EVENT2
DATA2   9                              37  TMS3/EVENT1
DATA3  10                              36  TMS2/EVENT0
DATA4  11                              35  VDDI
VSS0   12         T O P   V I E W      34  VSSI
VDD0   13                              33  TMSI
DATA5  14                              32  TMS0
DATA6  15                              31  TDO
DATA7  16                              30  TCK0
DATA8  17                              29  TCKI 1 1 2 2 2 2 2 2 2 2 2
                8 9 0 1 2 3 4 5 6 7 8

… # ELECTRONIC SYSTEMS AND EMULATION AND TESTING DEVICES, CABLES, SYSTEMS AND METHODS

CROSS-REFERENCE TO RELATED APPLICATIONS

This application is a continuation of application Ser. No. 07/401,198 filed Aug. 28, 1989, now abandoned, which is a continuation in part of the application Ser. No. 06/948,337 filed Dec. 31, 1986, abandoned which is a continuation-in-part of the application Ser. No. 07/093,463 filed Sep. 4, 1987 abandoned.

This application is related to the following application, which are hereby incorporated herein by reference:

Ser. No. 07/388,270, filed Jul. 31, 1989 (abandoned);
Ser. No. 07/388,286, filed Jul. 31, 1989 (abandoned);
Ser. No. 07/387,475, filed Jul. 31, 1989 (abandoned);
Ser. No. 07/387,549, filed Jul. 31, 1989 (abandoned);
Ser. No. 07/387,724, filed Jul. 31, 1989 (abandoned);
Ser. No. 07/979,396, filed Jul. 31, 1989 (abandoned).

This application hereby incorporates herein by reference the following coassigned applications:

Ser. No. 057,078, filed Jun. 2, 1987 (now U.S. Pat. No. 4,860,290);
Ser. No. 347,605, filed May 4, 1989;
Ser. No. 347,596, filed May 4, 1989 (now U.S. Pat. No. 5,072,418);
Ser. No. 347,615, filed May 4, 1989 (now U.S. Pat. No. 5,142,677);
Ser. No. 347,966, filed May 4, 1989 (now U.S. Pat. No. 5,155,812);
Ser. No. 347,968, filed May 4, 1989;
Ser. No. 347,967, filed May 4, 1989;
Ser. No. 347,969, filed May 4, 1989 (abandoned).

This invention relates to electronic data processing and emulation, simulation, and testability devices and systems, and methods of their manufacture and operation.

BACKGROUND OF THE INVENTION

Advanced wafer lithography and surface-mount packaging technology are integrating increasingly complex functions at both the silicon and printed circuit board level of electronic design. Diminished physical access is an unfortunate consequence of denser designs and shrinking interconnect pitch. Designed-in testability is needed, so that the finished product is still both controllable and observable during test and debug. Any manufacturing defect is preferably detectable during final test before a product is shipped. This basic necessity is difficult to achieve for complex designs without taking testability into account in the logic design phase, so that automatic test equipment can test the product.

In addition to testing for functionality and for manufacturing defects, application software development requires a similar level of simulation, observability and controllability in the system or sub-system design phase. The emulation phase of design should ensure that an IC (integrated circuit), or set of ICs, functions correctly in the end equipment or application when linked with the software programs.

With the increasing use of ICs in the automotive industry, telecommunications, defense systems, and life support systems, thorough testing and extensive real-time debug becomes a critical need.

Functional testing, wherein a designer is responsible for generating test vectors that are intended to ensure conformance to specification, still remains a widely used test methodology. For very large systems this method proves inadequate in providing a high level of detectable fault coverage. Automatically generated test patterns would be desirable for full testability, and controllability and observability are key goals that span the full hierarchy of test (from the system level to the transistor level).

Another problem in large designs is the long time and substantial expense involved. It would be desirable to have testability circuitry, system and methods that are consistent with a concept of design-for-reusability. In this way, subsequent devices and systems can have a low marginal design cost for testability, simulation and emulation by reusing the testability, simulation and emulation circuitry, systems and methods that are implemented in an initial device. Without a proactive testability, simulation and emulation approach, a large amount of subsequent design time is expended on test pattern creation and grading.

The advances in IC design, for example, are accompanied by decreased internal visibility and control, reduced fault coverage and reduced ability to toggle states, more test development and verification problems, increased complexity of design simulation and continually increasing cost of CAD (computer aided design) tools. In the board design the side effects include decreased register visibility and control, complicated debug and simulation in design verification, loss of conventional emulation due to loss of physical access by packaging many circuits in one package, increased routing complexity on the board, increased costs of design tools, mixed-mode packaging, and design for produceability. In application development, some side effects are decreased visibility of states, high speed emulation difficulties, scaled time simulation, increased debugging complexity, and increased costs of emulators. Production side effects involve decreased visibility and control, complications in test vectors and models, increased test complexity, mixed-mode packaging, continually increasing costs of automatic test equipment even into the 7-figure range, and tighter tolerances.

SUMMARY OF THE INVENTION

Among the objects of the present invention are to provide improved emulation, simulation and testability architectures and methods which provide visibility and control without physical probing or special test fixtures; to provide improved emulation, simulation and testability architectures and methods which are applicable to critical components of system designs to support test and integration of both hardware and software; to provide improved emulation, simulation and testability architectures and methods that are a viable alternative to high capital-cost test equipment and systems; to provide improved emulation, simulation and testability architectures and methods which integrate access to sophisticated operations in hardware emulation, fault emulation, simulation and built-in test; to provide improved emulation, simulation and testability architectures and methods which apply hardware and software visibility and control to reduce application development time and thus reduce the user manufacturer's time-to-market on new products; and to provide improved emulation, simulation and testability architectures and methods to leverage hierarchical partitioning and automatically generate reusable tests for related chips and systems.

Generally, one form of the invention is an electronic system including electronic circuitry to be tested and including serial scan shift register latches, and a serial scan generator embedded in the system in manufacture and connected to the electronic circuitry thereby facilitating testing of the electronic circuitry.

In general, another form of the invention is an electronic system for use with a host computer. The system includes electronic circuitry including a first semiconductor chip generally operable for a first function and also adapted for input and output of emulation signals. This is combined with emulation circuitry including a second semiconductor chip adapted for connection to the host computer. The emulation circuitry is connected to the electronic circuitry to generate emulation signals to input to the electronic circuitry and to accept emulation signals from the electronic circuitry. A physical assembly supports the emulation circuitry and the electronic circuitry as a unit.

Yet another form of the invention is an emulation device for use with a target device having an interface circuit having a set of electronic states accessible in response to an input signal. The emulation device includes a state machine having a set of electronic states corresponding to the electronic states of the target device with which the emulation device is to be used. A second circuit is adapted to hold a digital signal representing one of the electronic states of the state machine to be assumed upon command. Further included is a control signal producing circuit responsive to the state machine to produce the input signal for the target device thereby to cause the target device to assume the corresponding electronic state upon command.

Still another form of the invention is an emulation device for use with a target device. The emulation device includes a sequence generator including a state machine having a set of successive electronic states to produce signals for the target device with which the emulation device is to be used. A sequence acceptor circuit includes a second state machine having a set of electronic states corresponding to the electronic states of the sequence generator. Further included is a delay circuit connected between the sequence generator and the sequence acceptor circuit to delay operations of the sequence acceptor circuit relative to the sequence generator.

An additional form of the invention is an emulation device for connection between a host computer and a target device. The target device includes an interface circuit with electronic states among which is a data transfer electronic state. The electronic states are accessible in response to a control signal from the emulation device, and there is a signal delay between the emulation device and target device. The emulation device includes a data transfer circuit having an enable input, a data input for coupling to the target device and an external output for sending data received from the target device to the host computer. A sequence acceptor includes a state machine having a set of electronic states corresponding to the electronic states of the target device with which the emulation device is to be used thereby to simulate the electronic state of the target taking the signal delay into account and enable the data transfer circuit when the target device is in the data transfer state.

A further additional form of the invention is a cable for connecting a host computer to the target wherein the cable includes a plurality of serially connected signal storage elements and a medium segmented by the elements for conveying the signals for emulation.

Other device, system and method forms of the invention are also disclosed and claimed herein. Other objects of the invention are disclosed and still other objects will be apparent from the disclosure herein.

BRIEF DESCRIPTION OF THE DRAWINGS

The novel features believed characteristic of the invention are set forth in the appended claims. The preferred embodiments of the invention as well as other features and advantages thereof will be be best understood by reference to the detailed description which follows, read in conjunction with the accompanying drawings, wherein:

FIG. 18 is a top view of a pin-out for the scan bus master of FIG. 16;

Corresponding numerals and other corresponding symbols refer to corresponding parts in the various Figures of drawing except where the context indicates otherwise.

DETAILED DESCRIPTION OF PREFERRED EMBODIMENTS

Figure 1:
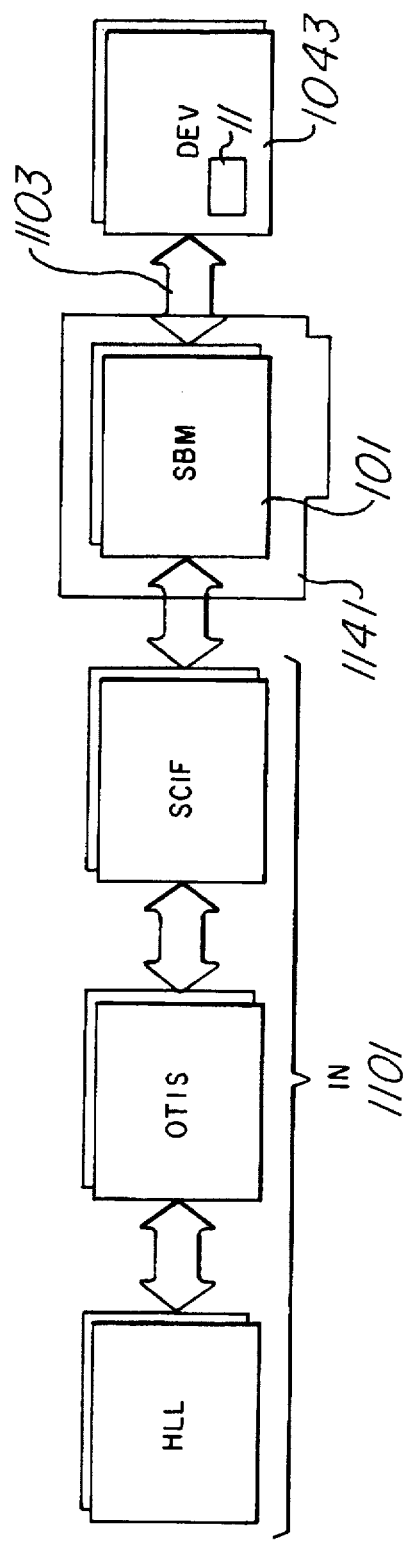
FIG. 1 is a block diagram of an improved emulation, simulation and testing system.

Coassigned, incorporated applications TI-14141, 14142, 14143, 14146, 14282 and 14308 have identical drawings to each other and disclose emulation, simulation and testability circuitry, devices, systems and methods as well as principles and terminology that provide an exemplary context for the detailed description of the circuitry, devices, systems and methods disclosed herein. Accordingly, reference numerals correspond as much as possible in the present further drawings with the numerals of the just-listed coassigned, incorporated applications.

For example, in FIG. 1 of the present application, and with reference to FIGS. 44 and 45 of said incorporated applications, emulation-simulation-test host computer 1101 has high level language HLL software including an operational target interface system OTIS and a scan interface software SCIF. Host 1101 provides test patterns and major commands to a controller card 1141 including a serial scan generator or scan bus master SBM 101. SBM 101 is architecture and engine independent, thus being widely applicable as an article of manufacture. OTIS and SCIF are software constructs that are architecture and engine specific to particular chips such as a particular microprocessor, microcontroller, digital signal processor, graphics system processor or other device.

Serial scan signals and control signals are carried bidirectionally along a serial line 1103 as described in the coassigned, incorporated applications, to a printed wiring board 1043 having various target chips or devices mounted thereon. For example, one target device is device 11 as described in said applications and in coassigned incorporated applications Ser. No. 347,605 (TI-14079), Ser. No. 347,596 (TI-14080), Ser. No. 347,615 (TI-14081), Ser. No. 347,906 (TI-14082), Ser. No. 347,968 (TI-14083), Ser. No. 347,967 (TI-14145), and Ser. No. 347,969 (TI-14147). For example, device 11 has sets of serially connected set of serial shift register latches (SRLS) distributed through the device like beads on a string for input and output of emulation signals serially. The system of FIG. 1 is herein termed a remote or external emulation system in that the SBM 101 is separated by line 1103 from the board 1043 and is especially useful for applying compiled test patterns and performing remote silicon (or gallium arsenide) hardware debug.

As disclosed in the coassigned, incorporated applications TI-14141, 14142, 14143, 14146, 14282 and 14308 (see FIGS. 49-57), serial scan test bus 1103 and TAP (Test Access Port) interface controller 1149 therein provide a common methodology for boundary scan testing, and allow a scan path to made up of several devices as in FIG. 49 of the incorporated applications.

Figure 2:
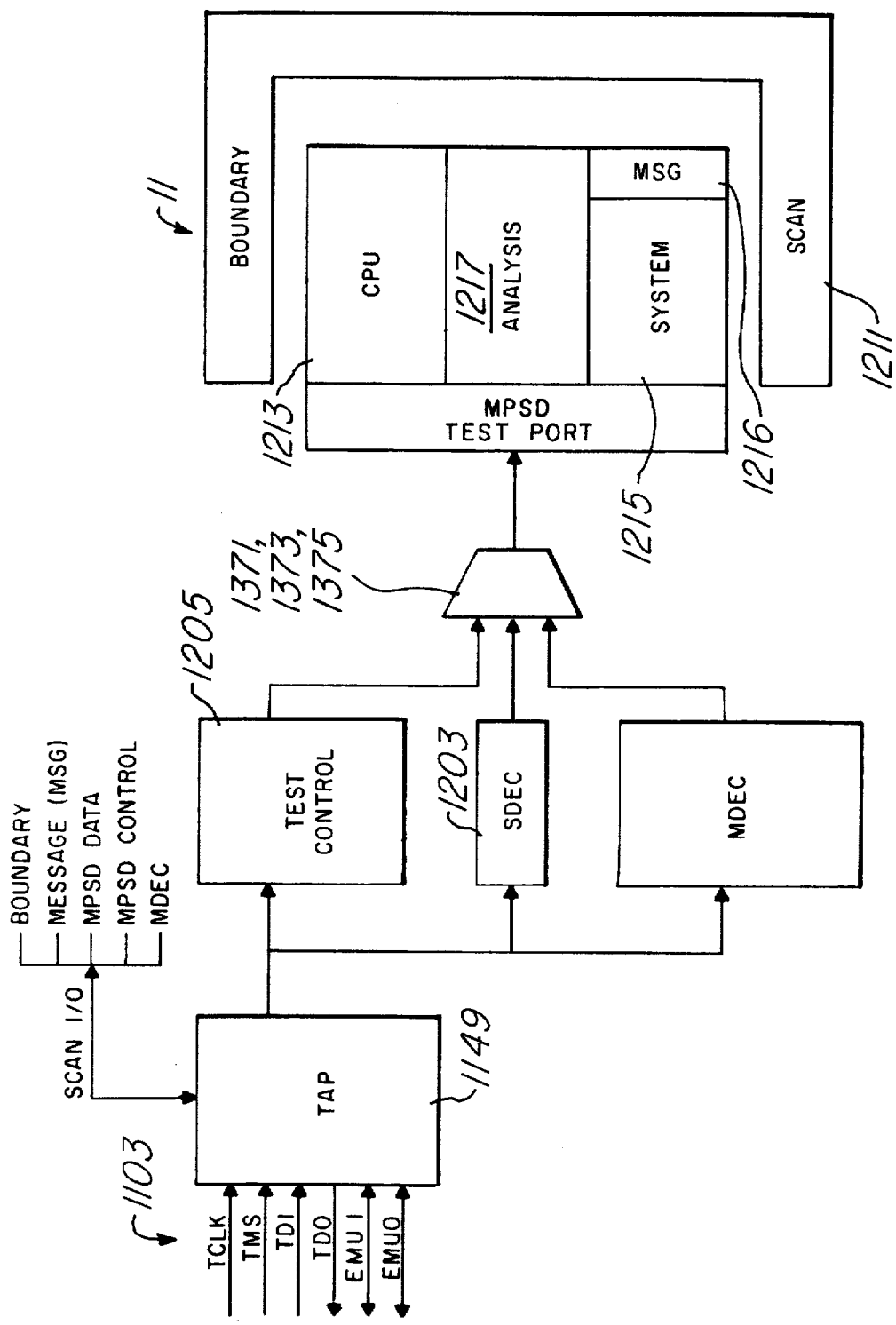
FIG. 2 is a block diagram of a target device with a scan testability interface.

FIG. 2 of the present application shows serial line 1103, TAP controller 1149, test control 1205, single device emulation control SDEC 1203, and a multidevice emulation control MDEC selectively connected by selector circuitry such as 1371, 1373, 1375 of incorporated FIG. 49 to the rest of device 11. The device 11 has boundary scan 1211, CPU core domain 1213, system domain 1215, message peripheral 1216, and analysis domain 1217 all as described in said incorporated applications.

A protocol should be applied to control the domains, which are scanable. Thus a controller or bus master 101 is advantageously provided to apply protocol commands, apply test data and monitor test results.

Modular Port Scan Design (MPSD) test ports are provided for the domains, as described in connection with coassigned application Ser. No. 057,078 (TI-12033) which is hereby incorporated herein by reference, and are controlled as disclosed in connection with FIGS. 57-64 of the incorporated applications including TI-14146.

Providing on-chip emulation circuits as in FIG. 2 points to new horizons in the field of off-chip circuits which cooperate with the on-chip emulation circuitry.

In external or remote emulation, scan bus master 101 of FIG. 1 is located on circuit board 1141 which is inserted in the host computer 1101 for example, and connected via a serial line to the system board 1043 for a particular application. This approach is cost effective for a system board that is sent to the field in numerous systems and is never accessed in the field, because one scan bus master 101 in host computer 1101 services a multitude of system boards 1043 before shipment to the field.

Figure 3:
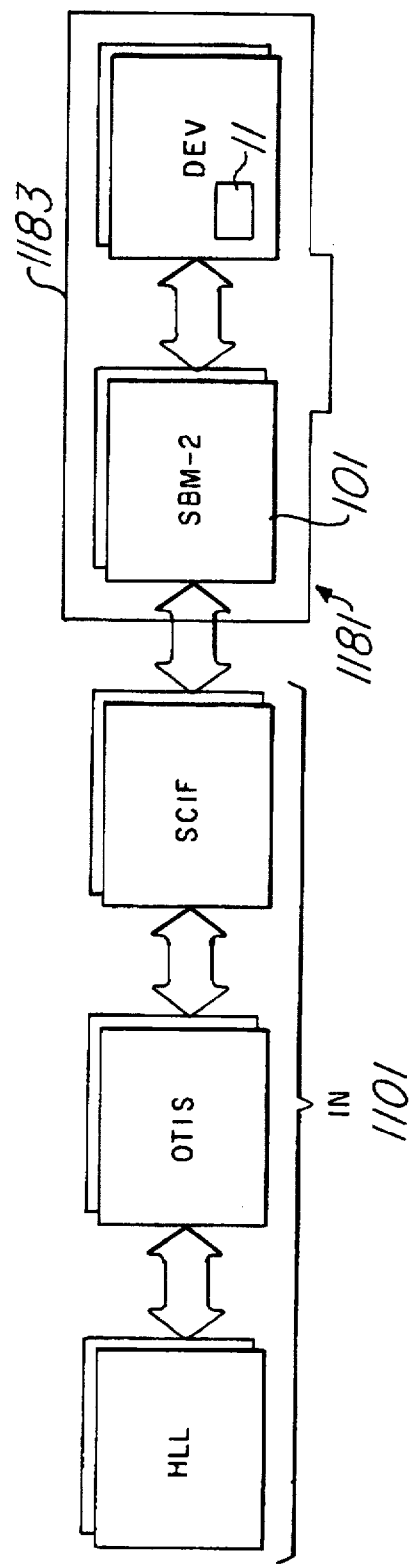
FIG. 3 is a block diagram of another improved emulation, simulation and testing system featuring embedded emulation.

In FIG. 3, the present work now recognizes that the scan bus master 101 can be resident anywhere, not only in a development system host 1101 but also embedded in an application system 1181. Embedded emulation revolutionizes the options and relative economics of prototyping, development, manufacturing test and field test. In embedded emulation, a scan bus master 101 illustratively designated SBM-2 is located on a system printed wiring board 1183 and shipped to the field with the rest of the system 1181. The scan bus master 101 of FIG. 3 is not located on a card 1141 inserted in the host personal computer 1101. Instead the scan bus master 101 is built into the target hardware. Moreover, scan bus master hardware can be produced relatively inexpensively as a chip, making this approach very attractive.

For example, embedded emulation confers to system development companies debug facilities built into each and every system on which they will customize code. The business strategy of such companies meshes with an approach by which they purchase undeveloped system boards and then develop, change or modify code at their own location or at their customers' sites.

Embedded emulation also confers board testing capability for detecting solder bridges, failed output buffers and other system defects. The same chip SBM 101 that provides development capability also provides board boundary scan checks so that customer boards test themselves. Embedded emulation overcomes the problems of testing modern high density surface mount boards and boards with very close pin spacings that are inaccessible to conventional target connectors.

Heretofore, IC chip test, board test, and software development have been three different worlds. Now one methodology, and one standard test port solves all three problems. The entire issue of *Texas Instruments Technical Journal* Vol. 5, No. 4, "Testability-Integrating Design and Test" is hereby incorporated herein by reference.

Figure 4:
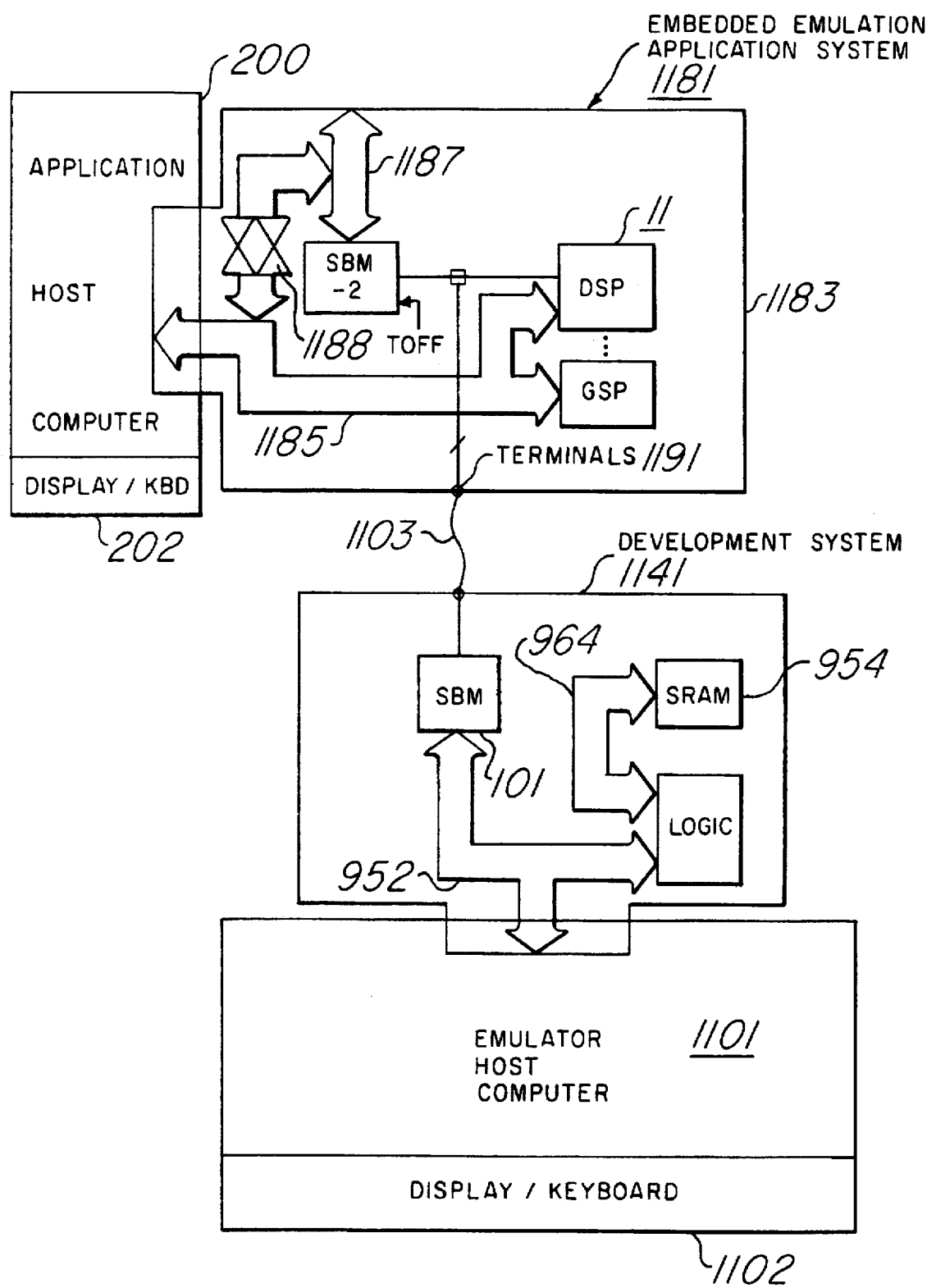
FIG. 4 is a partially pictorial, partially block diagrammatic depiction of embedded emulation in an application system connected to a host computer.

In FIG. 4, both remote and embedded emulation structures are combined when an SBM 101 in development system card 1141 is relatively fast or otherwise usepreferable in development compared to an SBM-2 in application system 1181. Application system 1181 includes a DSP as an example of device 11 and a GSP connected via a parallel bus 1185 insertable or inserted into an application host computer 200 having associated display (video, LED, LCD, printer or other display) 202. DSP 11 and the GSP are on a scan ring accessible via serial bus 1103 via either SBM-2 or SBM 101. SBM-2 is also accessible by a parallel bus 1187 which is illustratively separate from bus 1185 but also connectable thereto by an optional bidirectional transceiver or port 1188. Card 1141 is inserted or insertable into emulator host 1101 which has its associated display and keyboard assembly 1102. When SBM 101 on card 1141 is active it disables SBM-2 via a TOFF disable line responsive to connection of cable 1103 to a set of terminals 1191 on board 1183 for temporary attachment.

Figure 5:
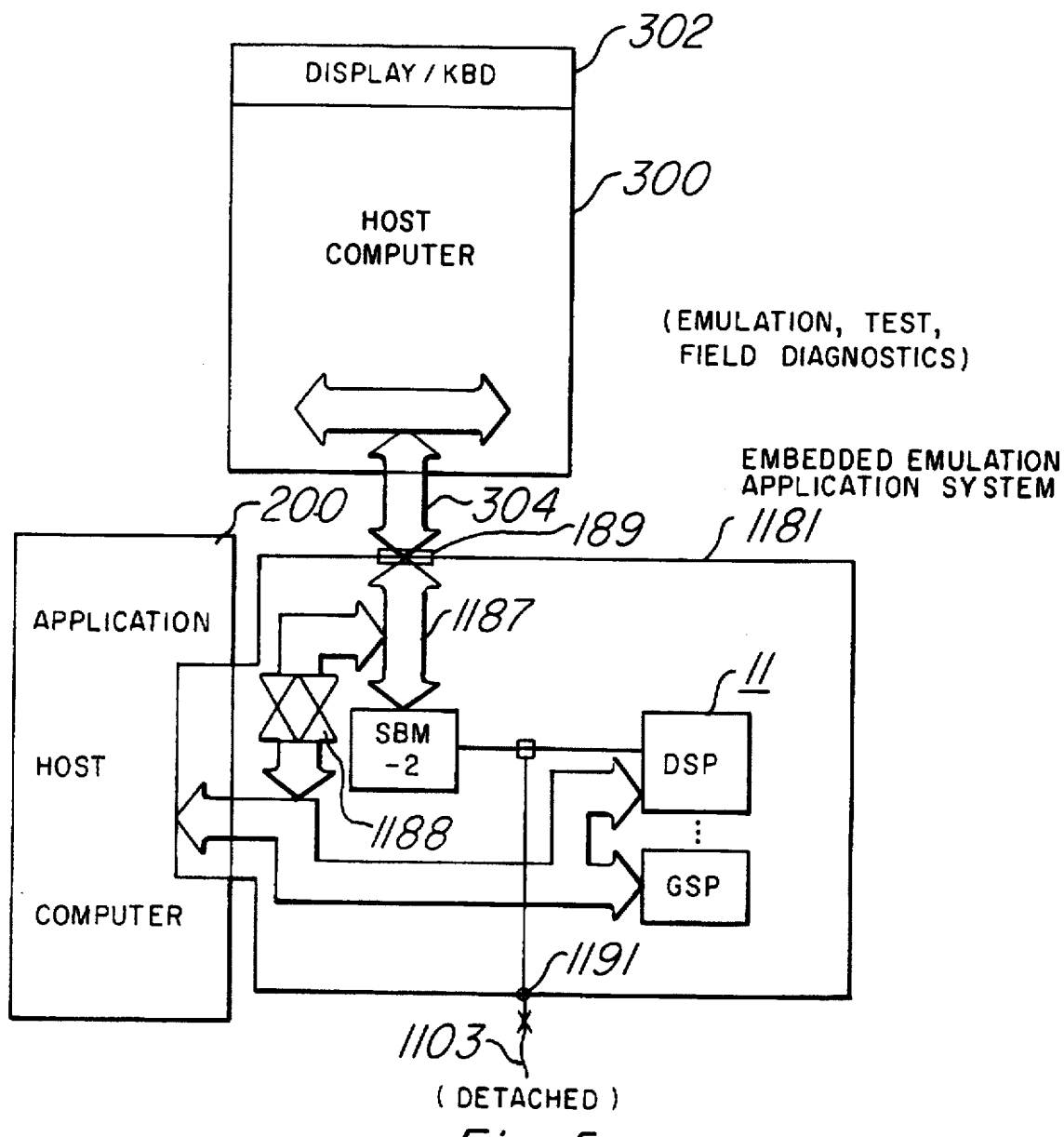
FIG. 5 is a partially pictorial, partially block diagrammatic depiction of embedded emulation in an application system connected to a host computer either in the field test or manufacturing environment.

In FIG. 5, embedded emulation further confers advanced diagnostic capabilities to field sites even in designcompleted installed systems. A portable personal computer 300 and display/keyboard 302 with no hardware additions is simply connected by a parallel cable 304 to terminals 1189 to parallel bus 1187 to SBM-2 on the application system 1181 in the field, or even in manufacture. A test program is inserted in host computer 300 and executed.

As a practical matter, embedded emulation is in some embodiments advantageously implemented in a slower, scan bus master circuit on the system board 1181, while external emulation is in some of its embodiments advantageously implemented in a fast, hardware-based gate array, standardcell or TTL approach with associated fast static RAM (SRAM) on card 1141 of FIG. 4. In manufacture, for instance as shown in FIG. 4, the card 1141 inserted in host computer 1101 for operator control is suitably connected to the application system board 1181 that has the embedded emulation. Thus, SBM 1101 on card 1141 is an example of a detachable second serial scan generator temporarily connected to electronic circuitry on board 1183 for emulation, simulation and testing in manufacture, for example.

The herein contemplated embedded emulation systems can range from a hardware or microcoded firmware implementation that directly controls the target scan path to an embodiment using an onboard software driven embedded processor in conjunction with dedicated scan control hardware. External emulation or remote emulation systems can range from software control via a processor on a maintenance platform to a combination of a processor with dedicated scan control hardware.

Figure 6:
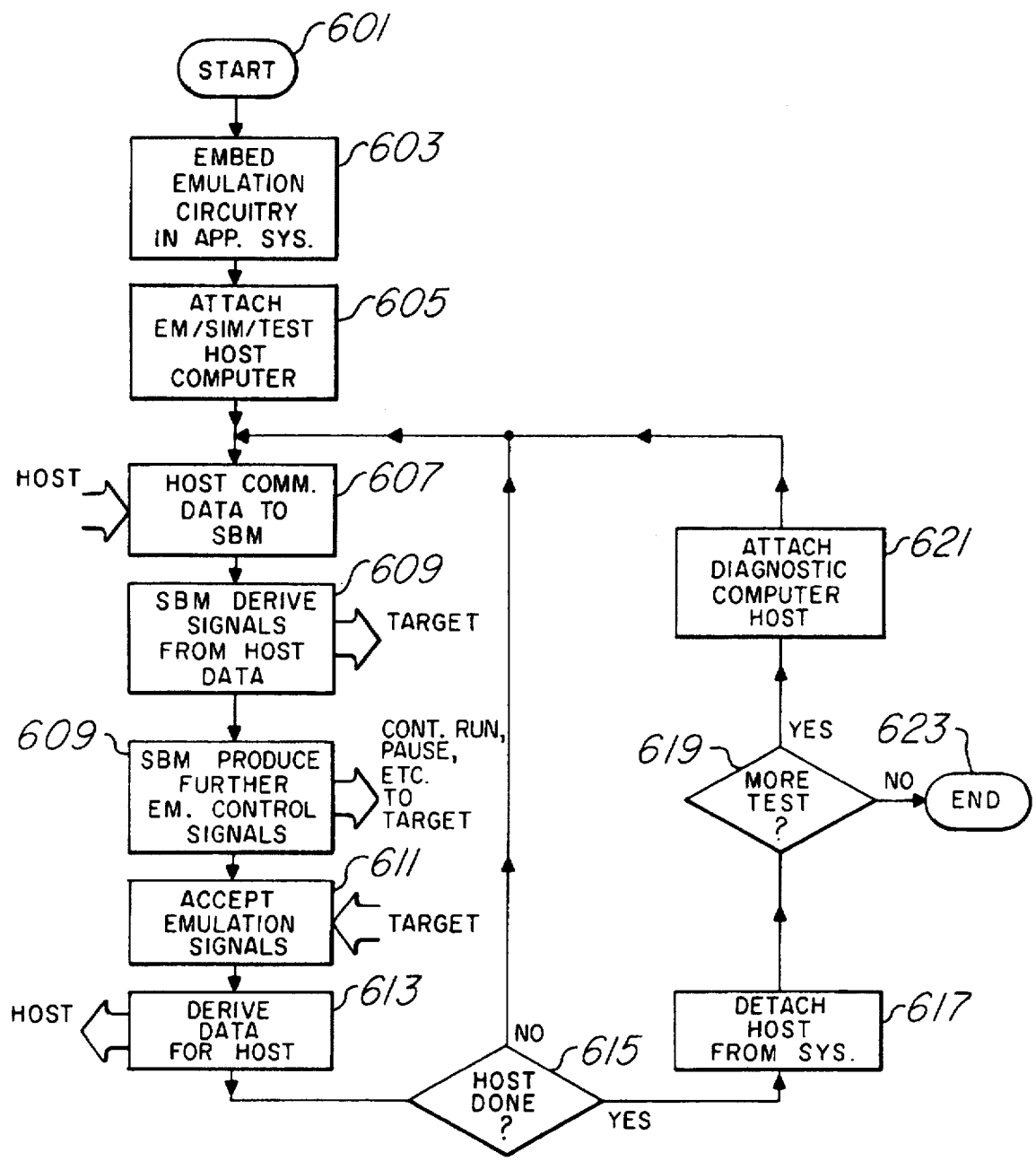
FIG. 6 is a process flow diagram of an embedded emulation method.

An improved process of FIG. 6 commences with a START 601 and proceeds in a step 603 to embed on system board 1181 the emulation, simulation and testability circuitry comprised in a chip such as SBM-2 of FIGS. 4 and 5. For example, SBM-2 is suitably configured as a serial scan generator embedded in the electronic system of system board 1181 in manufacture, and the serial scan generator is also subsequently operable for test purposes.

Next in a step 605, a host computer 1101 for emulation, simulation and test software controlled operations is attached directly to SBM-2 input bus 1187 via a parallel cable 304 without card 1141.

In a further step 607, host 1101 in the manufacturing and development phase, communicates major commands and scan bits such as test vectors to SBM-2. In step 609, the SBM derives instruction scan and data scan signals from the host data, or alternatively derives MPSD codes directly, and sends them to the application system 1181 including the target chips such as device 11. Remarkably, the SBM also produces in step 609 further emulation control signals such as pauses, controlled run codes and other signals for the target device 11 scan controller and MPSD circuitry, that are not directly communicated to the SBM from the host 1101. Advantageously, the programming of the OTIS and SCIF software for host 1101 need not be concerned with the generation of these further emulation control signals which are taken care of by the SBM.

In operation, the SBM-2 in a step 611 accepts emulation signals returned from the target device 11 and application system 1181 generally. Then in a step 613, the SBM selects, derives and formats data from the emulation signals for parallel return to the host 1101.

If in a decision step 615, the host 1101 has not completed its emulation, simulation, test or other operations, the process loops back to step 607 and repeats steps with additional data and control signals. Then when the host 1101 is done in decision step 615, operations proceed to a step 617 whereupon the host 1101 has cable 304 physically detached from terminals 1189 of board 1181 in FIG. 5. If, in a decision step 619 of FIG. 6, more testing is needed, as in system integration or field test, the process proceeds to a step 621 to attach diagnostic computer host 300 by cable 304 to terminals 1189 of the application system 1181. The process flow then goes to step 607 for communication of data and control signals, as already described. If in step 619, there is no more testing, the process ends at END 623.

Figure 7:
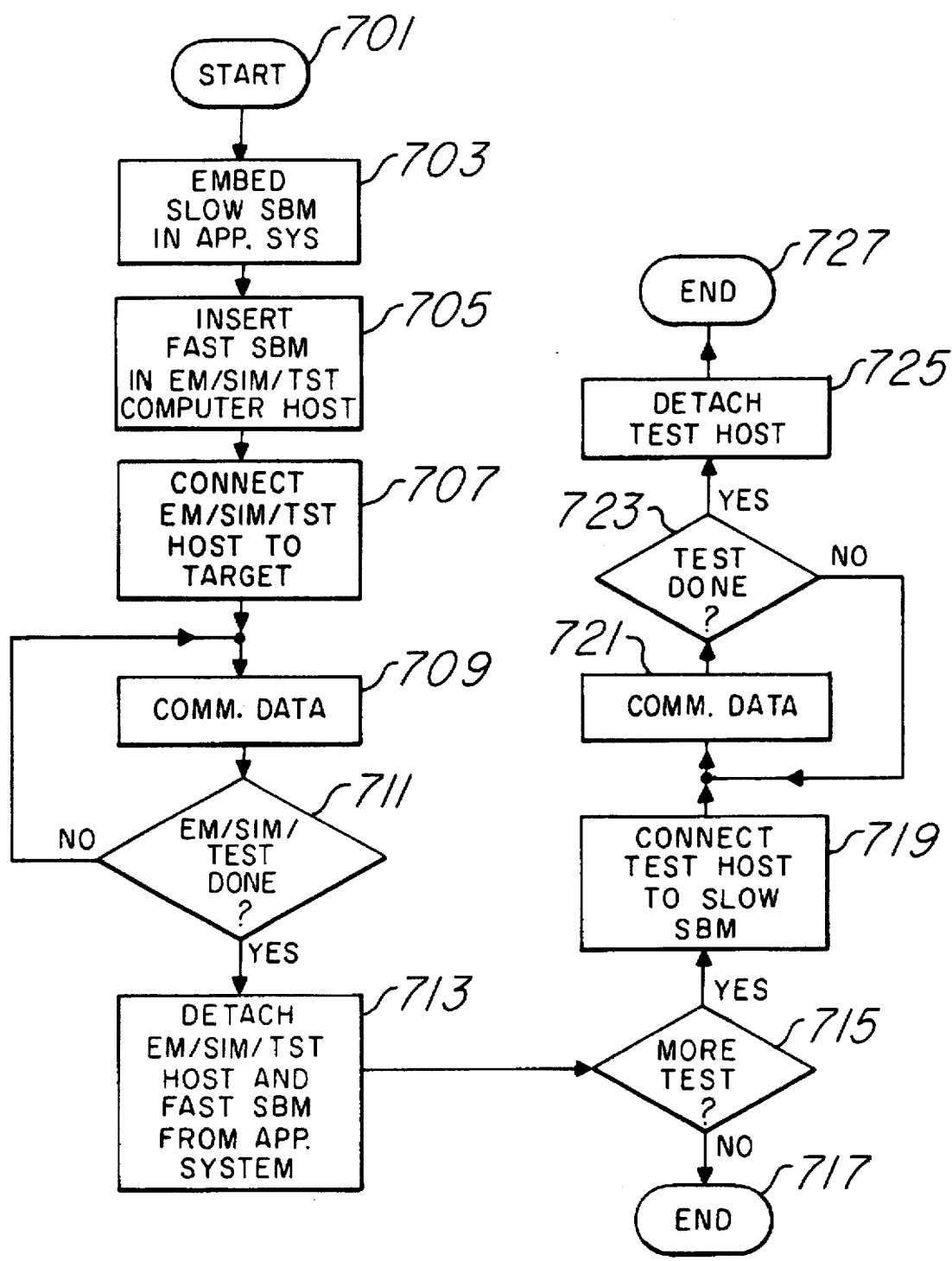
FIG. 7 is a process flow diagram of another embedded emulation method.

In FIG. 7 an alternative improved process commences with a START 701 and proceeds to a step 703 to embed a relative slow SBM in the application system 1181. In succeeding step 705, a faster SBM on card 1141 is inserted in host computer 1101 of FIG. 4. The card 1141 becomes part of host computer 1101 as an improved emulation/ simulation/test host. Then in a step 707 the card 1141 in the host is connected via cable 1103 to target terminals 1191 of FIG. 4.

With the host 1101 and card 1103 thus connected to target board 1181, communication of data in a step 709 occurs according to the steps 607–613 of FIG. 6. A decision step 711 loops operations back to step 709 until the emulation/ simulation/test operations are done, whereupon step 713 is reached.

In process step 713, cable 1103 is detached from terminals 1191 of FIG. 5, so that host computer 1101 and the fast SBM on card 1141 are detached from the application system 1181. If no more tests, then a decision step 715 branches to an END 717; otherwise the method proceeds to a step 719 to connect test host computer 300 via cable 304 to terminals 1189 of system 1181. Thus, the host 300 communicates with the slower embedded SBM in system 1181, unlike host 1101 which communicated with the faster SBM on controller card 1141. The functionality of the embedded SBM is fully adequate for system integration and field test purposes.

With the host 300 thus connected to target board 1181, communication of data in a step 721 occurs according to the steps 607–613 of FIG. 6. A decision step 723 loops operations back to step 721 until the operations commanded by computer host 300 are done, whereupon step 725 is reached.

Step 725 detaches the test host 300 cable 304 from terminals 1189 whereupon the FIG. 5 application system combination of application host 200 and system 1181 is fully operational, and END 727 is reached.

Figure 8:
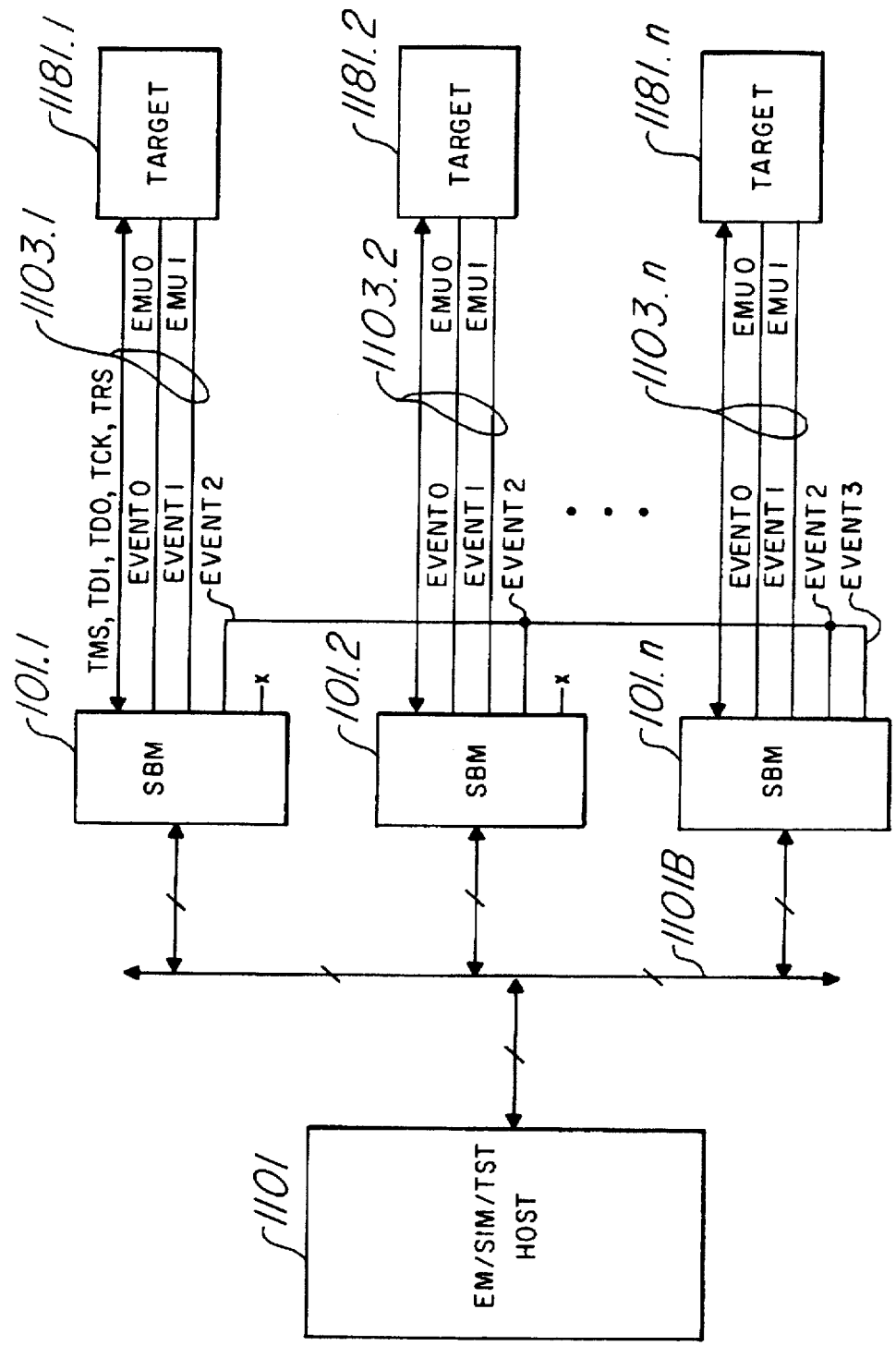
FIG. 8 is a block diagram of a system using several improved bus master controllers in a coordinated manner to control several targets.

In FIG. 8 host 1101 is connected via a host bus 1101B (on a system motherboard for example) to multiple controller SBMs 101.1, 101.2, ... 101.n. The SBMs are respectively connected to corresponding system boards 1181.1, 1181.2, ... 1181.n by cables or buses 1103.1, 1103.2, ... 1103.n. The suffix numerals indicate that the units having the same prefix numeral are suitably identical, although they need not necessarily be identical, and that the prefix numeral refers to a unit described elsewhere herein or in the incorporated applications.

The arrangement of FIG. 8 is applicable to complex systems having several system boards each with a different embedded emulation SBM chip, where it is desired to perform operations simultaneously or in predetermined time relationship on the several boards 1181.1, 1181.2, ... 1181.n. For this purpose host 1101 individually addresses the SBMs 101.1, 101.2, and 101.n and loads them with data and major commands. The SBMs operate independently, loading their target boards 1181.1–.n. When it is desired to operate them in predetermined time relationship, host 1101 supplies a signal illustratively to SBM 101.n to activate a pin EVENT3 as a BEGIN output pin. Pin EVENT3 is connected in common to another pin EVENT2 on each (or only some as the case may be) of the SBMs 101.1–.n. When Pin EVENT3 becomes active, all of the SBMs execute a predetermined operation such as an EXECUTE (target run) command in the predetermined time relationship.

Figure 9:
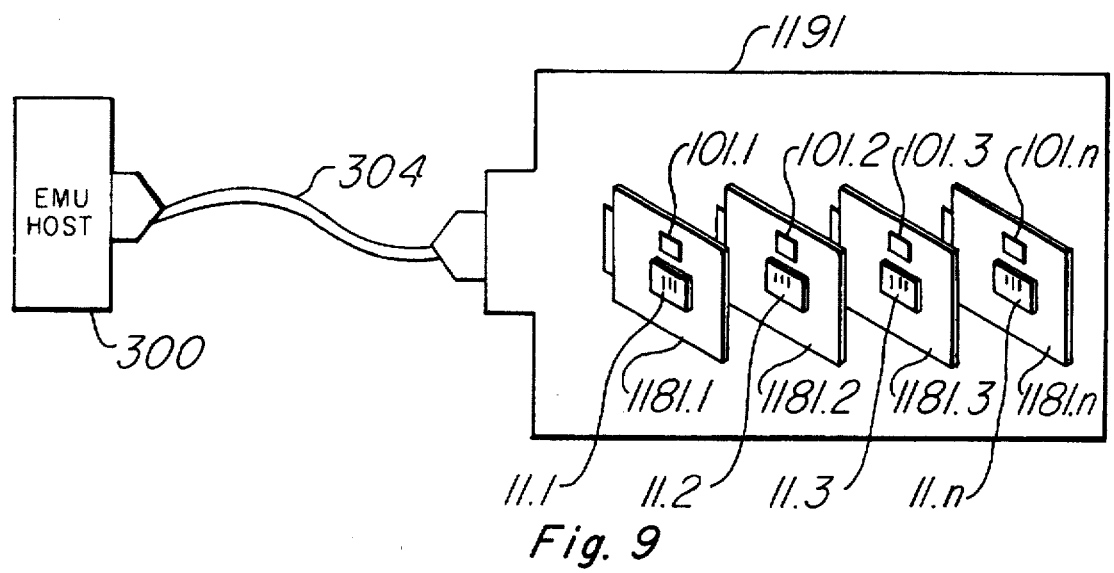
FIG. 9 is a pictorial diagram of an emulator host computer connected to a system having several subsystem printed wiring boards including improved bus master controllers.

Physical implementation in FIG. 9 of the arrangement of FIG. 8 according to the embedded emulation approach suitably has a motherboard 1191 holding system boards 1181.1–.n respectively having devices 11.1–.n and SBMs 101.1–.n. Host 300 communicates via parallel cable 304 to motherboard 1191. Alternatively host 300 is resident in the system and cable 304 is dispensed with. The arrangement of FIG. 9 is suitable for example in telecommunications applications.

Figure 10:
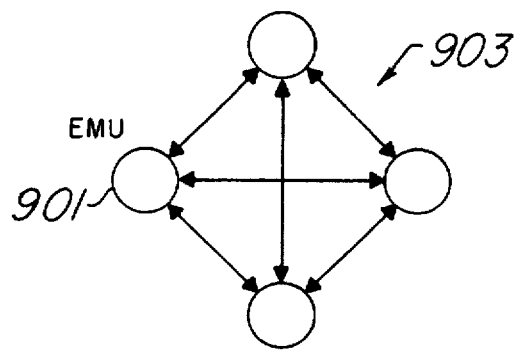
FIG. 10 is a block diagram of a computer network having emulation, simulation and testability node processing embedded therein.

In FIG. 10, a multiprocessor system includes the emulation processor as one node 901 in a multiply-connected SIMD (single instruction multiple data) or MIMD (multiple instruction multiple data) arrangement of computers 903. The full resources of the emulation processor 901 and its included SBM are utilized in terms of bandwidth, processing power, and peripherals according to this approach.

Figure 11:
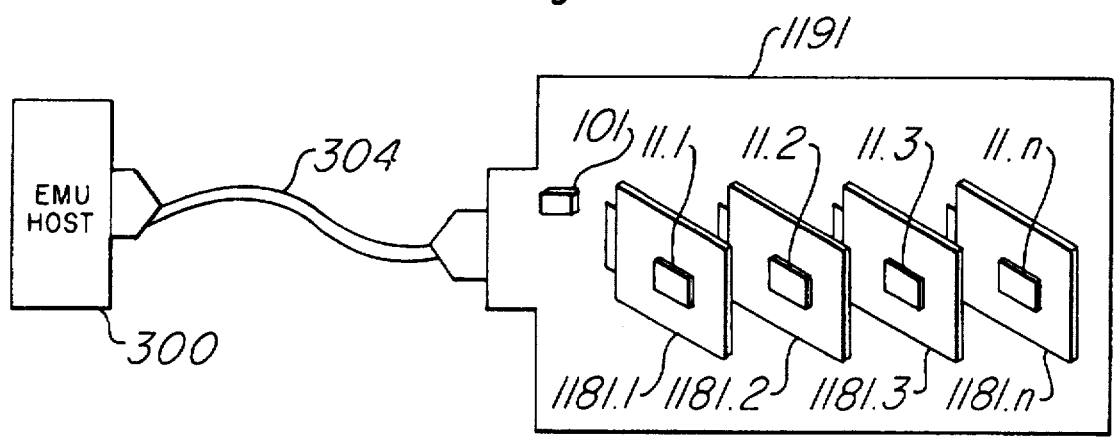
FIG. 11 is a pictorial diagram of an emulator host computer connected to a system having several subsystem printed wiring boards and a motherboard with one improved bus master controller thereon.
Figure 12:
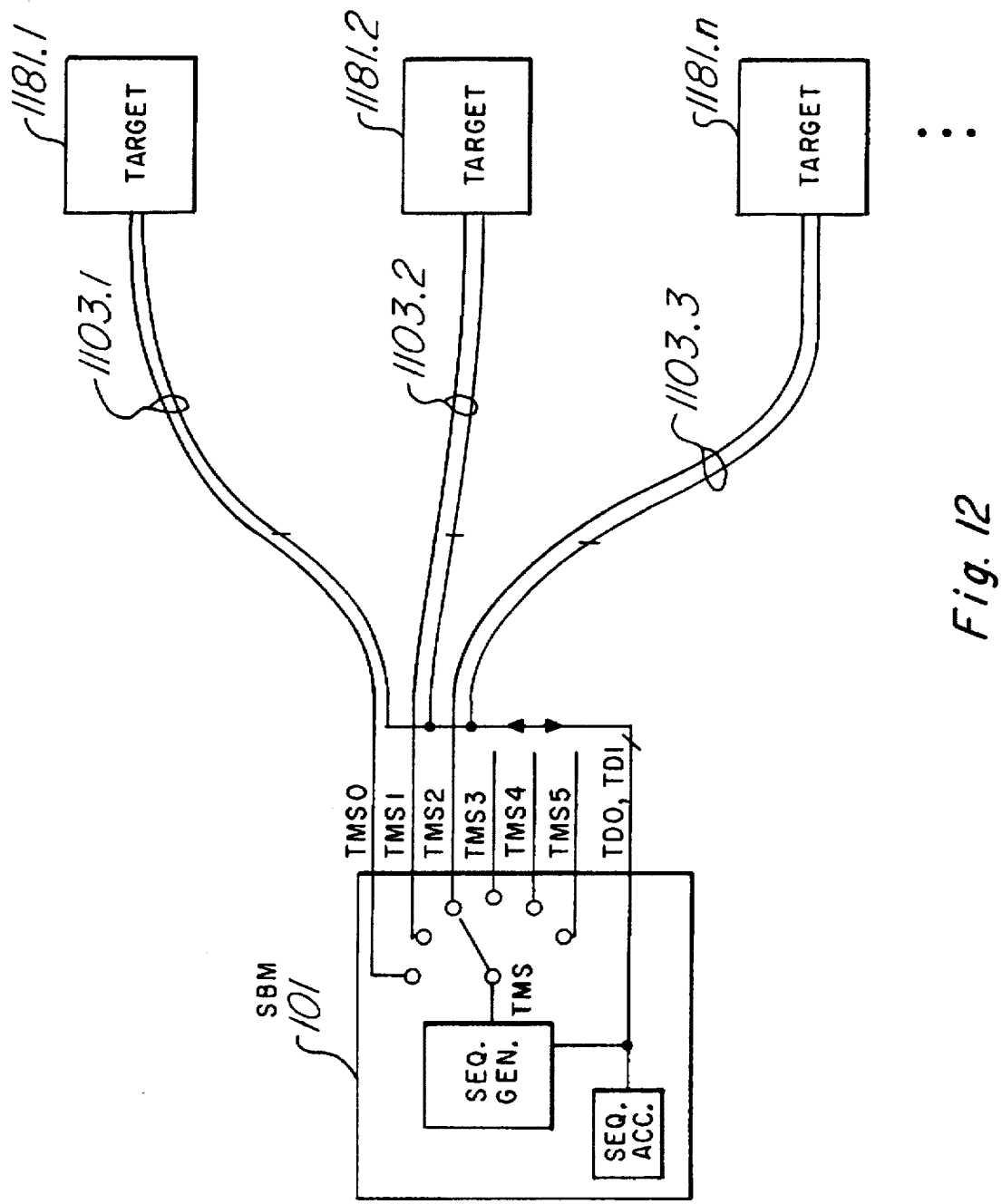
FIG. 12 is a block diagram of a single improved bus master controller selectively communicating with several target devices.

The many systems described in incorporated applications TI-14079, 14080, 14081, 14081, 14082, 14083, 14145 and 14147 readily accommodate SBM 101 in embedded emulation. A few examples of such systems have electronic circuitry in modems, other telecommunications circuitry, automotive controls, microcontroller circuitry in servomechanisms generally, and processed circuitry associated with input transducers and video displays. In FIGS. 11 and 12, host 300 is connected by parallel cable 304 to a single SBM 101 on motherboard 1191. SBM 101 connects serially with advantageously low expenditure of board real estate to system boards 1181.1–.n on which are mounted devices 11.1–.n respectively. The entire system may be put on one scan path. An advantageous alternative arrangement provides multiple scan paths with individually selected and operated test mode lines TMS0, TMS1, ... TMS(n-1) lines fanning out from SBM 101 to the target boards 1181.1–.n respectively, as illustrated particularly in FIG. 12.

It is emphasized that embedded emulation contemplates any arrangement or physical assembly rigidly, flexibly or alterably supporting the emulation circuitry and the target electronic circuitry as a unit, and examples include printed circuits or printed wiring boards, motherboards, VLSI integration of the SBM onto each target chip itself, magnetic bubble substrates, electro-optic processor assemblies and metallic, plastic, crystalline, wooden and other supports, linkages and configurations now known or hereafter utilized.

In a further advantageous feature, the SBM 101 is compatible with devices having a serial scan and testability interface (e.g. IEEE JTAG) and also with devices such as the Texas Instruments 320C30 floating point digital signal processor which has an MPSD interface using C1, C0 MPSD codes. Remarkably, these distinct methodologies are accommodated by the same SBM.

Figure 13:
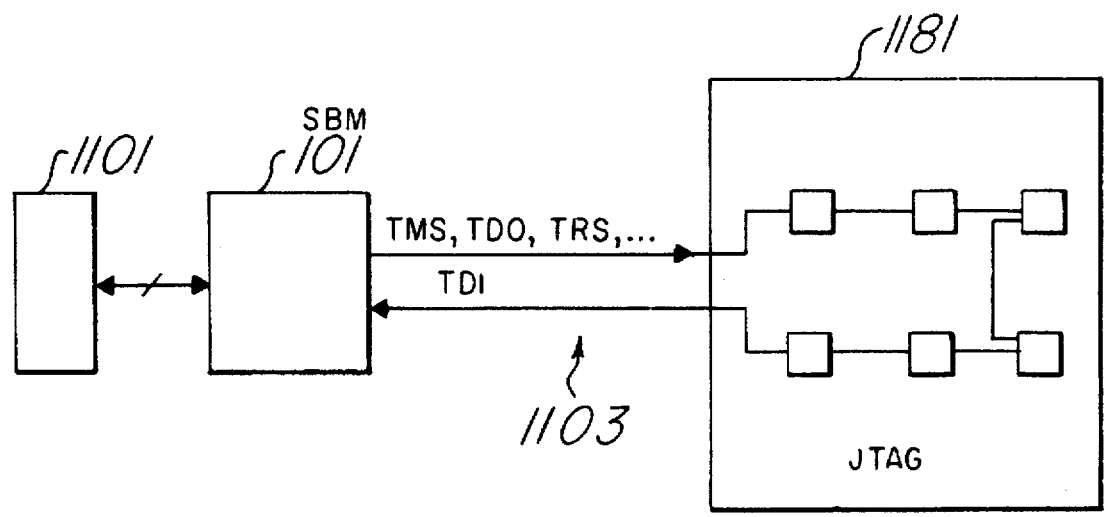
FIG. 13 is a block diagram of a single improved bus master controller communicating with target devices having a serial scan interface.

In FIG. 13, SBM 101 is connected by cable 1103 to a JTAG-compatible system 1181 including devices connected on a scan path in the manner of FIG. 49 of the incorporated applications. Cable 1103 supports the various lines TMS, TCK, TDO, TRS, TDI for controlling the serial scan interface in the target devices.

Figure 14:
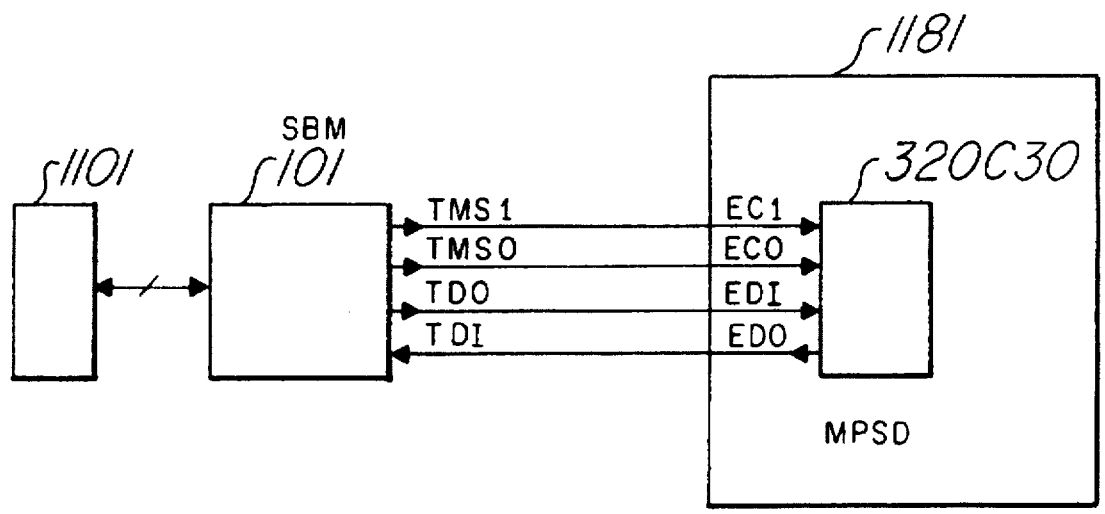
FIG. 14 is a block diagram of a single improved bus master controller communicating with a target according to the MPSD methodology.

In FIG. 14, the same SBM accommodates an MPSD device with 101 has at least two TMS output lines for use with multiple targets of FIG. 12. The two TMS output lines TMS1 and TMS0 for example are used to supply the C1 and C0 MPSD control codes for one MPSD device such as the Texas Instruments 320C30 digital signal processor. The choice of MPSD or JTAG compatible codes for operation in FIGS. 13 or 14 is made by software command from host 1101 to SBM 101 based on the type of devices in the target board 1181. This advantageous flexibility is available when SBM 101 is used in either remote or embedded emulation contexts.

Figure 15:
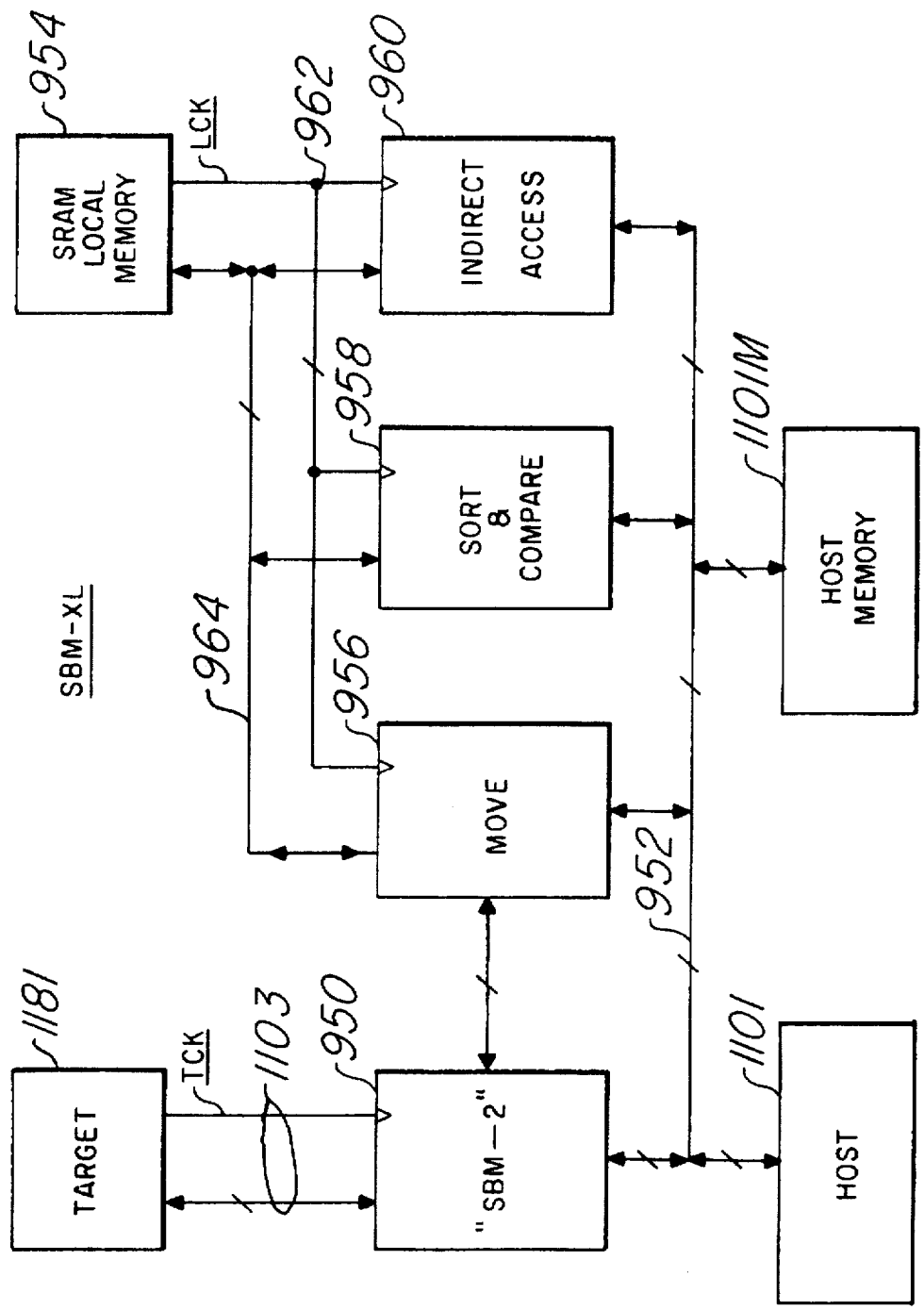
FIG. 15 is a block diagram of an improved bus master controller having sort and compare, and direct memory access hardware combined with the controller.

A relatively fast SBM of FIG. 15, herein called SBM-XL, is suitably provided on card 1141 of FIG. 1. The SBM-XL controller includes SBM-2 circuitry 950 having a parallel input connected to a parallel bus 952 of host computer 1101 and host memory 1101M. The SBM-2 circuitry 950 has an output which is connectable by cable 1103 to a target board 1181. SBM-XL further includes block MOVE circuitry 956, SORT & COMPARE circuitry 958 and INDIRECT ACCESS circuitry 960. Each of the circuits 956, 958 and 960 are connected for bidirectional communication with host bus 952. MOVE circuit 956 is connected to SBM-2 circuitry 950 to pass buffer status and data information therebetween. Each of the circuits 956, 958 and 960 are clocked by a common local clock line LCK 962 and are connected for bidirectional read/write operations on a memory bus 964 to local SRAM memory 954.

The circuits 950, 956, 958 and 960 are operable concurrently. The MOVE circuit passes data between the SRAM 954 and the SBM-2 circuitry 950. INDIRECT ACCESS circuitry 960 passes data between SRAM 954 and host computer 1101. The SORT & COMPARE circuitry 958 manipulates data in local memory SRAM 954 to perform bit reversals and other data manipulations which would be too time consuming for host 1101 or the SBM-2 circuitry. As a whole, the SBM-XL is a combination of scan bus master SBM-2 circuitry with outboard data processing and direct memory access (DMA) thus increasing the speed and flexibility of emulation, simulation and testability operations.

Serial interfaces are slower than parallel interfaces, generally speaking. Even with high speed integrated circuits, scanning can be time-consuming, especially if controlled directly by software on a host processor without any hardware compensation.

For example, the following software steps can be utilized to accomplish a one-bit scan operation: Fetch word from memory and execute following steps for all bits: Mask off target bit within word, shift target bit to Data Out Bit position, Write bit to port, toggle clock bit on port to High/Low, read Data In bit, shift bit to desired position, and store in memory. The foregoing steps generally use multiple software instructions per step with multiple processor clock cycles for each instruction. Therefore, the scan rate is generally lower than the processor frequency, which itself is much lower than the relatively high frequencies used in some advanced integrated circuits.

By implementing bit manipulation and shift operations in hardware, a preferred embodiment of a scan controller SBM 101 improves the efficiency of a serial scan interface substantially. The number of host 1101 based software instructions is reduced significantly. Accepting parallel instructions and data from the host 1103, the controller SBM 101 converts host instructions and data to a serial protocol format.

Two major functions of a test bus interface are to control target execution for test purposes and scan data or instructions to the target devices such as device 11 in system 1181.

A preferred embodiment scan bus master SBM 101 connects to a system bus of a 80286 or 80386 microcomputer in host processor 1101. The SBM 101 can be placed on a controller card 1141 inserted in the host computer 1101 or is placed directly in an application system under test (UUT) 1043. The SBM 101 is conveniently provided in a 44 pin device package of FIG. 18 and operates at a frequency of 25 MHz, or such frequency as the skilled worker selects.

Commands and control bits provide a substantial complement of functionality and the preferred embodiment can be augmented by adding further commands and control bits incrementally by reusing the logic. The flexibility of the preferred embodiment makes software created for an initial controller circuit upward compatible with later designs. Since software may be more expensive than hardware, the reusable software feature has substantial value.

Figure 16:
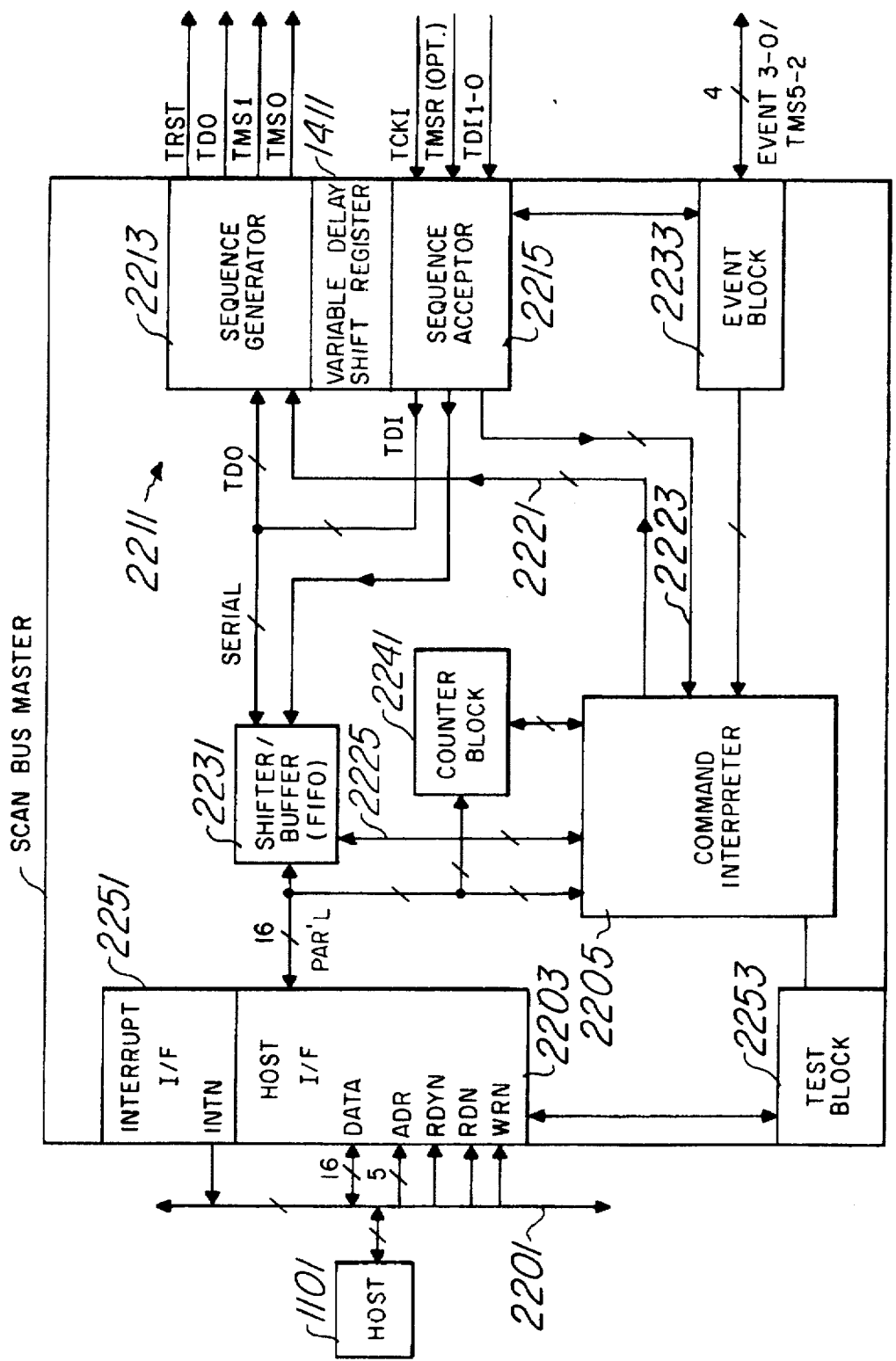
FIG. 16 is a block diagram of a special scan bus master controller.

In FIG. 16, host 1101 is connected to a bidirectional parallel bus 2201 through which the host processor 1101 writes to and reads from the SBM 101. A host interface 2203 in SBM 101 connects to bus 2201. The SBM 101 suitably synchronizes the host processor clock and the test clock in host interface 2203.

A command interpreter circuit 2205 accepts commands from the host 1101 and controls and monitors the operation of the other blocks in SBM 101 of FIG. 16.

A scan control 2211 includes a sequence generator 2213 and sequence acceptor 2215 that together control the serial scan path. Sequence generator 2213 is connected to output pins for test mode select TMS, reset TRST and scan data out TDO. Sequence acceptor 2215 is connected to input pins for scan data input TDI, test clock input TCKI and optional TMS return TMSR. Command interpreter 2205 is connected by respective lines 2221 and 2223 to the sequence generator 2213 and sequence acceptor 2215.

Figure 21:
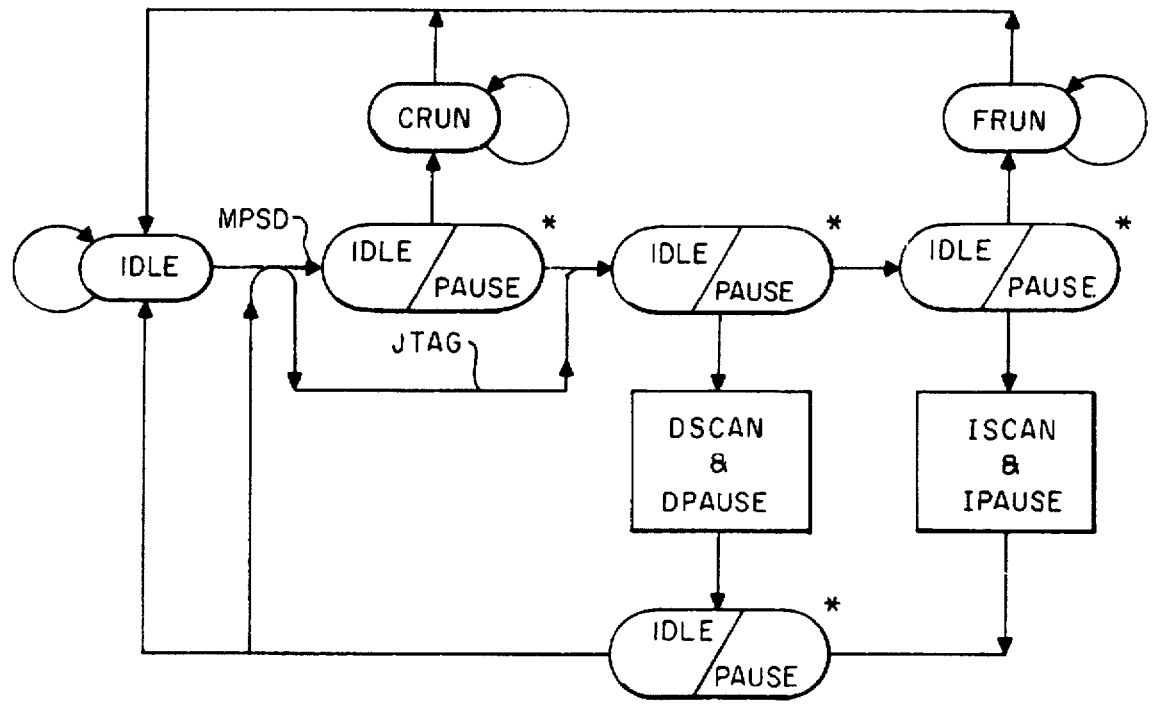
FIG. 21 is a superset state transition diagram combining the features of the state transition diagrams of FIGS. 19 and 20.

Sequence generator 2213 includes logic circuitry to accept a desired state on the state diagram of FIG. 21 from command interpreter 2205 and generate a corresponding protocol for the control lines TMS1-0 and the serial scan line TD0. Further circuitry sends the protocol signals and associated data to UUT. Sequence acceptor 2215 receives data from the UUT. Pin TRST implements a test reset signal. Two TMS pins TMS1 and TMS0 allow connection in two paralleled serial chains for JTAG compatible targets or to one MPSD target.

A shifter buffer 2231 provides a storage area and a parallel-to-serial interface for both data to be transmitted (write data) and data received (read data) via the scan path TDO and TDI.

An event block 2233 receives any interrupt signals from the UUT on pins EVENT 3-0 to interrupt operations of SBM 101 and instruct SBM 101 to modify execution during EXECUTE commands (also called Run Commands). The EVENT pins are reused as additional TMS outputs for several targets by circuitry in sequence generator 2213.

Figure 17:
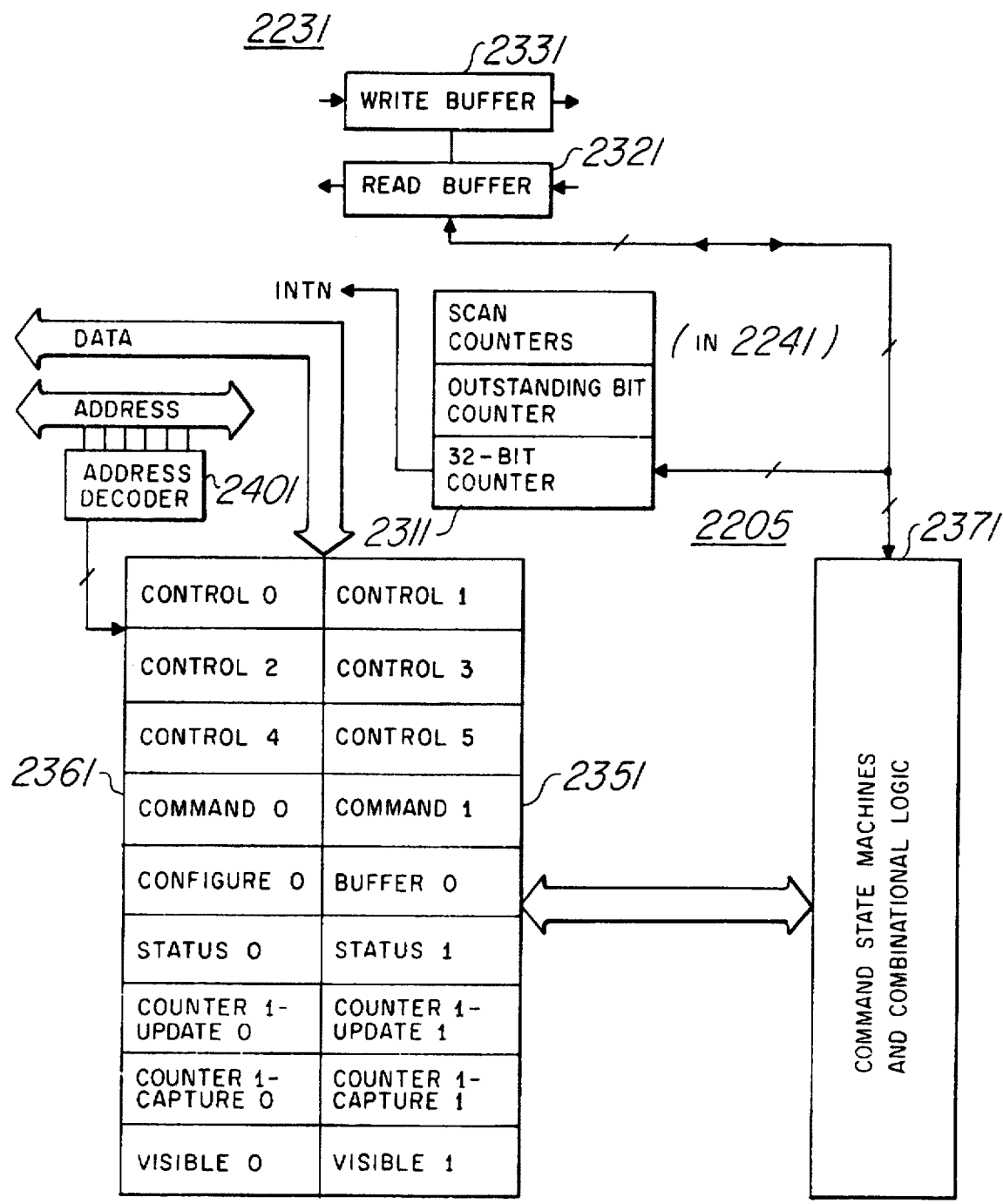
FIG. 17 is a block diagram of registers, counters and circuitry of part of the scan bus master of FIG. 16.

A counter block 2241 connected to command interpreter 2205 includes a 32-bit counter 2311 of FIG. 17 that counts scanned bits in scan operations and counts clock cycles during Run tests. The 32-bit counter advantageously eliminates any need for a software counter during scan operations and Run tests.

An interrupt interface 2251 in SBM 101 activates an interrupt to host 1101 when a selected command status flag (e.g., end-of-command, zero-count) is set.

A test block 2253 has five circuits that provide the testability features to test the SBM 101 itself. A first circuit selects any of the state machines in SBM 101 and provides their state to be read out to host 1101. A second circuit connects pin TDO to pin TDI to test interface 2211, scan commands, and operate the shifter/buffer 2231 independently of the UUT. A third circuit shortens the 32 bit counter 2311 in counter block 2241 to 24, 16 or 8 bits and tests that 32 bit counter during EXECUTE commands. A fourth circuit provides a continuous update to host 1101 while reading counter and status values, avoiding any need for update commands. A fifth circuit disables a protect condition of scan data in shifter/buffer 2231 while testing the operations of reading and writing of the scan data FIFO in shifter/buffer 2231.

The host 1101 acts a a primary controller for applying test instructions and data and monitoring results. The SBM 101 improves the interface between the host 1101 and the scan path UUT(s) by generating and issuing scan protocols and formatting serial data. In this way host processor software size and complexity are reduced and scan test throughput is increased. These advantages involve three main categories or areas: the processor interface, the controller commands, and scan throughput.

The interface 2203 provides separate address lines (5 lines) and data lines (16 bits).

In some cases the test clock TCK is advantageously synchronized with the host processor clock to ensure accurate test execution, so that the parallel bits of a host command do not change during a test clock TCK edge and possibly produce unpredictable results.

Write operations are suitably synchronized during or between write pulses. Synchronizing during write pulses may force host 1101 to issue wait states or lengthen a write pulse duration. Longer pulses imply lower frequency; however, synchronizing between write pulses rather than during them limits only host write cycle frequency, not the duration of the write pulse. therefore, write synchronization takes place between write pulses. Address and data are latched with the write enable, and within 2.5 test clock cycles, the write operation is completed. by alternating between two sets of internal SBM 101 write strobe logic, SBM 101 responds to writes every 1.5 test clock cycles. After establishing the synchronization writes, commands are issued by host 1101 to SBM 101 with synchronized timing.

In read synchronization, circuitry in SBM 101 supports an Update command that loads all status register and counter register data into read latches in SBM 101 clocked by test clock TCK. Between Update commands, the contents of the read latches does not change, thereby avoiding any change in the stored status or counter data during a host 1101 initiated read operation. The host 1101 issues the Update command every time new status or counter data is to be read. For testing the SBM 101 or for single bit status requests, read latches are updated continuously without the Update command.

Turning to the subject of scan throughput, the layout of a target device (which SBM 101 scans) has its internal scan path connected for shortest length on the microscopic circuitry on-chip. Consequently, some target device registers are scanned out in MSB-to-LSB order and other registers are scanned in reverse order LSB-to-MSB. Shifter/buffer 2231 in response to a shift order command from host 1101 advantageously reverses the bits in hardware according to the order or direction selected by host 1101.

Scan throughput is also improved when the number of bits to be scanned is not a multiple of the word length of the host 1101 bus (e.g. 16 bits). During a right shift, the fractional word is last and needs to be LSB-aligned for a read data scan. For a left shift, the fractional word comes first, and should be MSB-aligned for a write data scan. A barrel shifter in shifter/buffer 2231 of the SBM 101 automatically adjusts fractional words and expends no extra clock cycles.

Considering throughput under continuous scan, buffering of shifter data in shifter/buffer 2231 allows host 1101 to access scan data by read or write while the SBM 101 shifter continues scanning. In continuous scan, the targets do not enter a Pause state of FIG. 21 until the end of a scan. With buffering, scan does not have to be stopped to allow the host to access the data. Thus, buffering speeds up scan. If the clock rate of test clock TCK substantially exceeds that of the host 1101, additional buffers are suitably included and host software accesses multiple words of the buffer. In a preferred embodiment of SBM 101, the scan data is double-buffered in shifter/buffer 2231 for reading and writing. With these transmit and receive buffers, one software cycle of host 1101 is suitably used to access two 16-bit words in shifter/buffer 2231 rather than only one word. The two-word depth also simplifies exchanging scan data with a 32-bit host 1101.

Powerful hardware commands implemented in SBM 101 command interpreter 2205 increase efficiency of scan and test execution. The command set simplifies software which is loaded and executed in host 1101. Also, the host software is easier to write and debug since the possibility of error is reduced. Error minimization is important since an error in a single bit invalidates data from an entire scan path.

Separate state machines in sequence generator 2213 and sequence acceptor 2215 advantageously permit SBM 101 to operate with time delays of zero, one or more clock periods between their output TDO and input TDI signals that are due to cable delays, for example.

The JTAG and MPSD standards specify signals (TMS for JTAG and C1, C0, TDO for MPSD) that indicate what is to happen on both the data in (TDI) and Data out (TDO) and other output pins of the target device in the current clock cycle. The SBM 101 advantageously generates these control signals and uses the other pins appropriately.

Relative to the wavelength of the test clock signal used by the controller SBM 101 and the target device 11, there may be an electrically significant distance between the two, and other devices that switch and buffer the signals between the two. Both of these situations add delays that can cause timing problems. Signals may not be able to pass between the controller and target in the required single clock cycle and still meet the setup and hold time requirements of the controller and target.

To solve this problem one or more sets of continuously clocked sets of flip-flops 2951 and 2953 are inserted in the out and back signals to re-time them to the start of a later clock period. The out and back signal path through these flip-flops is referred to as the cable and is described in connection with FIG. 27. As a result:

1. All signals meet the setup and hold time requirements.
2. The signals at the target indicate what is to happen on its data in and data out pins in the current clock cycle.
3. The timing of the output and input signals at the controller has been separated by one or more whole clock periods.

By adding the flip-flops the signals at the targets will meet the JTAG or MPSD standard. But the signals at the controller now indicate what is happening on its data out pin in the current clock period and what is expected to happen N clock periods later on its data in and other input pins. The return signals are N clock periods in error. N is the sum of the delays caused by the flip-flops inserted in the out and return signal paths. N is a variable that depends on the particular use of the controller.

The controller comprehends the delay through the cable by generating one specific signal such as TMS. that is sent via the cable to the target and returned via the cable to the controller. This signal may already be required by the target or may be an extra signal. The definition this signal (described as the "compensation signal") is such that the sequence of its current and previous values indicates what is happening during the current clock cycle (data being scanned, pause in scanning, previously scanned command to the target being executed, halt in execution).

When the compensation signal is returned to the controller, it has undergone the same delay as the other signals returned to the controller. When decoded by the controller, it accurately indicates what the other signals to controller represent. This signal is thus a basic feature that allows the sending and receiving of signals to be decoupled and allows the controller to operate with the delay of zero if no cable is used, and one or more clock periods if cable used.

The controller does not have to be explicitly told what the delay through the cable is at any time, even if the controller is used with no cable or different cables in various situations as the timing of the compensation signal will match the situation.

With JTAG targets, the operation of the scan bus is described by a state diagram that specifies a signal (TMS) that is the targets' control signal and can be used as the compensation signal. The controller implements this state diagram and generates the control signal.

With MPSD targets, there is no pre-defined state diagram to describe the operation of the scan bus. There is no specific single signal that can be used as the compensation signal. The controller SBM 101 advantageously implements a state diagram that allows a single extra signal (also called TMS) to describe what is happening on the scan bus. This extra signal is not used by the target.

Both JTAG and MPSD targets each contain two sets of shift registers for control and data. Each of these sets of shift registers contain one or more strings of data that the controller SBM 101 is used to access independently of each other. For example, the target may contain three strings and the controller may be used to bypass the first string, write a new value to the second string and read the current value of the third.

The JTAG and MPSD standards assume that the inputting and outputting of data at the target happens simultaneously.

So when a cable is used, the functions of bypassing, writing and reading strings in the target are not trivial. For example, if the controller SBM 101 wishes to bypass or read a string then data received from the target must be returned to it unaltered. But if the cable is N bits long, then N bits of data must be sent to the target before any is returned.

This problem is solved by the controller containing a first-in, first-out buffer (referred to as a "FIFO") that is M bits long, between its data out and data in pins. The FIFO is regarded as an extension of the targets' scan path and has associated with it an extra M bit long string (whose value is not important).

The controller must be aware of the difference in the number of bits sent and received (referred to as the number of "outstanding bits"). If the number of outstanding bits reaches a predetermined number M, then the FIFO is empty and can no longer send data. If the number of outstanding bits is zero, then all the data sent has been received.

The addition of this FIFO means that when the controller wishes to bypass or read strings in the target, it is able to send up to M bits of data from the FIFO before receiving delayed data from the target. If the cable is M bits or less long, then the controller may bypass or read data continuously. If the cable is over M bits long, the controller will have to pause at times to wait for more data to be received and fill the FIFO.

The controller may also pause at any time if it is temporarily unable to continue reading or writing the FIFO. When this occurs, the data in the cable will be returned to the controller and fill up the FIFO.

Operation of the controller when scanning data uses the following rules:

1. Do not start a scan operation (bypass, read or write) unless the number of outstanding bits is zero (the cable is empty and the FIFO is full).

2. Pause during a scan operation whenever the number of outstanding bits is M and data is not being returned (the cable bigger than the FIFO so N is greater than M, the FIFO has temporarily emptied).

3. Do not consider a scan operation finished unless the number of outstanding bits has become zero (the cable has emptied and the FIFO has filled).

Both the JTAG and MPSD targets allow the controller SBM 101 to scan data into them, data that represent commands to be executed later. The controller may then signal to the target that it is to start or restart executing the command, and later signal that it is to pause or stop executing the command.

With JTAG targets, the controller SBM 101 uses the compensation signal to indicate if the target is running a command or not. With MPSD targets, the controller uses both the compensation signal and the additional done signal output of the target's SCANOUT pin TDO to indicate if the target has halted running a command due to some event.

The controller SBM 101 may be used to keep a count of the number of clock periods that have passed after a command has started running up until some indicated event occurs in the target (referred to as benchmarking). The controller is able to do this via the cable 1103 by counting the number of clock periods from the start of the returned compensation signal's indicating command execution until the occurrence of a returned signal's indicating the event has occurred. This method provides an accurate benchmark count without errors due to the delay of the cable.

Operation of the controller when the target is running commands uses the following rules:

1. Do not start or restart a run operation unless the returned signals indicate that the target is not already running a command.

2. Do not consider a run operation paused or ended until the returned signals indicate that the target has paused or ended running a command.

Overall this means that the controller SBM 101 does not allow more than one contiguous block of run states to be in the cable at any time. If this rule is not observed, the difficulty of keeping track of what is happening in the cable and target is increased.

The SBM 101 provides an interface that allows a microprocessor to communicate serially to devices incorporating a testability interface as shown in FIG. 2. When SBM 101 receives instruction and data input from host 1101, SBM 101 generates a protocol to shift data through the devices 11 on the serial scan path.

For example, in FIG. 49 of the incorporated applications as improved herein in FIG. 16, SBM 101 is connected to host microprocessor 1101 via address, data, control and interrupt lines. Also, SBM 101 is connected to integrated circuits IC1, IC2, IC3 and IC4 (shown as a GSP, ASIC, microprocessor and DSP in said FIG. 49) serially connected in a scan path via lines TDI, TDO, TCK, TMS, EMU0 and EMU1.

In operation SBM 101 receives instructions from the host 1101 or 300 via Write operations. Each instruction written into SBM 101 sets up a desired scan or test operation to be performed. If SBM 101 is instructed to perform a scan operation, host 1101 writes parallel data into SBM 101. The parallel data is serialized by SBM 101 and shifted out to the integrated circuits IC1–IC4 on the scan path. As data is being shifted into IC1–IC4 from the TDO output of SBM 101, data from the TDO output of the ICs is shifted into the SBM 101 serial input TDI. The serial data shifted into SBM 101 is transferred into host 1101 during a Read operation thereof. During the scan operation, the SBM 101 generates a special appropriate protocol on the TMS line to cause data to shift through the ICs on the scan path.

During scan operations, host 1101 (or 300) determines whether SBM 101 is ready for a scan data Read or Write operation by inspecting internal status signals of SBM 101 via a Read operation. The process of performing a Read operation to retrieve data that has been shifted into the SBM 101 from the scan path, followed by a Write operation to load new data to be shifted into the scan path, is repeated until the scan operation is complete.

In addition to scan instructions, SBM 101 includes instructions which facilitate the testing of the ICs in the scan path. Internal control circuitry in the SBM 101 activates test operations for a predetermined number of TCK clock cycles. During test, SBM 101 sends an interrupt signal back to the host 1101 (or 300) indicative of operational status.

In FIG. 16, SBM 101 controls the operation of a scan test path by sensing input from host computer 1101 and generating proper signals to interface with target device(s) such as ICs IC1–IC4. Each target device has its scan controller 1149 electronically moved from any stable state to another stable state, loaded with instructions, and resulting test data scanned out for input to host computer 1101 by Read instructions from host 1101.

Four EVENT pins are provided to allow real-time interaction between SBM 101 and its target IC. The EVENT pins are configured to generate interrupt requests when a user-defined condition is present.

In FIG. 17, 32 bit counter 2311 in counter block 2241 of FIG. 16 is preset to count and thereby determine when a predetermined number of clock cycles or instruction executions have occurred, and is suitably programmed to set an interrupt flag when counter 2311 reaches a count of zero.

Two 16-bit serial buffers (read and write) 2321 and 2331 are provided to implement read and write operations initiated by host computer 1101.

In FIG. 18, the signal pins of SBM 101 in its semiconductor chip carrier are suitably categorized as host interface pins and target interface pins.

Among the host interface pins, DATA 15-0 provide a 16 bit parallel connection between the host computer 1101 and the SBM 101. Information is written into and read from the registers via the DATA 15-0 pins. A set of five address pins ADRS4-0 receive parallel digital address signals from host computer 1101 to select which individually addressable register in SBM 101 is written or read. An active-high read strobe line RDN is used for reading data from a selected register. An active-high write strobe line WRN is used in writing data to a selected register. An active-high to a reset pin TOFF asynchronously resets the circuitry of SBM 101. Interrupt line INTN carries an interrupt signal from SBM 101 to host 1101.

The target interface pins include two serial input pins TDI1 and TDI0 for shifting data into the SBM 101. A test data output pin TDO is a serial output for SBM 101 and is the beginning of a primary scan path. A test reset output pin TRST is also provided. Test mode select pins TMS1 and TMS0 operate the target(s) and direct the state machine of each target. The "mode source" is an input recognized by SBM 101 as its TMS input. A test clock input pin TCKI receives test clock signals to which the SBM 101 circuitry is synchronous. A test clock output pin TCKO supplies a buffered version of the test clock signal received at pin TCKI for distribution to each target chip. The four EVENT pins EVENT3-0 are event qualification pins which are user-configurable to set interrupt flags based on external events or to accept input from a selected target. These pins are further used as additional TMS outputs TMS2-5.

Returning to FIG. 17, SBM 101 receives commands from host 1101, herein called Major Commands, via a Command1 Register 2351 which are interpreted to send signals to the target(s). Major Commands from host 1101 tell the SBM 101 to cause a target chip to perform a respective one of a set of operations such as scan, change states, or execute an instruction that SBM 101 has loaded into the target chip. Major commands typically take many clock cycles to complete and involve interface communication of SBM 101 with a particular target.

Host 1101 also supplies Minor Commands to Command0 Register 2361 of SBM 101. Minor Commands instruct circuitry 2371 to perform a function within itself, such as RESET, CAPTURE or CLEAR. Major Commands are often preceded by host 1101 loading a series of appropriate Minor Commands. Minor Commands typically involve few clock cycles for their execution.

Sequence acceptor 2215 of FIG. 16 receives inputs from pins TDI1-0, mode source TMS and delayed mode TMSR (or directly from a variable delay shift register 1411), and decodes them to determine which state is being returned from the target. For example, one embodiment accommodates delays to target of up to 31 clock cycles.

Sequence generator 2213 generates signals on pins TDO, TMS1-0 and TRST outputs to control the state of the target chip scan controller 1151.

In the next paragraph, an example of register address decoding by a decoder 2401 of FIG. 17 in SBM 101 names various registers in SBM 101 which are accessible by host 1101. The term "null register" signifies unused addresses not implemented by registers in the circuitry of one embodiment, and thus data is not written into nor read from a null register. Addresses are signified by a five-bit binary number ADR (hereinafter discussed in decimal) represented by the states of lines ADRS4-0, with ADRS4 most significant. Values of ADR from 0 to 5 respectively address six control registers Control0 through Control5. Values 8, 9 and 10 of ADR address registers Command0, Command1 and Configure0. Value 12 addresses Buffer0 register. Values 14 and 15 address Status0 and Status1 registers. Values 16-19 address registers Counter1Update0, Counter1Update1, Counter1Capture0, and Counter1Capture1. All other addresses are Null register.

The register bits for each addressable register are described in the Appendix.

Major Commands include STATE, EXECUTE and SCAN. A Major Command is initiated by host 1101 loading the register Command0 with a minor command INITIAL0 with an appropriate minor opcode bit set. The type of Major Command is established by four Major Opcode 15-12 bits in the register Command1. 0001 is STATE; 0010 is EXECUTE; 0011 is SCAN.

The STATE Command changes the scan interface 1149 of the target chip from its current stable state to any other stable state. For example, a STATE Command can be used to cause TMS signals to be sent to TAP controller 1151 in the target chip to go from the DR SHIFT state of FIG. 19 to the IDLE state. The STATE command sets an End Interrupt Flag in register Status0 when it is finished, and asserts an interrupt if the End Interrupt Enable bit in register Control0 is high.

The STATE command steps the target scan interface through its state diagram from a current state to a requested state. If the current and requested states of the target are respectively the Test Logic/Reset and Idle states then no action occurs. If the current and requested states of the target are respectively a Pause and a Shift state, the target leaves its current Pause state, passes through Capture and Update states (without passing through the Idle state), and goes to its requested state. When the STATE command finishes, a Finish flag F is set.

The STATE command is selected by Major Opcode 15-11 bits=0001 in register Command1. The Major Opcode 11-4 bits are ignored. The Major Opcode3 bit selects an end option-wherein zero designates that the command ends when the state is being sent and received, and one designates that the command ends when the state is being sent. The Major Opcode2-0 bits select an end state which is to be the state of the target scan interface after the command ends. 000 and 001 are both Test logic/Reset in JTAG (FRUN and CRUN in MPSD). 010 and 011 are both Idle. 100 and 101 are DR-Shift and IR-Shift states respectively. 110 and 111 are DR-Pause and IR-Pause states respectively.

The EXECUTE command causes one or more target chips to execute instructions that have been shifted into the instruction register 1153 of each such target chip. The EXECUTE command has several codes that correspond to different target chip scan interface states.

The execution of the target's instruction occurs when the command and the target interface are awake and in the execute state. This terminology is defined more fully in connection with FIGS. 23-26. There are several events that can change the state of the EXECUTE command-Counter1 counting states of events at EVENT pins, events at EVENT pins, and the SET0 and INITIAL0 minor commands. The state changes are controlled by four request flags 2923-suspend, end, resume, and begin in FIG. 23. The request flags are set in the control registers. After the command is able to respond to the request, the appropriate flag is cleared and the corresponding interrupt bit is set.

The EXECUTE command is initiated by a signal from an EVENT pin, a SET0 minor command, or an INITIAL0 minor command. The EXECUTE command responds to a begin request only if it is dead. When it responds, the target scan interface transitions to the end, asleep, or execute state as selected by Major Opcode 5-4 bits in register Command1.

The EXECUTE command may be ended by a signal on an EVENT pin, a SET0 minor command, or by Counter1 decrementing past zero. If the EXECUTE command is asleep or awake, then the circuitry responds to an end request. The ending state of the target is selected by Major Opcode 2-0 bits, and the Finish Interrupt flag is set. The circuitry is configured so that an End request has priority over a suspend or resume request.

The EXECUTE command is suspended by a signal from an EVENT pin, a SET0 minor command, or by Counter1 decrementing past zero. If the EXECUTE command is awake (executing), then the circuitry is enabled to respond to a Suspend request when one occurs. The Major Opcode 3 bit determines the target state to which the target interface is transitioned when the EXECUTE command is in the asleep state in SBM 101. When in the Suspend state, Counter1 is disabled.

A Resume request is initated by a signal from an EVENT pin or by a SET0 command. If the EXECUTE command is asleep, the circuitry is enabled to respond to a Resume request when one occurs. The Major Opcode 3 bit also determines the resume state of the Execute command. After the EXECUTE command is resumed, Counter1 is operable.

An Alive status bit is asserted when the command begins and is negated when it finishes, whereupon the Finish flag is set.

In register Command1, Major Opcode 7 selects a request flag clear option wherein zero signifies that Suspend and Resume requests are cleared as each are acknowledged. One signifies that Suspend and Resume requests are cleared if either are acknowledged.

Major Opcode 6 bit selects an EXECUTE Command option wherein zero signifies that the command does not suspend itself, and one signifies that the command suspends itself after one execute state is sent. Outstanding suspend requests are cleared without setting the suspend interrupt flag.

Major Opcode 5-4 bits select Begin options wherein 00 signifies that the command executes when it begins, 01 signifies that the command is asleep when it begins, and 1x signifies that the command neither executes (Awake) or sleeps (Asleep state) when it begins, but instead ends immediately. This is similar to a STATE command but may be begun by a signal on an EVENT pin or by SET0 minor command.

Major Opcode 3 bit selects the awake and asleep states wherein zero signifies use of the Idle and Data Pause states in the state transition diagram of FIG. 21, and one signifies use of Idle and Instruction Pause states.

The Major Opcode2-0 bits select the end state and the bit codes are same as in the STATE command hereinabove.

The EXECUTE command with different bits set can be used to create a whole set of Run Commands. For example, the commands can be used to apply a single pattern (Run For One Clock Cycle) or to single step (Run For One Clock Cycle and Repeat n Times). It is contemplated that the skilled worker also use the Run Commands to control tests that Run for n Clock Cycles.

In the incorporated patent applications, an analysis block in a target chip UUT (also called device 11 in the incorporated applications) generates signals on lines EMU1 and EMU0. These lines EMU1 and EMU0 are suitably connected to a corresponding pair of pins among the four SBM 101 EVENT pins EVENT3-0. SBM 101 advantageously uses these signals as interrupts to control tests when software in host 1101 directs. These interrupts are keyed off UUT status, such as a pipeline being full or empty, or completion of a predetermined number of instructions, completion of a predetermined number of clock cycles, trace stack full or any other condition as described at length in the incorporated patent applications. Thus, the SBM 101 Run Commands monitor and respond to these inputs from the UUT. UUT outputs or Run-Modify commands from the host 1101 can pause, execute, or end a test. During normal execution of Run for One Clock and Repeat n Times, the test can be restarted by an input from the UUT or by the Run-Modify Command each time the UUT pauses. If a Run for n Clocks is started using the maximum count of 2 to the 32 power, over 7 minutes are consumed to complete the test at 10 MHz. If a problem be discovered during this long test, the user has three options: 1) wait for the test to complete, 2) reset the SBM 101 using a RESET Minor Command from Host 1101, or 3) send a Run-Modify command to end the test gracefully.

The SCAN command uses the Instruction Shift state or Data Shift state to circulate data within the target chip and transfer data between the SBM 101 and the target chip. During these operations the SBM 101 uses the serial read and write buffers 2321 and 2331 of FIG. 17. The SCAN command is affected by the SET0 minor command only.

The target chip 11 registers are treated as a plurality of modules each containing a serial string of data in SRLs as described in said coassigned incorporated patent applications TI-14143 and 14146. Each string is accessed by executing one or more SCAN commands. The string length is defined as one plus the value of the Counter Update register, and there is a range of from one to 2-to-the-32nd-power bits per command.

Figure 25:
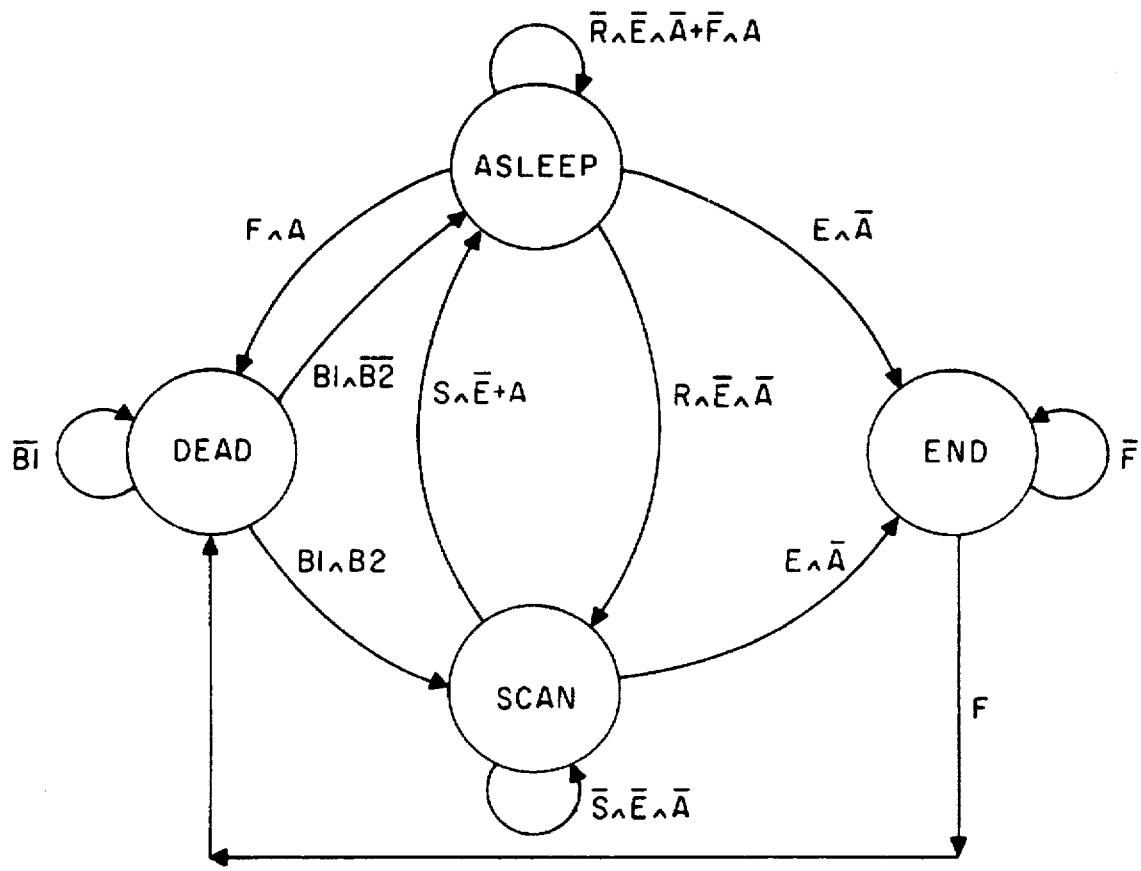
FIG. 25 is a state transition diagram of a SCAN command state machine of the command interpreter of FIG. 23.

When the Major Opcode 5-4 bits select the serial write buffer and/or serial read buffer, the SCAN command of FIG. 25 goes to sleep if the host 1101 does not load data into the serial write buffer often enough to keep it from emptying, or does not store data from the serial read buffer often enough to keep it from filling. The state of the serial buffers is indicated by bits in the Status1 register. When the SCAN command is finished executing, the Finish flag status bit is set and an interrupt is asserted if enabled.

The SCAN command is selected by Major Opcode 15-12 bits 0011. The Major Opcode 11-6 bits are ignored. The Major Opcode 5 bit selects a Send Data option wherein zero signifies to send recirculate data (the serial write buffer is unused), and one signifies to send overwrite data (the serial write buffer is used). The Major Opcode 4 bit selects the receive data option wherein zero signifies to ignore receive data (the serial read buffer is unused) and one signifies to read receive data (the serial read buffer is used). The Major Opcode3 bit selects the Scan Awake and Asleep states wherein zero signifies to use the Data Shift and Data Pause states, and one signifies to use the Instruction Shift and Instruction Pause states. The Major Opcode 2-0 bits select the end state and the three bit codes for these bits are the same as for the EXECUTE and the SCAN commands.

The various permutations of setting bits for the SCAN command constitute a whole set of Scan Commands, some of which are described from an operational point view next. Scan commands serve at least two functions. They allow the host processor 1101 to write new data to the scan path and to read data from the scan path. One command, the SBM Circulate and Alter Scan Command, which performs both functions, is most effective for continuously applying patterns and reading results. The Circulate and Alter Scan Command repetitively scans in a word from target device UUT, waits for the host 1101 to read the old data from UUT now held in SBM 101 (results of last pattern), and then waits for the host 1101 to write back a new word (next pattern to apply to UUT). The cycle ends when all bits in the pattern have been scanned.

The Write and Circulate command continuously scans out data received from the host 1101 for a specified scan length. this command reduces software overhead in host 1101 by not requiring the host 1101 to read data. Examples of test procedures needing this feature are downloading memory from host 1101 to UUT, or setting up a built-in self test (BIST) for UUT.

Conversely, the Circulate and Read Scan command continuously scans in data to be read by host 1101 without expecting new data from host 1101. This command may be used to upload from UUT to host memory or read results from a BISt.

Further, in the case that many devices UUT are not included in a particular test, the Recirculate Scan command enables bypassing them (that is, scanning past the bypassed devices without reading or writing).

The Minor Commands perform various clear and initialization functions. They are selected by the Minor Opcode 15-12 in register Commando as follows. 0000 is INITIAL0. 0010 is CLEAR0. 0011 is CLEAR1. 0100 is SET0. 0110 is CAPTURE. 0111 is RESET.

Minor Opcode 7-0 bits respectively select high active options for each Minor Command.

The INITIAL0 command initializes various functions in SBM 101, but does not set or clear any status bits when it ends. The INITIAL0 options are bit 5—Begin a major command, 4—Operate Counter1 once only, 3—Load Counter1 from Counter1 Update registers, 2—Clear all request flags, 1—Clear all interrupt flags, 0—Empty the serial read and serial write buffers.

The CLEAR0 command provides an interrupt flag clearing function for the lower byte (bits 7-0) of the Status0 register. This command does not set or clear any status bits when it ends. Minor Opcode 7-0 bits when respectively high signify to clear the interrupt flag in bit 7-0 respectively.

The CLEAR1 command provides an analogous interrupt flag clearing function for the upper byte (bits 15-8) of the Status0 register.

The SET0 command requests an EXECUTE command to change its operating state through an End, Resume, Suspend, or Begin request. This command does not set or clear any status bits when it ends. The EXECUTE command alters the appropriate Suspend, End, Resume, or Begin interrupt flag 2923 when it responds to the request. Minor Opcode bits 3-0 are high active to respectively specify Begin, Resume, End and Suspend.

The CAPTURE command provides a method for capturing the internal flags and signals of the SBM 101. The results of the capture are stored in the Status and Counter Capture registers for inspection by the host 1101. This command does not set or clear any status bits when it ends. The respective options for CAPTURE are established by three high-active bits in Command0 Minor Opcodes 2-0, wherein bit 2 signifies to capture the value of Counter1 in the Counter1 Capture register, bit 1 signifies to capture the value of internal signals in the Status1 register, and bit 0 signifies to capture the value of internal flags in the Status0 register.

The RESET command software resets the SBM 101 and does set or clear any status bits when it ends. None of the Minor Opcode 7-0 bits are used to establish any options, although this is contemplated in other embodiments. The following operations occur when the RESET command is executed. The host interface output INTN goes to logic one and the target interface outputs TMS1-0, TDO and TRS go to a high-impedance state. All commands are aborted. The shifter 2231 functions are completed and serial buffers are emptied. Counter1 and the Counter1 Update and the Counter1 Capture registers are filled with zeroes. The Control, Configure, and Command registers are filled with zeroes. The internal flags and internal signals are all set to a logic zero and the Status registers are filled with zeroes.

In FIG. 16, scan interface 2211 is a sequencer block with its sequencer generator 2213 and sequence acceptor 2215. Advantageously, the same interface 2211 controls both MPSD and JTAG (IEEE P1149) target devices by implementing the sequence generator 2213 and sequence acceptor as state machines that are supersets of both MPSD and JTAG state diagrams.

In JTAG format (for Texas Instruments 320C50 fixed digital signal processor chip for example) the state diagrams are exactly JTAG compatible with six stable states and eight temporary states. the IDLE state represents the combined JTAG Run-Test/IDLE state. In JTAG format a pair of TMS signals and a TDO signal are selected to be output on the pins TMS1-0 and TDO.

In MPSD format (for use with Texas Instruments 320C30 floating point digital signal processor chip for example) the state diagram is a JTAG superset with one extra stable state and two extra temporary states. The existing IDLE and extra Controlled Run state represent the separate MPSD and Halt Controlled Run states respectively. In MPSD format EC1, EC0 and ED0 signals are selected to be output on the SBM 101 pins TMS1, TMS and TDO respectively. A selector circuit in the interface determines which signals to send in response to the state machine in sequence generator 2213. In stable states the appropriate MPSD code is output. In temporary states the halt or pause code is output as appropriate. In MPSD format a superset TMS signal may also be output for test purposes on command from host 1101.

The choice of EC1/TMS1, EC0/TMS0, ED0/TDO as shared pins is important as the reset condition of these pins is preferably indistinguishable to JTAG and MPSD in this embodiment.

The state machines (FIG. 23) for the STATE, SCAN and EXECUTE commands use bits 2-0 of the Command1 register (written to by the host 1101) to select the final state in the state transition diagram when the command ends. The interpretation of most of these codes is the same in JTAG and MPSD format, although a few codes are interpreted differently to account for the extra stable state in MPSD.

The state machine 2901 for the SCAN command uses bit 4 of the Command1 register (written to by the host 1101) to select the Scan state (Instruction Scan or Data Scan). This is equally valid for MPSD and JTAG formats.

The state machine 2905 for the EXECUTE command uses bit 4 of the Command1 register (written to by the host 1101) to select the EXECUTE state. This is interpreted differently in MPSD and JTAG formats.

Turning now to the subject of time delay compensation, or cable compensation, SBM 101 in a first embodiment uses the TMSR pin to input a TMS signal that has undergone the same delay caused by cable flip-flops as the returned data and other signals. In a second embodiment, the TMSR pin is omitted. Instead, a delayed signal is produced not by forward and back traverse of a cable 1103, but by an internal shift register 1411 of selectively variable length of zero to 31 bits. The length of the internal shift register 1411 is set by host 1101 command to match the cable length (or scan signal transmission delay in general) by writing to a register Link Delay bits 4-0 in a Control register.

When the second embodiment is in JTAG format, this variable delay register 1411 carries the TMS signal and TMS1-0 and TDO are output. In MPSD format, register 1411 carries a superset TMS signal and EC1, EC0 and ED0 are output. Note that the superset state diagram of FIG. 21 used by sequence generator 2213 and sequence acceptor 2215 is configured to contain an extra CRUN state (RUN to accommodate MPSD, and all state changes are coded onto the one superset TMS signal.

Remarkably, when the second embodiment using the shift register 1411 is in either the JTAG or MPSD format, the same cable compensation method is used.

When SBM 101 is connected to a single target device the TMSR pin used in a first embodiment has the benfeit that the host software does not have to include data defining the length or time delay of the cable or other signal transmission line. When the SBM 101 is connected to several target devices directly (or indirectly via a fanout device) the SBM 101 first embodiment would utilize several TMSR pins. Advantageously, the second embodiment with register 1411 requires no TMSR, and instead software commands to the Link Delay4-0 control bits define the delays to each target in turn as each target is selected.

Figure 19:
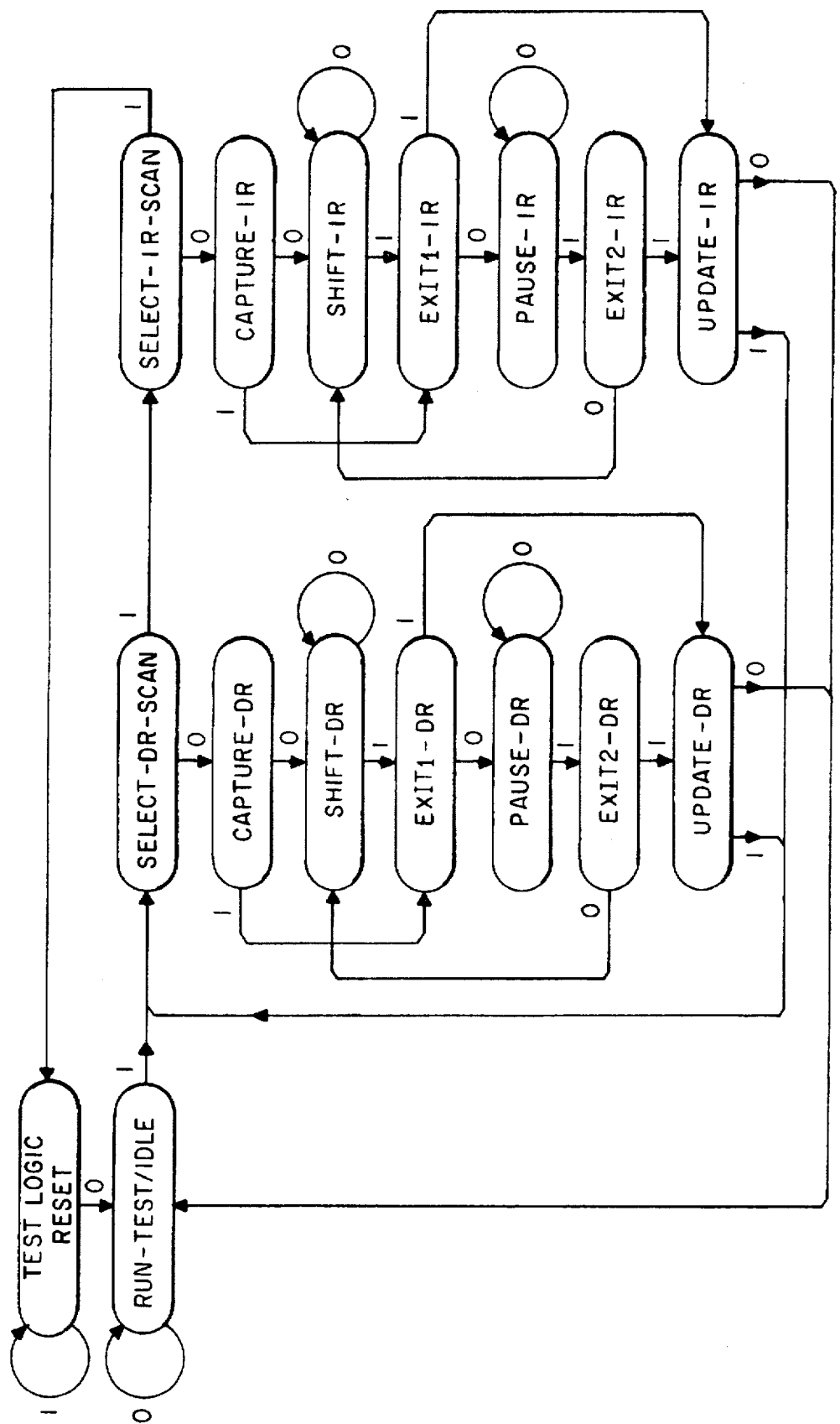
FIG. 19 is a state transition diagram for a serial scan interface controller for use in a target device.
Figure 20:
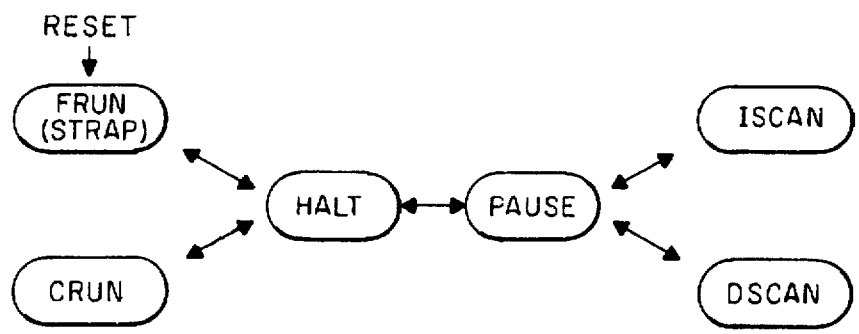
FIG. 20 is a state transition diagram imposed on the MPSD codes of the MPSD methodology.
Figure 22:
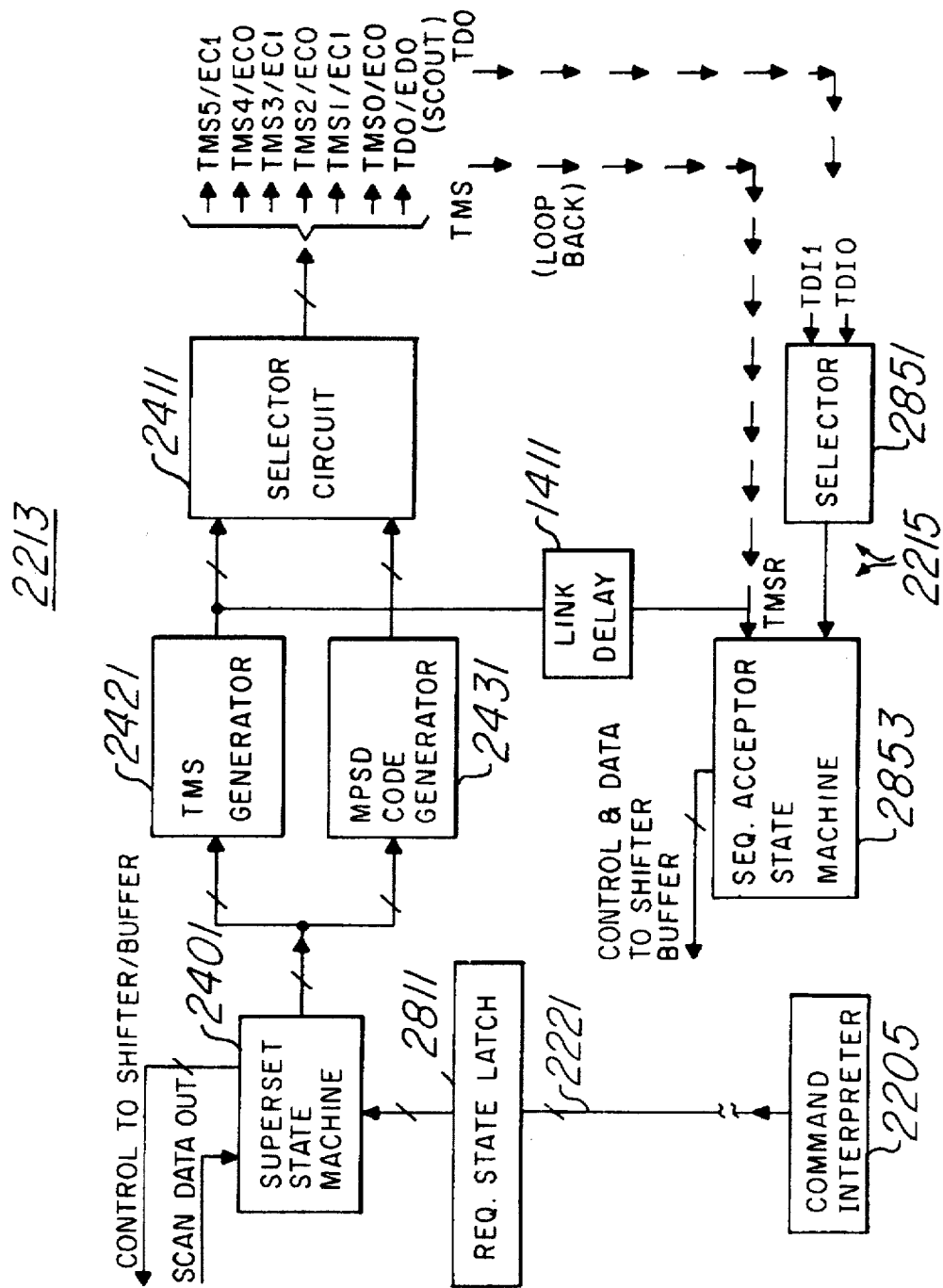
FIG. 22 is a block diagram of a sequence generator and a sequence acceptor part of the scan bus master of FIG. 16, both having the superset state transition diagram of FIG. 21.

Sequence generator 2213 thus includes a state machine 2401 of FIG. 22 that is used to generate sequences of control and data signals on TMS1-0, TDO and TRST pins that correspond to transitions to states in the JTAG and MPSD state diagrams of FIGS. 19 and 20. Command block 2205 supplies signals on lines 2221 to sequence generator 2213 as requests for the sequence generator to go to a particular JTAG or MPSD state from a current state, in response to major opcode bits.

The shifter/buffer block 2231 receives signals via lines 2225 from the command block 2205 that it is about to enter a scan state, execute state or any requested state. Block 2231 contains a FIFO shifter and a recirculate multiplexer that are configured as 16 or 32 bits long, and used to receive and recirculate target device data. They send scan data on the TDO pin and receive delayed data on the TDI pin, wherein the delay is due to the use of a cable 1103 or other transmission medium. Parallel data is stored from the FIFO shifter via MSB and LSB string format mask logic and a two-level-deep read buffer.

Serial data is received in shifter/buffer block 2231 by shifting a bit in. Serial data is sent by multiplexing a bit out. The shifter shifts whenever a bit is received. The recirculate multiplexer is driven by a 6-bit Outstanding Bit Counter in the counter block 2241. The latter counter is incremented when a bit is sent, decremented when a bit is received, and maintains its value when neither or both a send or a receive occur.

Shifter/Buffer block 2231 contains a separate 16-input Send multiplexer that is used to send new data. Parallel data is transferred to the Send multiplexer from the two level deep read buffer. The Send multiplexer makes its selection in response to the 4-bit Send LSB Counter in the counter block 2241, the loading of which is controlled to provide MSB and LSB string formatting.

The Write Buffer, Shifter, Read Buffer Mask Logic 1531 and Read Buffer are normally controlled indirectly by the SCAN command. Independently of SCAN commands the write buffer is controllable (can be written to but is not visible), and the read buffer is visible (can be read) but is not controllable in this embodiment. When a Shifter Buffer Test bit SFBFTSTT bit is set the write buffer, shifter and read buffer are connected into a single five word deep FIFO (first-in, first out circuit). The read buffer mask logic remains between the shifter and read buffer with partial word operation enabled. The partial word size and MSB/LSB selection are controlled by the Counter1 Update3-0 bits and a major opcode bit.

Four buffer and one shifter Full flags can be made visible when VSBTST2-0 configure bits are set to 110 by transferring them into a Visible2 register for read by host 1101.

The sequence acceptor 2215 is a state machine used to decode sequences of control and data signals on pins TDI1-0 and the delayed TMS from TMSR (SBM 101 first embodiment) or from variable delay shift register 1411 (SBM 101 second embodiment). Sequence acceptor 2215 sends signals via lines 2223 indicating to command block 2205 what JTAG or MPSD state is being received. For example, sequence acceptor 2215 signals to command block 2205 that the acceptor 2215 is about to enter a Scan state, an Execute state or any requested state in response to major opcode bits.

Advantageously, the second embodiment of SBM 101 is able to control multiple target devices in a star configuration, as in FIG. 12. In an augmented embodiment of SBM 101 several (e.g. six) TMS5-0 outputs are respectively selected by mode control bits Mode Connect5-0 in a register in SBM 101 that can be written into by host 1101 software to select a particular target device.

When a Mode Connect bit is one, the corresponding TMS pin is connected to the mode source in sequence generator 2213 and outputs the TMS signal to the corresponding target device (or scan path) that is selected. In this way the selected target device represented by the particular Mode Connect bit is controlled by SBM 101. When the Mode Connect bit is zero, the TMS pin for the just-mentioned target device is disconnected, and the target device remains in the last stable state reached by TMS signalling from SBM 101 to that target device.

The host 1101 software suitably is programmed to keep track of the current or latest state of each target device. Unselected target devices are called suspended targets. For example, assume that a target device DSP is in state z when SBM 101 switches from DSP to a target GSP which is in previously established state y. In a switching process, host 1101 sends a command to SBM 101 to disconnect from target DSP by changing the Mode Connect bit for target DSP from a one to a zero. Next host 1101 sends a STATE command to switch the scan interface 2211 from state z to state y. Then host 1101 sets another Mode Connect bit for target GSP from a zero to a one to select the target GSP. In this way, the host 1101 connects via SBM 101 to the newly selected target GSP. In this way STATE command is seen to be of especial value for changing the sequencer state without performing any other operation.

Upon completion of a STATE, SCAN, or EXECUTE command involving a cable or transmission medium, the SBM 101 hardware of sequence generator 2213 and sequence acceptor 2215 is configured to assure that the entire transmission medium is in a single stable state determined by identity of the state being sent and the state being returned, so that sequence generator 2213 and sequence acceptor 2215 are in the same state at the end of a command.

In counter block 2241 of FIG. 16, the 32-bit counter 2311 is normally indirectly controlled via EXECUTE or SCAN commands. In the SCAN commands counter 2311 counts the number of scan states, and thus data bits, sent by SBM 101. In EXECUTE commands it counts the number of IDLE states sent or received. Direct control of counter 2311 is provided by three minor command options and three configure bits respectively for causing counter operate, counter update and counter capture. The Minor Command operations cause the commanded operation once per command. When a configure bit is set the controlled operation occurs in every clock cycle while the configure bit is set.

The counter 2311 has three parts. A core part is a 32-bit down counter that sets an interrupt flag Zero1 whenever the counter 2311 has a zero count. An update part is a 32-bit update latch that holds values that are loaded into counter 2311 by a Minor Command or configure bit. The latch optionally loads the core part when the core part holds zero and a control bit is set. A capture part includes a 32-bit capture latch that holds values that are stored from the core part in response to a Minor Command or a configure bit. The update latch is writeable and readable by host 1101 and the capture latch is readable by host 1101.

Two Counter Test CTRTST1-0 control bits are decoded to break the 32 bit counter 2311 into eight bit sections for faster testing. They determine whether a counter decrement signal is routed into byte 0 (normal operation) or bytes 1, 2 or 3. A Zero1 flag is associated with these configure bits to obtain visibility of carry signals for each byte-wide section of the counter 2311.

Three Visibility Test VSBTST2-0 bits are decoded to cause retrieval to a Visible1 register of three counters—an Outstanding Bit Counter, a Send LSB Counter and a Receive LSB Counter.

The Outstanding Bit Counter 251 is a six bit up-down counter that is used during SCAN commands to keep a count of the number of scan states and data bits that have been sent but not yet received. It counts up when a bit is sent only, and down when a bit is received only, and holds its value when both or neither of send and receive occur. The count value in the outstanding bit counter is used to operate the recirculate multiplexer in the shifter/buffer circuit 2231.

The Scan counters in FIG. 17 include a Send LSB Counter and a Receive LSB Counter that are four-bit down counters that are used to keep a count of the number of bits sent and received from each 16-bit word. Their operation takes account of the LSB and MSB string formats and they indicate when partial or whole words are completely sent or received. The count value of the Send LSB Counter is used to operate the Send Multiplexer in the Shifter/Buffer circuit 2231.

The Outstanding Bit Counter, Send LSB Counter and the Receive LSB Counter are normally indirectly controlled via SCAN commands. To provide direct controllability, the Counter Test CTRTST1-0 configure bits select whether the Up and Down controls of the Outstanding Bit Counter are driven by the EVENT1-0 pins and also can assert a clear control signal. Also the CTRTST1-0 bits select whether the operate controls of the Send LSB Counter and the Receive LSB Counter are driven by the levels on the EVENT1-0 pins.

A global block in SBM 101 contains buffers for the pins, and the six internal blocks—Host 2203, Target (serial interface) 2211, Event 2233, Command 2205, Serial (Shifter/Buffer) 2231 and Counter Block 2241.

The global block includes clock distribution logic. The six blocks are initially assigned a single true clock each, named CLKTA0, CLKTB0, . . . CLKTF0. Some blocks also have "false" (complement) clocks. This allows identification of the clock loading for each block. Buffers and inverters are suitably provided to feed clock to the various blocks to balance the electrical loading of the blocks to the clock signals and thus minimize clock skews.

FIG. 19 shows a state transition diagram of an exemplary scan interface for the Texas Instruments 320C50 digital signal processor. This state transition diagram corresponds to FIG. 50A of the incorporated patent applications TI-14141 etc. and is described in detail therein.

Test mode select signal TMS directs the transitions between test bus protocol states. Six of the 16 states of FIG. 19 are stable, meaning they can be maintained indefinitely if TMS does not change, while unstable states change after one clock cycle of the test clock TCK. The six stable states are Test Logic Reset TLR (STRAP), Run-Test/Idle Shift-DR, Pause-DR, Shift-IR, and Pause-IR.

In the Texas Instruments TMS 320C30 digital signal processor, MPSD codes which are shown in Table I of the incorporated patent applications all are apparently independent of one another. At first glance, the MPSD approach and the scan interface diagram of FIG. 19 are completely unlike. However, the present work recognizes that only certain transitions between MPSD codes are really needed, and that a state transition diagram for MPSD can be generated without loss of generality of application of the MPSD approach.

Accordingly, FIG. 20 shows a state diagram generated for MPSD so that only certain transitions between MPSD codes are permitted, and thus omitting to allow a direct transition from every MPSD state to any other MPSD state. Thus in FIG. 20 reset of the system puts the MPSD machine in the Functional Run (Reset or Strap) FRUN state. In the present work, the only permitted direct bidirectional transition from FRUN goes to the MPSD Halt state. The Controlled Run state CRUN is accessible by a bidirectional transition from the Halt State and no other. A transition can also be made from the Halt state to the MPSD PAUSE state. The Pause state is connected by bidirectional transitions to the Instruction Scan state ISCAN and the Data Scan state DSCAN. Transitions back to Pause from ISCAN is IPAUSE. Transition back to Pause from DSCAN is DPAUSE.

On this state of things, a modest degree of analogy begins to emerge between the state transition diagram of FIG. 19 and that of FIG. 20. However, the analogy is incomplete. Accordingly, the present work further recognizes that the states of FIG. 19 and FIG. 20 can be merged analogous to set union in set theory to form a superset of states connected by transitions. A state machine that has this superset of states is then implemented in FIG. 22 as a state machine 2401 of the sequence generator 2213 and the state machine 2853 of the sequence acceptor 2215 of SBM 101. A selector circuit 2411, or multiplexer, then is set for the selected MPSD or JTAG type output to the TMS1, TMS0 and and TDO pins. A first input of the selector circuit 2411 is connected to the output of a logic circuit 2421 for producing TMS output for JTAG type output in response to the superset state machine 2401.

A second logic circuit 2431 has its output connected to a second input of selector circuit 2411. The second logic circuit 2431 is responsive to superset state machine 2401 and produces an MPSD code corresponding to the state of state machine 2401. The MPSD code is connected to the second input of circuit 2411.

Key features, discoveries, processes and structures associated with this circuitry and its processes of operation associated with the superset state transition diagram of FIG. 21 are:

1. The reset state produces signals which are compatible to both TMS driven JTAG strap state and the MPSD reset state FRUN, so that even before host 1101 determines the type of target device, a proper reset signal is supplied by SBM 101.

2. Output circuits for the state diagrams of FIG. 19 and FIG. 20 are controlled by the same superset state machine 2401 which then controls circuits that generate codes or signals associated with diverse scan interface methodologies. One of the types of codes or signals is selected for the pins based on host 1101 instructions, whence communication begins with the target device according to the type of scan interface therein.

The superset state diagram of FIG. 21 elaborates the IDLE state of FIG. 19 to have states within a state. This recognizes that the hardware connection to outputs of the superset state machine 2401 can thus create the IDLE state by ORing the states within a state.

4. In a second embodiment of SBM 101, an internal TMS signal is variably delayed by shifter 1411 to help the acceptor 2215 discriminate between a condition of Run ended and Scan.

5. An artificially inserted Controlled Run state CRUN in FIG. 21 is added to the state diagram of FIG. 19 to make the MPSD controlled run state accessible and thus provide an output from superset state machine 2401 which can then be fed to logic 2431 to create the MPSD Controlled Run code when needed.

6. Host software keeps a record of what state each target device is put in or left in by the SBM 101 under host 1101 control. Major commands are from host 1101. The SBM 101 is controlled by software for each target chip. When the program is executed by host 1101, the Major Commands and Minor Commands for SBM 101 are sent to SBM 101 for bidirectional communication between the host 1101 and SBM 101.

Further in FIG. 22, selector circuit 2411 can supply control signals TMS5-0 to illustratively six different scan paths having respective interfaces responsive to the control signal TMS. Each scan path can include several target devices. Alternatively, selector circuit 2411 can supply MPSD signals EC1 and EC0 (C1,C0 control signals) from the TMS pins in pairs to illustratively three different MPSD devices such as the 320C30 DSP. Various other arrangements should be apparent—for example, supplying four signals TMS to four scan paths and using the other two TMS outputs for a signle MPSD device.

A delayed signal for sequence acceptor state machine 2853 of FIG. 22 is derived from variable delay shift register 1411 connected to TMS generator 2421 and simulating a link delay. Alternatively, the delay is provided by the cable 1103 itself wherein a TMS signal is fed back to an optional input TMSR (TMS return) to the sequence acceptor state machine 2853.

A selector circuit 2851 has scan data inputs TDI1 and TDI0, and selects one at a time to feed back to the shifter/buffer 2231 of FIG. 16 together with control signals from sequence acceptor circuitry 2853. The control signals advantageously correspond to respective states of the state machine 2853 in the sequence acceptor circuitry such as data scan, and controlled run so that the operations of the shifter/buffer 2231 uploading to host 1101 are enabled and disabled at the correct times.

Superset state machine 2401 of FIG. 22 receives requested state codes from a Requested State Latch 2811 which is a circuit with combinational logic and a latch for establishing the codes defining the state of superset state machine 2401 which is requested. State machine 2401 includes circuitry to compare its current state with the state in the Requested State Latch 2811, clock its way through the states, comparing as it proceeds, and then when a match is detected to stop at the state requested by the Latch 2811. In FIG. 21, the states marked "*" are decoded as PAUSE if the requested state is DSCAN, DPAUSE, ISCAN, or IPAUSE. Otherwise, the "*" states are decoded as IDLE.

The state machine 2401 of FIG. 22 supplies control signals to shifter/buffer 2231 advantageously corresponding to respective states of state machine 2401 such as data scan and controlled run. In this way, the operations of the shifter/buffer 2231 downloading from host 1101 to a target are enabled and disabled at the correct times. Sending of the data may suitably occur in bursts controlled by SBM 101 as the write (send) shifter/buffer 2331 fills from the host and empties to the target.

Figure 23:
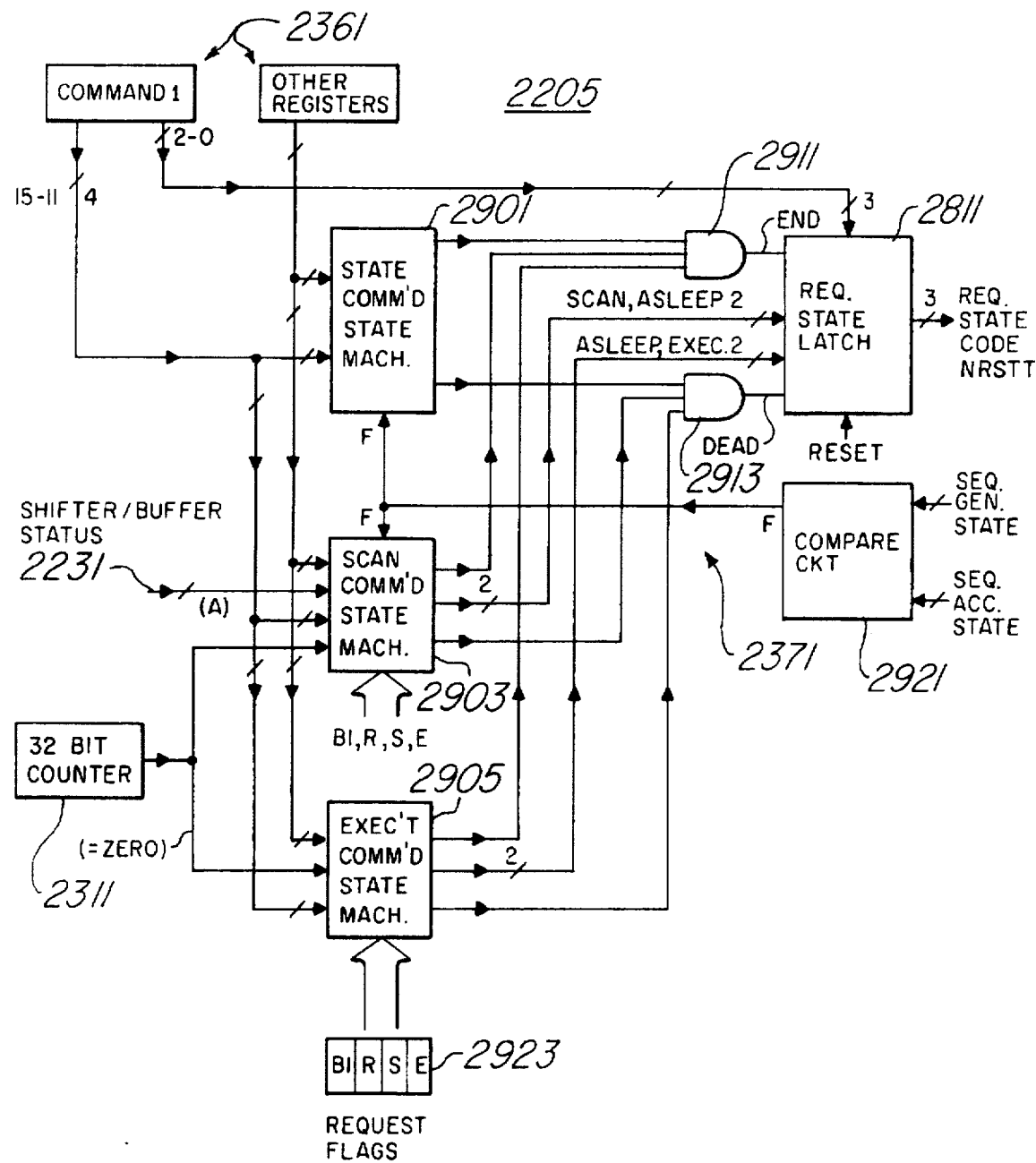
FIG. 23 is a block diagram of a command interpreter and requested state latch of the scan bus master of FIG. 16.

FIG. 23 shows further details of the circuitry of command interpreter 2205 connected to Requested State Latch 2811.

In FIG. 23, the Major Commands STATE, SCAN and EXECUTE are implemented by respective state machines—a STATE command state machine 2901, a SCAN command state machine 2903, and an EXECUTE command state machine 2905. Major opcode bits 15-11 of the Command1 register and bits from the other registers in the set 2361 are decoded and connected to inputs of each of the state machines 2901, 2903, 2905 to implement the commands and features discussed hereinabove.

Major opcode bits 2-0 from the Command1 register are supplied to the circuitry of the Requested State Latch 2811. Requested State Latch 2811 is also responsive to digital signal inputs representative of different states defined by the state machines 2901, 2903,2905 in operations carrying out the Major Commands. These states are END, the SCAN and ASLEEP states of the SCAN command state machine, the ASLEEP and EXECUTE states of the EXECUTE command state machine, and the DEAD state.

The END input to Latch 2811 is supplied by an AND gate 2911 having respective inputs fed by END outputs of each of the state machines 2901, 2903 and 2905. The DEAD input to Latch 2811 is supplied by an AND gate 2913 having respective inputs fed by DEAD outputs of each of the state machines 2901, 2903 and 2905. SCAN and ASLEEP outputs from the SCAN command state machine 2903 are fed directly to Latch 2811. ASLEEP and EXECUTE outputs from the EXECUTE state machine 2905 are fed directly to Latch 2811.

State machines 2901 and 2903 are responsive to a Finish F signal or interrupt flag provided by a comparing circuit 2921 at the completion of operations for a Major Command when the state of sequence acceptor 2215 becomes the same as the state of sequence generator 2213 which sent the signals to the target to implement the Major Command. Thus cable 1103 contains only one state and has thus stabilized.

State machines 2903 and 2905 have inputs for request flags denominated B1, R, S and E from a register 2923. B1 represents "Begin". R represents "Resume". S represents "Suspend". E represents "End". These flags are also discussed hereinabove.

A further input B2 is a major opcode Command1 register bit which as a one or zero represents "Start Awake" or "Start Asleep". A shifter/buffer 2231 status bit Abort A is an input to SCAN command state machine 2903. Abort active signifies a buffer access error and causes a transition from SCAN state to ASLEEP state in FIG. 25.

Figure 24:
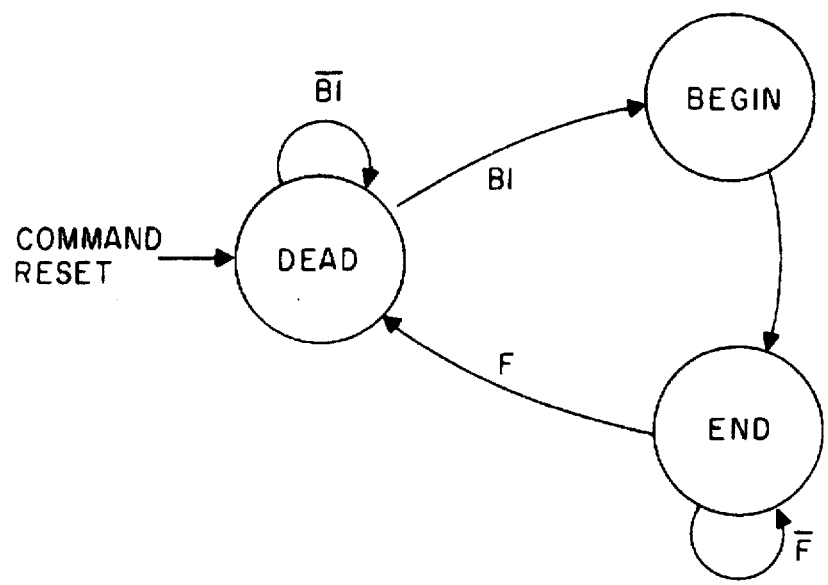
FIG. 24 is a state transition diagram of a STATE command state machine of the command interpreter of FIG. 23.
Figure 26:
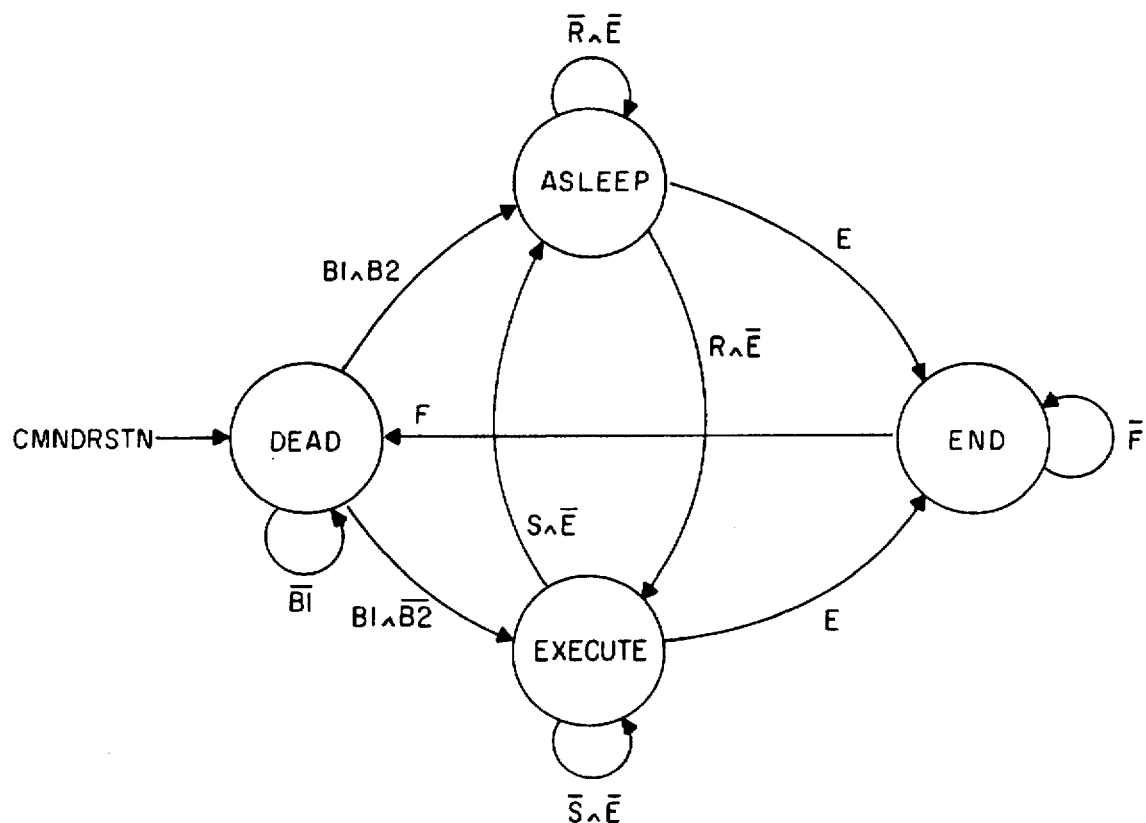
FIG. 26 is a state transition diagram of an EXECUTE command state machine of the command interpreter of FIG. 23.

State transition diagrams defining each of the state machines 2901, 2903, 2905 are shown in FIG. 24 (STATE Command), FIG. 25 (SCAN Command), and FIG. 26 (EXECUTE Command) respectively. In these FIGS. 24, 25, 26 a carat mark indicates Boolean AND, and a plus + indicates Boolean OR. Overbar indicates NOT (logical complement). The outputs are represented by the states marked in circles, and the output for a state (circle) becomes active immediately upon the existence of the input condition noted next to each transition arrow to that state.

Major Opcode bit 4 of Command1 register is set by host 1101 to establish by one or zero whether the target is a TMS responsive (e.g. JTAG compatible) target or a MPSD target.

For the SCAN command regardless of whether SBM 101 is set for a TMS-responsive or a MPSD target, the state machine 2903 SCAN and ASLEEP states correspond to DSCAN and DPAUSE requested states of FIG. 21 respectively. SCAN and ASLEEP states also correspond to ISCAN and IPAUSE requested states of FIG. 21 respectively.

For the EXECUTE command when SBM 101 is set for TMS responsive (e.g. JTAG compatible) target, the states EXECUTE and ASLEEP of FIG. 26 either correspond respectively to IDLE and DPAUSE states of FIG. 21 or correspond respectively to IDLE and IPAUSE states of FIG. 21. For the EXECUTE command when SBM 101 is set for MPSD target, the states EXECUTE and ASLEEP of FIG. 26 either correspond respectively to Functional Run FRUN and IDLE of FIG. 21 or correspond respectively to Controlled Run CRUN and IDLE of FIG. 21.

For any of the three Major Commands SCAN, EXECUTE and STATE, bits 2-0 of Command1 register provide a choice of END to correspond to any selected state of FIG. 21.

The SCAN state in FIG. 25 is an example of an Awake state for the SCAN Command state machine 2903. The EXECUTE state in FIG. 26 is an example of an Awake state for the EXECUTE Command state machine 2905. Suspend allows a transition from an Awake state to an Asleep state of a state machine. Resume allows a transition from an Asleep state to an Awake state of a state machine.

For the SCAN command, the suspend S flag is set when the state machine 2903 has arrived at the SCAN state and the Read buffer 2321 and cable 1103 are full. S flag is also set when in SCAN state and the Write buffer 2331 is empty. A resume R flag is set when the state machine 2903 has arrived at the ASLEEP state and both the Read buffer 2321 and cable 1103 are not full and the Write buffer 2331 is not empty. An End flag is set when the state machine 2903 is in the SCAN state and is sending the last bit of a scan sequence as indicated by an counter 2311 equal zero signal in FIG. 23.

Turning to even further detailed description of Requested State Latch 2811, the Requested State Code NRSTT output of Latch 2811 is interpreted according to Table I.

TABLE I

| SUPERSET STATE CODES | |
|---|---|
| NRSTT | Superset State |
| 000 = | FRUN |
| 001 = | CRUN |
| 010 OR 011 = | IDLE |
| 100 = | DSCAN |
| 101 = | ISCAN |
| 110 = | DPAUSE |
| 111 = | IPAUSE |

The above outputs are derived from the inputs to Requested State Latch 2811 according to the following Table II:

TABLE II

| REQUESTED STATE DERIVATION | |
|---|---|
| Active Input | Output NRSTT |
| Reset | 000 |
| DEAD (2913) | CBA |
| END (2911) | (OP2) (OP1) (X) |
| ASLEEP (EXECUTE 2905) | (OP4-) (1) (OP6) |
| AWAKE (EXECUTE 2905) | (0) (OP4-) (OP6) |
| ASLEEP (SCAN 2903) | (1) (1) (OP6) |
| AWAKE (SCAN 2903) | (1) (0) (OP6) |

In words, the Requested State Code NRSTT is the value to be clocked into the output latch of circuit 2811. NRSTT has the three bits defined by the three bit entries in the NRSTT column corresponding to a particular input condition. For example when the latch is reset, then NRSTT=000 which calls for the Functional Run FRUN superset state of Table I. In other conditions the NRSTT code also depends on the Major Opcodes in Command1 register. CBA represents the three bits held in the output of the Requested State Latch 2811 so that DEAD maintains whatever is the current Requested State Code. OP6 is bit 6 of Command1 register that selects the SCAN or EXECUTE state, thus selecting the particular Awake state desired by host 1101. "OP4-" is the logical complement of OP4 bit 4 of Command1 register that selects JTAG or MPSD mode (bypasses controlled run CRUN state on superset state diagram of FIG. 21 for JTAG compatible targets, and includes CRUN for MPSD targets). OP2, OP1 and OP0 are the three bits 2,1,0 of Command1 register that select the requested superset state when the END state is reached in any Major command. The value X corresponding to END input is defined by the Boolean logic equation X=OP0(OP4+OP2+OP1).

Figure 27:
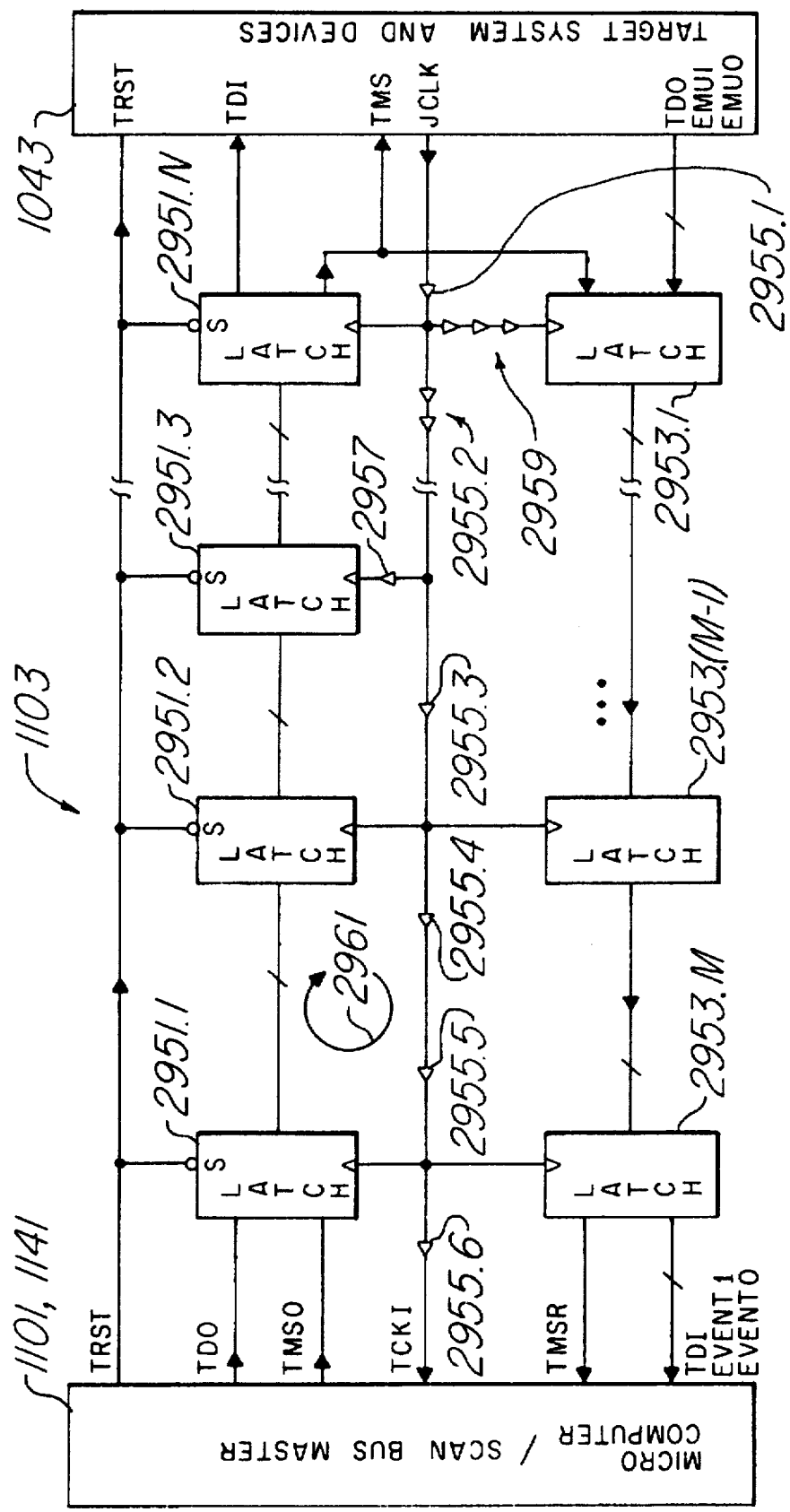
FIG. 27 is a block diagram of a system including an improved cable for connecting a host computer to a target system.

Turning now to describe cable 1103 in greater detail, FIG. 27 shows host 1101 microcomputer with card 1141 for SBM 101 connected by cable 1103 to a target board 1043.

When cable 1103 is more than about a meter in length, cable delay considerations and signal reflections are preferably taken into account. In FIG. 27, a series of D-latches 2951.1, 2951.2, 2951.3, ... 2951.N are cascaded at intervals (not necessarily equal intervals) along the cable 1103 to carry the SBM-to-target signals such as mode select TMS and scan data output TDO to the target terminals mode select TMS and scan data input TDI respectively. A test reset line TRST is connected to low active set input terminals to reset the D-latches of cable 1103.

A further series of cascaded D-latches 2953.1, ... 2953.(M-1), 2953.M return scan data from output TDO on the target board to scan data input TDI of SBM 101. The EMU1 and EMU0 pins on the target are suitably connected for input and output from and to the cascaded latches of cable 1103 according to the functions required of them. For example, the EMU1 and EMU0 pins are suitably coupled via latches 2953 to the EVENT1 and EVENT0 pins of SBM 101.

Variable delay shift register 1411 of FIG. 16 is host-programmable to simulate cable delay. Alternatively, cable 1103 is itself made to provide an indication of its own actual cable delay by connecting a TMS output of latch 2951.N to an input of latch 2953.1 to return the TMS signal to an optional TMS Return pin TMSR of SBM 101.

In this way cable 1103 is an example of a cable having a plurality of serially connected signal storage elements and a medium segmented by the elements for conveying signals for emulation, simulation and test from a host to a target and from the target to the host. An serial scan interface in the target is connected to receive a mode signal which causes the serial scan interface to change from one electronic state to another, and this mode signal is returned by the signal storage elements to the host. For this example SBM 101 is regarded as part of the host computer. The cable can have the transmission medium be wires, shielded conductors, optical fibers or any other suitable medium. The signal storage elements can be latches or digital memory circuitry in any technology or any other suitable storage element.

In FIG. 27, a test clock line JCLK from the target 1043 is suitably buffered by buffers 2955.1, 2955.2, 2955.3, 2955.4, 2955.5 and 2955.6 cascaded down the cable between JCLK on the target and input TCKI on SBM 101. If SBM 101 is to be the source of clock signals, then output TCKO of SBM 101 should be used and the cable 1103 connected in reverse. Clock inputs of the latches 2951 and 2953 are connected to the clock buffers 2955. Buffers 2957 and 2959 connected between the clock line and the clock inputs of some latches provide appropriate delays as necessary, or supply a latch like 2951.3 that has no counterpart on the return side of the cable. One purpose of the circuitry is to avoid metastable conditions as suggested by arc 2961 wherein the latching process might lose data. This is generally avoided by locating the latches at spacings S less than twice the product of the signal propagation velocity of each cable segment multiplied by the sum of the minimum pulse width of a signal to be conveyed plus the settling time of each latch.

It should be understood that various embodiments of the invention can employ hardware, software or microcoded firmware. Process and state transition diagrams herein are also representative of diagrams for microcoded and software based embodiments. Connections and couplings can be ohmic, direct electrical, digital or analog interfacing, electromagnetic, optical or by any other suitable means.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to this description. It is therefore contemplated that the appended claims cover any such modifications or embodiments as fall within the true scope of the invention.

APPENDIX

Control0 Register Bits

| Bit | Description |
|---|---|
| 0 | Event0 Interrupt Enable |
| 1 | Event1 Interrupt Enable |
| 2 | Event2 Interrupt Enable |
| 3 | Event3 Interrupt Enable |
| 4 | Zero1 Interrupt Enable |
| 5 | Unused |
| 6 | Error Interrupt Enable |
| 7 | Finish Interrupt Enable |
| 8 | Suspend Interrupt Enable |
| 9 | End Interrupt Enable |
| 10 | Resume Interrupt Enable |
| 11 | Begin Interrupt Enable |
| 12 | Unused |
| 13 | Unused |
| 14 | Unused |
| 15 | Unused | control0 register bit description

The control0 register is set by the host to configure the 'ACT8990 before a command is executed. The bits are not altered by the device. The control0 register's address (from ADRS4–ADRS0) is 00000.

Bit 0 – Event0 Interrupt Enable

The status of this bit determines if an interrupt is asserted when the Event0 Edge Interrupt Flag is set.
 0      No interrupt is asserted.
 1      An interrupt is asserted.

Bit 1 – Event1 Interrupt Enable

The status of this bit determines if an interrupt is asserted when the Event1 Edge Interrupt Flag is set.
 0      No interrupt is asserted.
 1      An interrupt is asserted.

Bit 2 – Event2 Interrupt Enable

The status of this bit determines if an interrupt is asserted when the Event2 Edge Interrupt Flag is set.
 0      No interrupt is asserted.
 1      An interrupt is asserted.

Bit 3 – Event3 Interrupt Enable

The status of this bit determines if an interrupt is asserted when the Event3 Edge Interrupt Flag is set.
 0      No interrupt is asserted.
 1      An interrupt is asserted.

Bit 4 – Zero1 Interrupt Enable

The status of this bit determines if an interrupt is asserted when the Zero1 Interrupt Flag is set.
 0      No interrupt is asserted.
 1      An interrupt is asserted.

Bit 5 – Unused

Bit 6 – Error Interrupt Enable
The status of this bit determines if an interrupt is asserted when the Error Interrupt Flag is set.
0        No interrupt is asserted.
1        An interrupt is asserted.

Bit 7 – Finish Interrupt Enable
The status of this bit determines if an interrupt is asserted when the Finish Interrupt Flag is set.
0        No interrupt is asserted.
1        An interrupt is asserted.

Bit 8 – Suspend Interrupt Enable
The status of this bit determines if an interrupt is asserted when the Suspend Interrupt Flag is set.
0        No interrupt is asserted.
1        An interrupt is asserted.

Bit 9 – End Interrupt Enable
The status of this bit determines if an interrupt is asserted when the End Interrupt Flag is set.
0        No interrupt is asserted.
1        An interrupt is asserted.

Bit 10 – Resume Interrupt Enable
The status of this bit determines if an interrupt is asserted when the Resume Interrupt Flag is set.
0        No interrupt is asserted.
1        An interrupt is asserted.

Bit 11 – Begin Interrupt Enable
The status of this bit determines if an interrupt is asserted when the Begin Interrupt Flag is set.
0        No interrupt is asserted.
1        An interrupt is asserted.

Bit 12 – Unused

Bit 13 – Unused

Bit 14 – Unused

Bit 15 – Unused

Control1 Register Bits

| Bit | Description |
|---|---|
| 0 | Link Delay0 |
| 1 | Link Delay1 |
| 2 | Link Delay2 |
| 3 | Link Delay3 |
| 4 | Link Delay4 |
| 5 | Unused |
| 6 | Unused |
| 7 | Unused |
| 8 | Timing Data |
| 9 | Connect Data |
| 10 | Connect Mode |
| 11 | Connect Loopback |
| 12 | Output Value0 |
| 13 | Output Value1 |
| 14 | Output Enable0 |
| 15 | Output Enable1 | control1 register bit description

The control1 register is set by the host to configure the 'ACT8990 before a command is executed. The bits are not altered by the device. The control1 register's address (from ADRS4–ADRS0) is 00001.

Bits 4–0 – Link Delay
These five bits determine the length of the link delay register, which is used when the returned signals are not directly linked (i.e., they are delayed by at least one clock cycle). The link delay register may be 0 to 31 bits in length.

Bit 5 – Unused

Bit 6 – Unused

Bit 7 – Unused

Bit 8 – Timing Data
The status of this bit determines the edge of TCKI on which data at TDI1–0 will be captured.
0   The TDI1–0 inputs are captured on the rising edge of TCKI.
1   The TDI1–0 inputs are captured on the falling edge of TCKI.

Bit 9 – Connect Data
The status of this bit determines which TDI signal (TDI1 or TDI0) will be selected as the data in source.
0   The TDI0 input is selected (TDI1 is ignored).
1   The TDI1 input is selected (TDI0 is ignored).

Bit 10 – Connect Mode
The status of this bit determines which TMS signal (TMS1 or TMS0) will be connected to the mode source.
0   The TMS0 output is connected to the mode source. TMS1 holds its value.
1   The TMS1 output is connected to the mode source. TMS0 holds its value.

Bit 11 – Connect Loopback
The bit enables an internal loopback connection from the sequence generator to the sequence acceptor.
0   The Link Delay4–0, Mode Connect, and Data Connect bits are ignored. The TMS1–0 outputs are disconnected from mode source and hold their vlues. The TDI1–0 inputs are ignored. The data out source is used as the data in source. The link delay register is set to a length of zero bits.
1   The Link Delay4–0, Mode Connect, and Data Connect bits are effective.

Bit 12 – Output Value0
This bit configures the TMS1–0 and TDO outputs as a logic 1 or enables them.
0   The TMS1–0 and TDO outputs are set to a logic 1.
1   The TMS1–0 and TDO outputs are enabled.

Bit 13 – Output Value1
The bit configures the TRS output as a logic 1 or a logic 0. The TRS output is affected only by this bit and the hardware and software resets, and is enabled or disabled by Bit 15.
0   The TRS output is set to a logic 0.
1   The TRS output is set to a logic 1.

Bit 14 – Output Enable0
This bit sets the TMS1–0 and TDO outputs to an enabled or high-impedance state.
0   The TMS1–0 and TDO outputs are set to the high-impedance state.
1   The TMS1–0 and TDO outputs are enabled.

Bit 15 – Output Enable1
The bit sets the TRS output to an enabled or high-impedance state.
0   The TRS output is set to the high-impedance state.
1   The TRS output is enabled.

Control2 Register Bits

| Bit | Description |
|---|---|
| 0 | Event0 Suspend |
| 1 | Event0 End |
| 2 | Event0 Resume |
| 3 | Event0 Begin |
| 4 | Unused |
| 5 | Event0 Sync |
| 6 | Event0 Polarity |
| 7 | Event0 Timing |
| 8 | Event1 Suspend |
| 9 | Event1 End |
| 10 | Event1 Resume |
| 11 | Event1 Begin |
| 12 | Unused |
| 13 | Event1 Sync |
| 14 | Event1 Polarity |
| 15 | Event1 Timing | control2 register bit description

The control2 register is set by the host to configure the 'ACT8990 before a command is executed. The bits are not altered by the device. The control2 register's address (from ADRS4–ADRS0) is 00010.

Bit 0 – Event0 Suspend

The status of this bit determines if edges on the Event0 pin request EXECUTE commands to suspend.
- 0     Edges do not generate a suspend request.
- 1     Edges generate suspend requests on EXECUTE commands.

Bit 1 – Event0 End

The status of this bit determines if edges on the Event0 pin request EXECUTE commands to end.
- 0     Edges do not generate an end request.
- 1     Edges generate end requests on EXECUTE commands.

Bit 2 – Event0 Resume

The status of this bit determines if edges on the Event0 pin request EXECUTE commands to resume.
- 0     Edges do not generate a resume request.
- 1     Edges generate resume requests on EXECUTE commands.

Bit 3 – Event0 Begin

The status of this bit determines if edges on the Event0 pin request EXECUTE commands to begin.
- 0     Edges do not generate a begin request.
- 1     Edges generate begin requests on EXECUTE commands.

Bit 4 – Unused

Bit 5 – Event0 Sync

The status of this bit sets the mode (synchronous or asynchronous) in which the Event0 pin senses edges.

| 0 | Edges are detected asynchronously to the clock. |
| 1 | Edges are detected synchronously to the clock. |

Bit 6 – Event0 Polarity

The status of this bit determines on which edge (rising or falling) the Event0 pin triggers.
- 0    The Event0 pin triggers on the rising edge of the clock.
- 1    The Event0 pin triggers on the falling edge of the clock.

Bit 7 – Event0 Timing

The status of this bit determines on which edge (rising or falling) of the clock the status of the Event0 pin is captured. This status of this bit only affects synchronous operations.
- 0    The status of the Event0 pin is captured on the rising edge of the clock.
- 1    The status of the Event0 pin is captured on the falling edge of the clock.

Bit 8 – Event1 Suspend

The status of this bit determines if edges on the Event1 pin request EXECUTE commands to suspend.
- 0    Edges do not generate a suspend request.
- 1    Edges generate suspend requests on EXECUTE commands.

Bit 9 – Event1 End

The status of this bit determines if edges on the Event1 pin request EXECUTE commands to end.
- 0    Edges do not generate an end request.
- 1    Edges generate end requests on EXECUTE commands.

Bit 10 – Event1 Resume

The status of this bit determines if edges on the Event1 pin request EXECUTE commands to resume.
- 0    Edges do not generate a resume request.
- 1    Edges generate resume requests on EXECUTE commands.

Bit 11 – Event1 Begin

The status of this bit determines if edges on the Event1 pin request EXECUTE commands to begin.
- 0    Edges do not generate a begin request.
- 1    Edges generate begin requests on EXECUTE commands.

Bit 12 – Unused

Bit 13 – Event1 Sync

The status of this bit sets the mode (synchronous or asynchronous) in which the Event1 pin senses edges.
- 0    Edges are detected asynchronously to the clock.
- 1    Edges are detected synchronously to the clock.

Bit 14 – Event1 Polarity

The status of this bit determines on which edge (rising or falling) the Event1 pin triggers.
- 0    The Event1 pin triggers on the rising edge of the clock.
- 1    The Event1 pin triggers on the falling edge of the clock.

Bit 15 – Event1 Timing

The status of this bit determines on which edge (rising or falling) of the clock the status of the Event1 pin is captured. This status of this bit only affects synchronous operations.
- 0    The status of the Event1 pin is captured on the rising edge of the clock.
- 1    The status of the Event1 pin is captured on the falling edge of the clock.

Control3 Register Bits

| Bit | Description |
|---|---|
| 0 | Event2 Suspend |
| 1 | Event2 End |
| 2 | Event2 Resume |
| 3 | Event2 Begin |
| 4 | Unused |
| 5 | Event2 Sync |
| 6 | Event2 Polarity |
| 7 | Event2 Timing |
| 8 | Event3 Suspend |
| 9 | Event3 End |
| 10 | Event3 Resume |
| 11 | Event3 Begin |
| 12 | Unused |
| 13 | Event3 Sync |
| 14 | Event3 Polarity |
| 15 | Event3 Timing | control3 register bit description

The control3 register is set by the host to configure the 'ACT8990 before a command is executed. The bits are not altered by the device. The control3 register's address (from ADRS4–ADRS0) is 00011.

Bit 0 – Event2 Suspend
The status of this bit determines if edges on the Event2 pin request EXECUTE commands to suspend.
0      Edges do not generate a suspend request.
1      Edges generate suspend requests on EXECUTE commands.

Bit 1 – Event2 End
The status of this bit determines if edges on the Event2 pin request EXECUTE commands to end.
0      Edges do not generate an end request.
1      Edges generate end requests on EXECUTE commands.

Bit 2 – Event2 Resume
The status of this bit determines if edges on the Event2 pin request EXECUTE commands to resume.
0      Edges do not generate a resume request.
1      Edges generate resume requests on EXECUTE commands.

Bit 3 – Event2 Begin
The status of this bit determines if edges on the Event2 pin request EXECUTE commands to begin.
0      Edges do not generate a begin request.
1      Edges generate begin requests on EXECUTE commands.

Bit 4 – Unused

Bit 5 – Event2 Sync
The status of this bit sets the mode (synchronous or asynchronous) in which the Event2 pin senses edges.

0    Edges are detected asynchronously to the clock.
1    Edges are detected synchronously to the clock.

Bit 6 – Event2 Polarity

The status of this bit determines on which edge (rising or falling) the Event2 pin triggers.
0    The Event2 pin triggers on the rising edge of the clock.
1    The Event2 pin triggers on the falling edge of the clock.

Bit 7 – Event2 Timing

The status of this bit determines on which edge (rising or falling) of the clock the status of the Event2 pin is captured. This status of this bit only affects synchronous operations.
0    The status of the Event2 pin is captured on the rising edge of the clock.
1    The status of the Event2 pin is captured on the falling edge of the clock.

Bit 8 – Event3 Suspend

The status of this bit determines if edges on the Event3 pin request EXECUTE commands to suspend.
0    Edges do not generate a suspend request.
1    Edges generate suspend requests on EXECUTE commands.

Bit 9 – Event3 End

The status of this bit determines if edges on the Event3 pin request EXECUTE commands to end.
0    Edges do not generate an end request.
1    Edges generate end requests on EXECUTE commands.

Bit 10 – Event3 Resume

The status of this bit determines if edges on the Event3 pin request EXECUTE commands to resume.
0    Edges do not generate a resume request.
1    Edges generate resume requests on EXECUTE commands.

Bit 11 – Event3 Begin

The status of this bit determines if edges on the Event3 pin request EXECUTE commands to begin.
0    Edges do not generate a begin request.
1    Edges generate begin requests on EXECUTE commands.

Bit 12 – Unused

Bit 13 – Event3 Sync

The status of this bit sets the mode (synchronous or asynchronous) in which the Event3 pin senses edges.
0    Edges are detected asynchronously to the clock.
1    Edges are detected synchronously to the clock.

Bit 14 – Event3 Polarity

The status of this bit determines on which edge (rising or falling) the Event3 pin triggers.
0    The Event3 pin triggers on the rising edge of the clock.
1    The Event3 pin triggers on the falling edge of the clock.

Bit 15 – Event3 Timing

The status of this bit determines on which edge (rising or falling) of the clock the status of the Event3 pin is captured. This status of this bit only affects synchronous operations.
0    The status of the Event3 pin is captured on the rising edge of the clock.
1    The status of the Event3 pin is captured on the falling edge of the clock.

Control4 Register Bits

| BR | Description |
|---|---|
| 0 | Event0 Data Out |
| 1 | Event1 Data Out |
| 2 | Event2 Data Out |
| 3 | Event3 Data Out |
| 4 | Unused |
| 5 | Unused |
| 6 | Unused |
| 7 | Unused |
| 8 | Event0 Enable Out |
| 9 | Event1 Enable Out |
| 10 | Event2 Enable Out |
| 11 | Event3 Enable Out |
| 12 | Unused |
| 13 | Unused |
| 14 | Unused |
| 15 | Unused | control4 register bit description

The control4 register is set by the host to configure the 'ACT8990 before a command is executed. The bits are not altered by the device. The control4 register's address (from ADRS4–ADRS0) is 00100.

Bit 0 – Event0 Data Out

The status of this bit determines the value of the Event0 output when enabled by the Enable Out bit. The output changes on the falling edge of the clock.

| | |
|---|---|
| 0 | A logic 1 is output. |
| 1 | A logic 0 is output. |

Bit 1 – Event1 Data Out

The status of this bit determines the value of the Event1 output when enabled by the Enable Out bit. The output changes on the falling edge of the clock.

| | |
|---|---|
| 0 | A logic 1 is output. |
| 1 | A logic 0 is output. |

Bit 2 – Event2 Data Out

The status of this bit determines the value of the Event2 output when enabled by the Enable Out bit. The output changes on the falling edge of the clock.

| | |
|---|---|
| 0 | A logic 1 is output. |
| 1 | A logic 0 is output. |

Bit 3 – Event3 Data Out

The status of this bit determines the value of the Event3 output when enabled by the Enable Out bit. The output changes on the falling edge of the clock.

| | |
|---|---|
| 0 | A logic 1 is output. |
| 1 | A logic 0 is output. |

Bit 4 – Unused

Bit 5 – Unused

Bit 6 – Unused

Bit 7 – Unused

Bit 8 – Event0 Enable Out
This bit sets the Event0 output to a high-impedance or enabled state.
0        The output is in the high-impedance state.
1        The output is enabled.

Bit 9 – Event1 Enable Out
This bit sets the Event1 output to a high-impedance or enabled state.
0        The output is in the high-impedance state.
1        The output is enabled.

Bit 10 – Event2 Enable Out
This bit sets the Event2 output to a high-impedance or enabled state.
0        The output is in the high-impedance state.
1        The output is enabled.

Bit 11 – Event3 Enable Out
This bit sets the Event3 output to a high-impedance or enabled state.
0        The output is in the high-impedance state.
1        The output is enabled.

Bit 12 – Unused

Bit 13 – Unused

Bit 14 – Unused

Bit 15 – Unused

Control5 Register Bits

| Bit | Description |
|---|---|
| 0 | Counter1 Suspend |
| 1 | Counter1 End |
| 2 | Counter1 Operate0 |
| 3 | Counter1 Operate1 |
| 4 | Counter1 Reload |
| 5 | Counter1 Source0 |
| 6 | Counter1 Source1 |
| 7 | Counter1 Source2 |
| 8 | Null |
| 9 | Null |
| 10 | Null |
| 11 | Null |
| 12 | Null |
| 13 | Null |
| 14 | Null |
| 15 | Null | control5 register bit description

The control5 register is set by the host to configure the 'ACT8990 before a command is executed. The bits are not altered by the device. The control4 register's address (from ADRS4–ADRS0) is 00101.

Bit 0 – Counter1 Suspend

This bit determines if Counter1 will generate suspend requests to EXECUTE commands (while counting) when its value is all zeroes.
- 0          Counter1 will not generate suspend requests.
- 1          Counter1 will generate suspend requests.

Bit 1 – Counter1 End

The bit determines if Counter1 will generate end requests to EXECUTE commands (while counting) when its value is all zeroes.
- 0          Counter1 will not generate end requests.
- 1          Counter1 will generate end requests.

Bits 3 and 2 – Counter1 Operate1–0

These bits determine how Counter1 is operated.
- 00        Counter1 is not operated at any time.
- 01        Counter1 is operated by the EVENT pins as selected by Counter1 Source2–0.
- 10        Counter1 is operated when EXECUTE commands send execute states.
- 11        Counter1 is operated when EXECUTE commands are alive.

Bit 4 – Counter1 Reload

This bit determines how Counter1 will reload after reaching a count of all zeroes.
- 0          Counter1 is decremented to the value of all ones after reaching all zeroes.
- 1          Counter1 is loaded from its update register after reaching all zeroes.

Bits 6 and 5 — Counter1 Source1-0
These bits determine which EVENT pin operates Counter1 when selected by Counter1 Operate1-0
00        Counter1 is operated by edges or levels on EVENT0.
01        Counter1 is operated by edges or levels on EVENT1.
10        Counter1 is operated by edges or levels on EVENT2.
11        Counter1 is operated by edges or levels on EVENT3.

Bit 7 — Counter1 Source2
This bit determines if levels or edges on EVENT pins will be used to operate Counter1.
0         Edges on the EVENT pins operate Counter1.
1         Levels on the EVENT pins operate Counter1.

Bit 8 — Unused.

Bit 9 — Unused.

Bit 10 — Unused.

Bit 11 — Unused.

Bit 12 — Unused.

Bit 13 — Unused.

Bit 14 — Unused.

Bit 15 — Unused.

Command0 Register Bits

| Bit | Description |
|---|---|
| 0 | Minor Opcode0 |
| 1 | Minor Opcode1 |
| 2 | Minor Opcode2 |
| 3 | Minor Opcode3 |
| 4 | Minor Opcode4 |
| 5 | Minor Opcode5 |
| 6 | Minor Opcode6 |
| 7 | Minor Opcode7 |
| 8 | Null |
| 9 | Null |
| 10 | Null |
| 11 | Null |
| 12 | Minor Opcode12 |
| 13 | Minor Opcode13 |
| 14 | Minor Opcode14 |
| 15 | Minor Opcode15 | command0 register bit description

The Command0 Register directs the 'ACT8990 to perform minor commands according to the status of the bits in the register. The command0 register is accessed by the host and is not altered by the device itself. After a write operation is performed on the register the device will attempt to execute the selected minor command. The Command0 Register's address (ADRS4–ADRS0) is 01000.

The command0 register should not be written to when a minor command is alive. The exception to this is the RESET command, which may be written at any time.

The minor commands do not set the Finish Interrupt flag when finished or change the state of the Awake and Alive status bits. The four most significant bits (Bit 15–Bit 12) are decoded to provide the following minor commands:

| Bits 15–12 | | | | Command |
|---|---|---|---|---|
| Bit 15 | Bit 14 | Bit 13 | Bit 12 | |
| 0 | 0 | 0 | 0 | INITIAL0 |
| 0 | 0 | 0 | 1 | Not used |
| 0 | 0 | 1 | 0 | CLEAR0 |
| 0 | 0 | 1 | 1 | Not used |
| 0 | 1 | 0 | 0 | SET0 |
| 0 | 1 | 0 | 1 | Not used |
| 0 | 1 | 1 | 0 | CAPTURE |
| 0 | 1 | 1 | 1 | RESET |
| 1 | x | x | x | Not used | x = Don't care command0 register bit description (continued)

The Minor Opcode7–0 bits are used to specify options for each of the minor commands. Not all minor commands use all eight bits to specify the available options. A description of the minor commands and their options is in the 'Minor Commands' section.

Command1 Register Bits

| Bit | Description |
|---|---|
| 0 | Major Opcode0 |
| 1 | Major Opcode1 |
| 2 | Major Opcode2 |
| 3 | Major Opcode3 |
| 4 | Major Opcode4 |
| 5 | Major Opcode5 |
| 6 | Major Opcode6 |
| 7 | Major Opcode7 |
| 8 | Null |
| 9 | Null |
| 10 | Null |
| 11 | Null |
| 12 | Major Opcode12 |
| 13 | Major Opcode13 |
| 14 | Major Opcode14 |
| 15 | Major Opcode15 | command1 register bit description

The Command1 Register directs the 'ACT8990 to perform major commands according to the status of the bits in the register. The command1 register is accessed by the host and is not altered by the device itself. The selected major command will begin after an INITIAL0 command is written into the command0 register. The Command1 Register's address (from ADRS4–ADRS0) is 01001.

The command1 register should not be written to when a major command is alive.

The four most significant bits (bits 15–12) select the major command as follows:

| Bits 15–12 | | | | Command |
|---|---|---|---|---|
| Bit 15 | Bit 14 | Bit 13 | Bit 12 | |
| 0 | 0 | 0 | 0 | Not used |
| 0 | 0 | 0 | 1 | STATE |
| 0 | 0 | 1 | 0 | EXECUTE |
| 0 | 0 | 1 | 1 | SCAN |
| x | 1 | x | x | Not used |
| 1 | x | x | x | Not used | x = Don't care command1 register bit description (continued)

The Major Opcode7–0 bits are used to specify options for each of the major commands. Not all major commands use all eight bits to specify the available options. A description of the major commands and their options is in the 'Major Commands' section.

Configure0 Register Bits

| Bit | Description |
|---|---|
| 0 | Counter Test0 |
| 1 | Counter Test1 |
| 2 | Counter Capture |
| 3 | Counter Update |
| 4 | Counter Operate |
| 5 | Serial Test |
| 6 | Data Format |
| 7 | Shifter Length |
| 8 | Sequencer Format0 |
| 9 | Sequencer Format1 |
| 10 | Delay Test |
| 11 | Status Capture |
| 12 | Visibility Test |
| 13 | Unused |
| 14 | Unused |
| 15 | Unused | configure0 register bit description

The Configure0 Register's bits are set by the host after a reset operation. The 'ACT8990 does not change the value of the configure0 register. Most of the functions controlled by the configure0 register are related to manufacturing test functions and are not of interest to the end user. The Configure0 Register's address (from ADRS4–ADRS0) is 01010.

Bits 1–0 – Counter Test1–0
These bits control the counter's carry logic for manufacturing test.
00    Normal operation. The decrement control goes to byte 0.
01    The decrement control goes to bytes 0 and 1.
10    The decrement control goes to bytes 0 and 2.
11    The decrement control goes to bytes 0 and 3.

These bits also control the internal "outstanding bit counter", "send LSB counter", and "receive LSB counter" as follows:
00    Normal operation.
01    The count-up control of the outstanding bit counter and the operate control of the send LSB counter are controlled by the level on the EVENT0 pin.
10    The count-down control of the outstanding bit counter and the operate control of the receive LSB counter are controlled by the level on the EVENT1 pin.
11    The outstanding bit counter is cleared. The send and receive LSB counters are loaded from Counter1 Update3–0.

Bit 2 – Counter Capture
This bit enables the continuous storing of the counter's value to its Capture register.
0    The counters are not continuously stored.
1    The counters are continuously stored.

Bit 3 – Counter Update
This bit enables the continous loading of the counters from their Update registers.
0   The counters are not continuously loaded.
1   The counters are continuously loaded.

Bit 4 – Counter Operate
This bit enables the counter to operate continuously.
0   The counters are not continuously operated.
1   The counters are continuously operated.

Bit 5 – Serial Test
This bit controls the serial buffers and shifter functions.
0   Normal operation.
1   The serial write buffer, shifter, serial read buffer mask logic, and serial read bffer are connected as a five-word deep FIFO for test purposes. The serial read buffer mask logic is enabled for partial word operation, with the format and partial word size controlled by the Data Format configure bit and Counter1 Update3–0 control bits.

Bit 6 – Data Format
This bit configures the serial buffer and shifter functions to operate on serial and parallel data as LSB first (LSB nearest TDO) or MSB first (LSB nearest TDI).
0   LSB first.
1   MSB first.

Bit 7 – Shifter Length
This bit configures the shifter for 16– or 32–bit length.
0   16–bit length.
1   32–bit length.

Bit 8 – Sequencer Format0
This bit configures the sequencers that operate the target interface as JTAG or MPSD compatible. This bit should be set to a logic zero.
0   JTAG/SCOPE–compatible.
1   MPSD–compatible.

Bit 9 – Sequencer Format1
This bit configures the sequence generator to decode TMS1–0 or EC1–0 to correspond with JTAG/SCOPE or MPSD operation. This bit should be set a logic zero.
0   JTAG/SCOPE–compatible.
1   MPSD–compatible.

Bit 10 – Delay Test
This bit configures the TRS pin to output the delayed mode source generated by the link delay register.
0   The TRS pin outputs the TRS signal.
1   The TRS pin outputs the delayed mode source.

Bit 11 – Status Capture
This bit enables the continuous storing of the status signals to their Status registers.
0   The status signals are not continuously stored.
1   The status signals are continuously stored.

Bit 12 – Visibility Test
This bit makes key internal flip-flops visible via particular addresses.
0   The listed registers are readable via the ADRS4–0 values xx–xx.
1   Eight words of internal flip-flops that are loaded in every clock period are visible via the ADRS4–0 values xx–xx.

Bit 13 – Unused.

Bit 14 – Unused.

Bit 15 – Unused.

Buffer0 Register Bits

| Bit | Description |
|-----|-------------|
| 0 | Serial Read or Write Buffer0 |
| 1 | Serial Read or Write Buffer1 |
| 2 | Serial Read or Write Buffer2 |
| 3 | Serial Read or Write Buffer3 |
| 4 | Serial Read or Write Buffer4 |
| 5 | Serial Read or Write Buffer5 |
| 6 | Serial Read or Write Buffer6 |
| 7 | Serial Read or Write Buffer7 |
| 8 | Serial Read or Write Buffer8 |
| 9 | Serial Read or Write Buffer9 |
| 10 | Serial Read or Write Buffer10 |
| 11 | Serial Read or Write Buffer11 |
| 12 | Serial Read or Write Buffer12 |
| 13 | Serial Read or Write Buffer13 |
| 14 | Serial Read or Write Buffer14 |
| 15 | Serial Read or Write Buffer15 | buffer0 register bit description

Writing to the buffer0 register accesses the serial write buffer used by the SCAN commands to load data to the serial functins. Reading from this register accesses the serial read buffer used by the SCAN commands to store data from the serial functions. The Buffer0 Register's address (from ADRS4–ADRS0) is 01100.

Serial Write Buffer Bits 15–0 are the outermost word of the two words that make up the serial write buffer.

Serial Read Buffer Bit 15–0 are the outermost word of the two words that make up the serial read buffer.

Status0 Register Bits

| BR | Description |
|---|---|
| 0 | Event0 Edge Interrupt Flag |
| 1 | Event1 Edge Interrupt Flag |
| 2 | Event2 Edge Interrupt Flag |
| 3 | Event3 Edge Interrupt Flag |
| 4 | Zero1 Interrupt Flag |
| 5 | Unused |
| 6 | Error Interrupt Flag |
| 7 | Finish Interrupt Flag |
| 8 | Suspend Interrupt Flag |
| 9 | End Interrupt Flag |
| 10 | Resume Interrupt Flag |
| 11 | Begin Interrupt Flag |
| 12 | Unused |
| 13 | Unused |
| 14 | Unused |
| 15 | Unused | status0 register bit description

The Status0 register is loaded from internal flags by executing the CAPTURE command. The internal flags may be selectively cleared by the CLEAR0 and CLEAR1 commands. The Status0 Register's address (from ADRS4–ADRS0) is 01110.

Bit 0 – Event0 Edge Interrupt Flag
This interrupt flag indicates an edge has been detected on the EVENT0 pin.
0    No edge has been detected.
1    An edge has been detected.

Bit 1 – Event1 Edge Interrupt Flag
This interrupt flag indicates an edge has been detected on the EVENT1 pin.
0    No edge has been detected.
1    An edge has been detected.

Bit 2 – Event2 Edge Interrupt Flag
This interrupt flag indicates an edge has been detected on the EVENT2 pin.
0    No edge has been detected.
1    An edge has been detected.

Bit 3 – Event3 Edge Interrupt Flag
This interrupt flag indicates an edge has been detected on the EVENT3 pin.
0    No edge has been detected.

1          An edge has been detected.

Bit 4 – Zero1 Interrupt Flag
This interrupt flag indicates that Counter1 has been operated while its value was all zeroes.
0          The indicated event has not occurred.
1          The indicated event has occurred.

Bit 5 – Unused.

Bit 6 – Error Interrupt Flag
This interrupt flag indicates that a major command has finished in error.
0          The indicated event has not occurred.
1          The indicated event has occurred.

Bit 7 – Finish Interrupt Flag
This interrupt flag indicates that a major command has finished.
0          The indicated event has not occurred.
1          The indicated event has occurred.

Bit 8 – Suspend Interrupt Flag
This interrupt flag indicates that an EXECUTE command has responded to a suspend request.
0          The indicated event has not occurred.
1          The indicated event has occurred.

Bit 9 – End Interrupt Flag
This interrupt flag indicates that an EXECUTE command has responded to an end request.
0          The indicated event has not occurred.
1          The indicated event has occurred.

Bit 10 – Resume Interrupt Flag
This interrupt flag indicates that an EXECUTE command has responded to a resume request.
0          The indicated event has not occurred.
1          The indicated event has occurred.

Bit 11 – Begin Interrupt Flag
This interrupt flag indicates that an EXECUTE command has responded to a begin request.
0          The indicated event has not occurred.
1          The indicated event has occurred.

Bit 12 – Unused.

Bit 13 – Unused.

Bit 14 – Unused.

Bit 15 – Unused.

Status1 Register Bits

| Bit | Description |
|---|---|
| 0 | Event Level0 |
| 1 | Event Level1 |
| 2 | Event Level2 |
| 3 | Event Level3 |
| 4 | Write Empty |
| 5 | Read Full Inverted |
| 6 | Write OK |
| 7 | Read OK Inverted |
| 8 | Target Interface State0 |
| 9 | Target Interface State1 |
| 10 | Target Interface State2 |
| 11 | Target Interface State3 |
| 12 | Unused |
| 13 | Unused |
| 14 | Awake |
| 15 | Alive | status1 register bit description

The Status0 register is loaded from internal flags by executing the CAPTURE command. The status0 register is not affected by the CLEAR0 and CLEAR1 commands. The Status1 Register's address (from ADRS4–ADRS0) is 01111.

Bit 0 – Event Level0
This bit indicates the status of the EVENT0 pin.
0         The value of the pin is a logic zero.
1         The value of the pin is a logic one.

Bit 1 – Event Level1
This bit indicates the status of the EVENT1 pin.
0         The value of the pin is a logic zero.
1         The value of the pin is a logic one.

Bit 2 – Event Level2
This bit indicates the status of the EVENT2 pin.
0         The value of the pin is a logic zero.
1         The value of the pin is a logic one.

Bit 3 – Event Level3
This bit indicates the status of the EVENT3 pin.
0         The value of the pin is a logic zero.
1         The value of the pin is a logic one.

Bit 4 – Write Empty
This bit indicates the status of serial write buffer at all times. If the buffer is empty, two words may be written into it.

0  The serial write buffer is not empty.
1  The serial write buffer is empty.

Bit 5 – Read Full Inverted
The status of this bit indicates condition of the serial read buffer at all times.
0  Both words of the serial read buffer are full.
1  At least one word of the serial read buffer is not full.

Bit 6 – Write OK
This bit indicates the status of the write buffer at all times. It will be active if at least one word of the buffer is empty.
0  The serial write buffer is full.
1  At least one word of the serial write buffer is empty.

Bit 7 – Read OK Inverted
This bit indicates the status of the serial buffer at all times. When active, at least one word is full and may be read.
0  At least one word of the serial write buffer is full.
1  The serial read buffer is empty.

Bits 8–10 – Target Interface State2-0
These bits indicate which stable state the target interface is sending.
000  Test Logic Reset.
001  Test Logic Reset.
010  Idle/Halt.
011  Idle/Run test.
100  Data Register Shift.
101  Instruction Register Shift.
110  Data Register Pause.
111  Instruction Register Pause.

Bit 11 – Target Interface State3
This bit will indicate if the target interface is sending a stable state or a temporary state.
0  The target is in the stable state indicated by bits 2–0.
1  The target interface is in a temporary state and bits 2–0 are all zeroes.

Bit 12 – Unused.

Bit 13 – Unused.

Bit 14 – Awake
The bit indicates the status of major commands.
0  A major command is alive but asleep, or no major command is alive.
1  A major command is alive and awake. If an EXECUTE or SCAN command is alive and awake, then the target interface is in the selected scan or execute state.

Bit 15 – Alive
The bit indicates the status of major commands.
0  No major command is alive.
1  A major command is alive.

Counter1 Update1-0 Register Bits

| Bit | Description | |
|---|---|---|
| | Counter1 Update0 | Counter1 Update1 |
| 0 | Counter1 Update0 | Counter1 Update16 |
| 1 | Counter1 Update1 | Counter1 Update17 |
| 2 | Counter1 Update2 | Counter1 Update18 |
| 3 | Counter1 Update3 | Counter1 Update19 |
| 4 | Counter1 Update4 | Counter1 Update20 |
| 5 | Counter1 Update5 | Counter1 Update21 |
| 6 | Counter1 Update6 | Counter1 Update22 |
| 7 | Counter1 Update7 | Counter1 Update23 |
| 8 | Counter1 Update8 | Counter1 Update24 |
| 9 | Counter1 Update9 | Counter1 Update25 |
| 10 | Counter1 Update10 | Counter1 Update26 |
| 11 | Counter1 Update11 | Counter1 Update27 |
| 12 | Counter1 Update12 | Counter1 Update28 |
| 13 | Counter1 Update13 | Counter1 Update29 |
| 14 | Counter1 Update14 | Counter1 Update30 |
| 15 | Counter1 Update15 | Counter1 Update31 | counter1 update description

The Counter1 Update1-0 registers are used to load the 32-bit counter used in major commands. Register0 and Register1 are the least and most significant words, respectively. The RESET command loads all bits with a logic 0. The Counter1 Update1-0 Registers' addresses (from ADRS4-ADRS0) are 10001 and 10000, respectively The counter is typically loaded from the Counter1 Update registers before major commands begin. The counter is also reloaded from these registers when it passes zero during EXECUTE commands if the counter's control bits are appropriately set.

The registers are loaded to the counter by the INITIAL0 minor command and when the Counter Update configure bit is set.

Counter1 Capture1-0 Register Bits

| Bit | Description | |
|---|---|---|
| | Counter1 Update0 | Counter1 Update1 |
| 0 | Counter1 Capture0 | Counter1 Capture16 |
| 1 | Counter1 Capture1 | Counter1 Capture17 |
| 2 | Counter1 Capture2 | Counter1 Capture18 |
| 3 | Counter1 Capture3 | Counter1 Capture19 |
| 4 | Counter1 Capture4 | Counter1 Capture20 |
| 5 | Counter1 Capture5 | Counter1 Capture21 |
| 6 | Counter1 Capture6 | Counter1 Capture22 |
| 7 | Counter1 Capture7 | Counter1 Capture23 |
| 8 | Counter1 Capture8 | Counter1 Capture24 |
| 9 | Counter1 Capture9 | Counter1 Capture25 |
| 10 | Counter1 Capture10 | Counter1 Capture26 |
| 11 | Counter1 Capture11 | Counter1 Capture27 |
| 12 | Counter1 Capture12 | Counter1 Capture28 |
| 13 | Counter1 Capture13 | Counter1 Capture29 |
| 14 | Counter1 Capture14 | Counter1 Capture30 |
| 15 | Counter1 Capture15 | Counter1 Capture31 | counter1 capture description

The Counter1 Capture1-0 registers store the value of the 32-bit counter used in major commands. Register0 and register1 and the least and most significant words, respectively. The RESET command loads all bits with a logic 0. The Counter1 Capture1-0 Registers' addresses (from ADRS4-ADRS0) are 10011 and 10010, respectively.

The value of the counter is stored to these registers by the CAPTURE command or when the Counter Capture configure bit is set.

What is claimed is:

1. An electronic system for use with a host computer, the system comprising:

electronic circuitry including a first semiconductor chip generally operable for a first function and also adapted for input and output of emulation signals;

emulation circuitry including a second semiconductor chip adapted for connection to the host computer, said second semiconductor chip connected to said first semiconductor chip to generate emulation signals to input to said first semiconductor chip and to accept emulation signals output from said first semiconductor chip in response thereto;

said first semiconductor chip including functional circuitry for performing said first function, and an emulation architecture coupled to said functional circuitry and responsive to input emulation signals to permit said first semiconductor chip to support emulation of said first function; and a self-contained physical assembly deployed in said system and including said first and second semiconductor chips supported together on a support structure.

2. The electronic system of claim 1 wherein said electronic circuitry comprises a digital signal processor including said first semiconductor chip.

3. The electronic system of claim 2 further comprising a transducer connected to said electronic circuitry.

4. The electronic system of claim 2 further comprising modem circuitry connected to said electronic circuitry.

5. The electronic system of claim 2 further comprising telecommunications system circuitry connected to said electronic circuitry.

6. The electronic system of claim 2 further comprising automotive control circuitry connected to said electronic circuitry.

7. The electronic system of claim 1 wherein said electronic circuitry comprises a graphics system processor including said first semiconductor chip.

8. The electronic system of claim 1 further comprising a video display connected to said electronic circuitry.

9. The electronic system of claim 1 wherein said first semiconductor chip includes serial scan shift register latches connected for the input and output of the emulation signals serially.

10. The electronic system of claim 1 wherein said electronic circuitry includes a serial scan controller having a set of electronic states accessible in response to an input signal from said emulation circuitry.

11. The electronic system of claim 10 wherein said second semiconductor chip includes an internal circuit having another set of electronic states including states corresponding to at least some of the set of electronic states of the serial scan controller of said electronic circuitry, said internal circuit adapted to facilitate transfer of emulation signals between the emulation circuitry and the electronic circuitry.

12. The electronic system of claim 1 wherein said support structure includes a printed wiring board holding and interconnecting said first and second semiconductor chips.

13. The electronic system of claim 1 wherein said first semiconductor chip includes circuit structure which permits said first semiconductor chip to perform desired functional operations, and additional circuit structure which is unnecessary to the performance of said functional operations and which permits input and output of said emulation signals in order to obtain information about the performance of said functional operations.

14. An emulation device for connection between a target device and a host computer, the target device having an interface circuit having a set of electronic states accessible in response to a control signal, the emulation device comprising:

a state machine having a set of electronic states corresponding to the electronic states of the target device with which the emulation device is to be used;

a second circuit adapted to hold a digital signal representing one of the electronic states of the state machine to be assumed;

a control signal producing circuit responsive to said state machine to produce different types of control signals for controlling target devices of different methodologies; and a control signal selector circuit coupled to the host computer and to said control signal producing circuit and operable to select one of said types of control signals for output to the target device in response to the host computer signaling a methodology of the target device.

15. The emulation device of claim 14 further comprising a sequence acceptor circuit including a second state machine having a set of electronic states corresponding to the electronic states of the target device with Which the emulation device is to be used.

16. An emulation device for connection between a target device and a host computer producing major commands, the target device having an interface circuit having a set of electronic states accessible in response to a control signal, the emulation device comprising:

a state machine having a set of electronic states corresponding to the electronic states of the target device with which the emulation device is to be used;

a second circuit adapted to hold a digital signal representing one of the electronic states of the state machine to be assumed;

command state machine circuitry responsive to a major command from the host computer and connected to said second circuit to supply a sequence of digital signals representing commands to said first-named state machine to assume successive electronic states; and a control signal producing circuit responsive to said state machine to produce control signals for the target device such that the target device assumes corresponding electronic states, thereby executing the major command.

17. The emulation device of claim 16 wherein said command state machine circuitry includes a plurality of state machines each responsive to a different one of the major commands and all of said state machines coupled to said second circuit.

18. The emulation device of claim 16 further comprising a counter connected to said command state machine circuitry.

19. The emulation device of claim 16 wherein said major command includes a STATE command.

20. The emulation device of claim 16 wherein said major command includes a SCAN command.

21. The emulation device of claim 16 wherein said major command includes an EXECUTE command.

22. An emulation device for connection between a host computer and a target device, the target device including an interface circuit with electronic states among which is a data transfer electronic state, the electronic states accessible in response to a control signal from the emulation device, there being a signal delay between the emulation device and target device, the emulation device comprising:

a data transfer circuit having an enable input, a data input for coupling to the target device and an external output for sending data received from the target device to the host computer; and a sequence acceptor circuit including a state machine having a set of electronic states corresponding to the electronic states of the target device with which the emulation device is to be used thereby to simulate the electronic state of the target device taking the signal delay into account and enable said data transfer circuit when the target device is in the data transfer state.

23. The emulation device of claim 22 wherein said data transfer circuit includes a serial to parallel converter coupled between said data input and said external output.

24. The emulation device of claim 22 further comprising a control circuit for supplying the control signal to the target device and a variable delay shift register connected between said control circuit and said sequence acceptor circuit.

25. The emulation device of claim 24 wherein said control circuit includes means for supplying the control signal to put the target device in the data transfer state, and for controlling said data transfer circuit to also send data from the host computer to the target device.

26. The emulation device of claim 25 for use with a target device that is serially scanable wherein the emulation device includes a counter circuit connected to said control circuit, thereby keeping count of the number of serial scan bits sent from the data transfer circuit.

27. An emulation controller for use with a target device capable of implementing operations of a test methodology, comprising:

a state machine having a set of electronic states corresponding to the operations of the test methodology associated with the target device;

a selection circuit for providing said state machine with a digital signal representing a selected one of the electronic states to be assumed by the state machine; and a control signal producing circuit connectable to the target device and responsive to the electronic state of said state machine for producing a control signal which causes the target device to implement the test methodology operation corresponding to the electronic state of said state machine.

* * * * *